United States Patent
Waho et al.

(10) Patent No.: US 6,188,346 B1
(45) Date of Patent: *Feb. 13, 2001

(54) ANALOG-TO-DIGITAL CONVERSION DEVICE

(75) Inventors: Takao Waho; Toshihiro Itoh, both of Tokyo (JP)

(73) Assignee: Nippon Telegraph and Telephone Corporation (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/071,545

(22) Filed: May 1, 1998

(30) Foreign Application Priority Data

May 9, 1997 (JP) .................................................. 9-118987
Dec. 26, 1997 (JP) .................................................. 9-367539

(51) Int. Cl.[7] .................................................. H03M 1/12

(52) U.S. Cl. .................................................. 341/156; 341/155

(58) Field of Search .................................................. 341/155, 145, 341/156, 122, 113, 133, 56, 57, 163

(56) References Cited

U.S. PATENT DOCUMENTS

| | | | | |
|---|---|---|---|---|
| 3,636,555 | * | 1/1972 | Waaben | 341/156 |
| 4,227,183 | * | 10/1980 | Ninomiya | 341/156 |
| 4,535,319 | * | 8/1985 | Penney | 341/156 |
| 4,965,578 | * | 10/1990 | Poujois | 341/156 |
| 5,053,771 | * | 10/1991 | McDermott | 341/156 |
| 5,099,238 | * | 3/1992 | Whiteley | 341/102 |
| 5,113,188 |   | 5/1992 | Kuo et al. | 341/133 |
| 5,241,312 | * | 8/1993 | Long | 341/163 |
| 5,248,973 | * | 9/1993 | Babu et al. | 341/156 |
| 5,455,584 |   | 10/1995 | Taddiken | 341/156 |

FOREIGN PATENT DOCUMENTS 9-46220    2/1997   (JP) .

OTHER PUBLICATIONS

"FA 7.5: A 4b 8GSample/s/A/D Conerter in SiGe Bipolar Technology" by Peter Xiao et al., 1997 IEEE International Solid—State Circuits Conference,1997, pp. 124–125.

"Multiple–Valued Logic: A Tutorial and Appreciation" by K. C. Smith, Survey & Tutorial Series, Apr. 1988, pp. 17–27.

"A Current–Mode CMOS Algorithmic Analog–to–Quaternary Converter Circuit" by K. W.Currentm, IEEE 1992, pp. 229–234.

"A Self–Latching A/D Converter Using Resonant Tunneling Diodes" by Sen–Jung Wei, et al., IEEE Journal of Solid–State Circuits, vol. 28, No. 6, Jun. 1993, pp. 697–700.

"A Monolithic 4 Bit 2GSps Resonant Tunneling Analog–to–Digital Converter" by T.P.E. Broekaert, et al., 1997 IEEE, 1997, pp. 187–190.

"CMOS Quaternary Latch" by K.W. Current, Electronics Letters 22nd vol. 25, No. 13, Jun. 1989, pp. 856–858.

* cited by examiner

Primary Examiner—Michael Tokar
Assistant Examiner—Jean B. Jeanglaude
(74) Attorney, Agent, or Firm—Blakely Sokoloff Taylor & Zafman

(57) ABSTRACT

An analog-to-digital conversion device includes quantization circuits and binarization circuits. Each quantization circuit samples an input analog signal at a predetermined period to obtain a sample, quantizes the sample into a (n+1)-valued signal with n (n is an integer of two or more) thresholds, and outputs the quantized value. Each binarization circuit converts the (n+1)-valued quantized value output from the quantization circuit into a binary code.

15 Claims, 15 Drawing Sheets

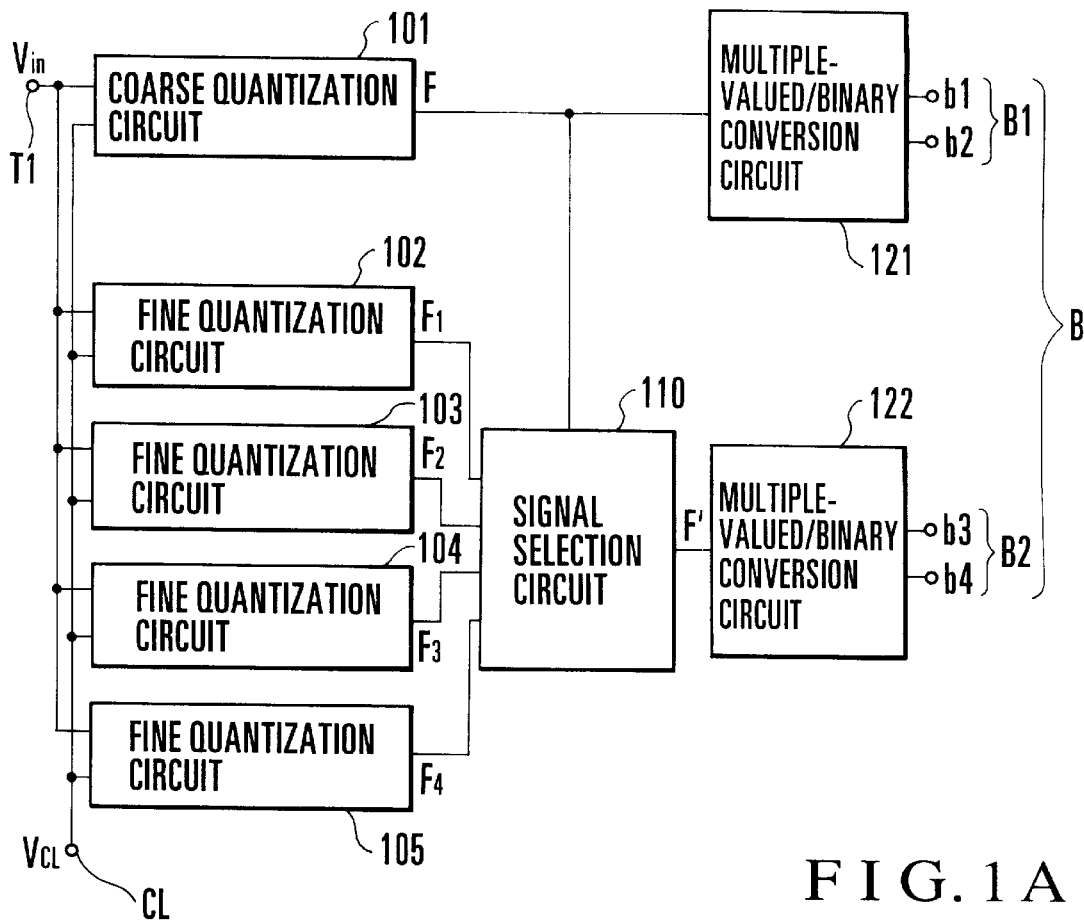
F I G. 1A
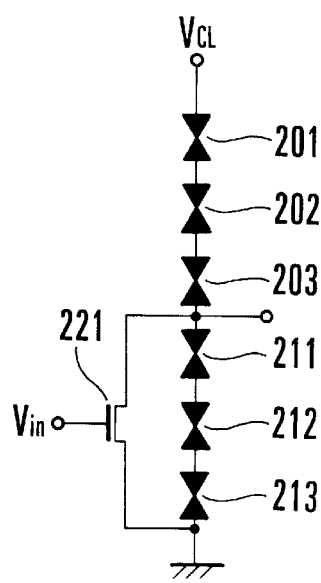
F I G. 1B

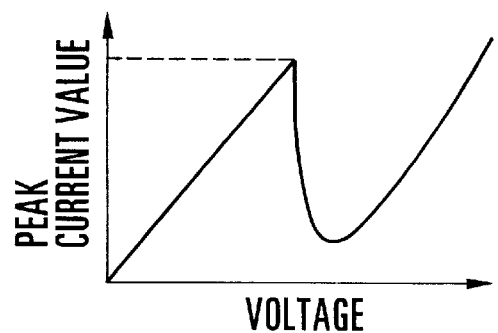
F I G. 2 A
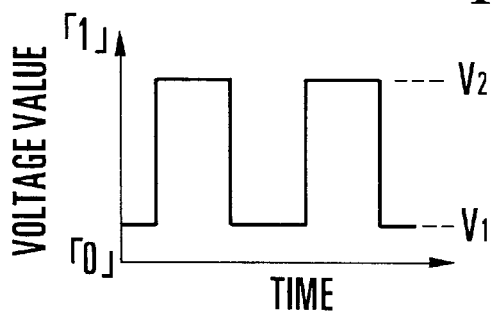
F I G. 2 B
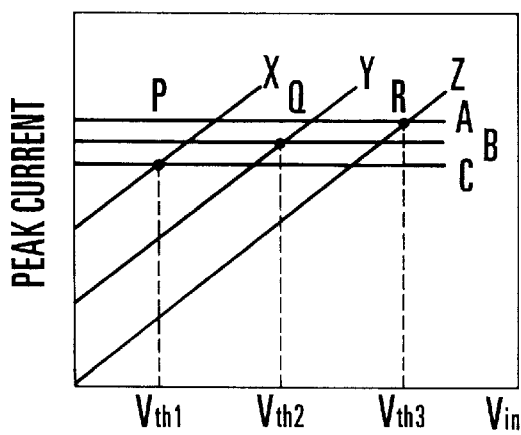
F I G. 2 C
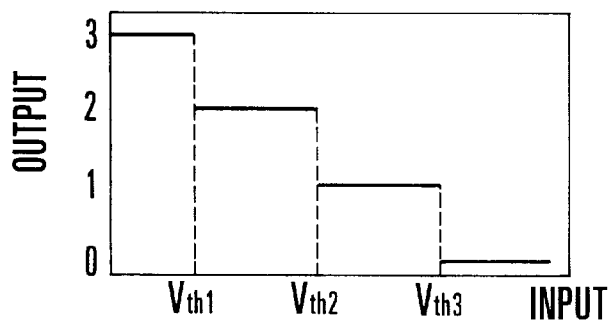
F I G. 2 D

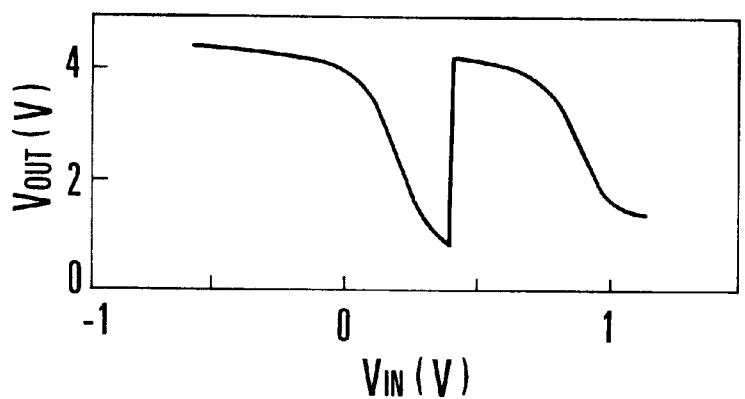
F I G. 5 A
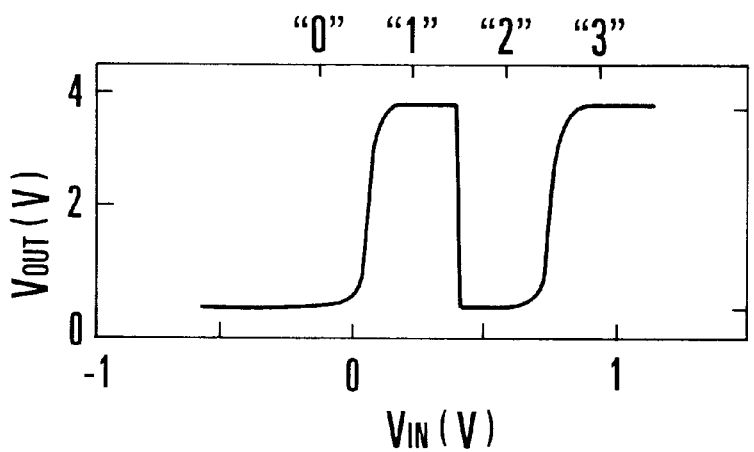
F I G. 5 B
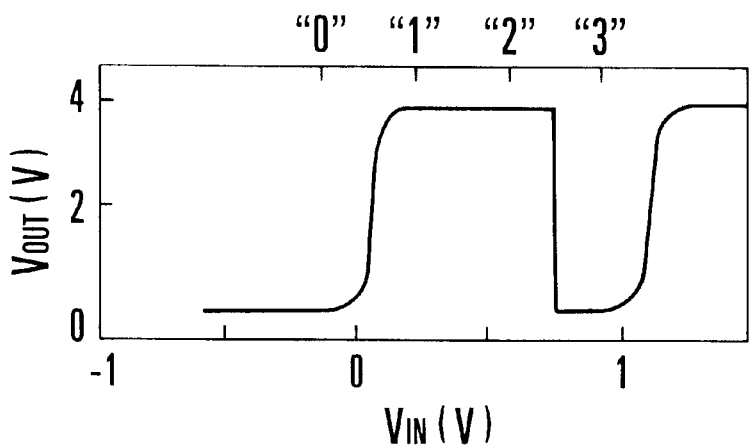
F I G. 5 C

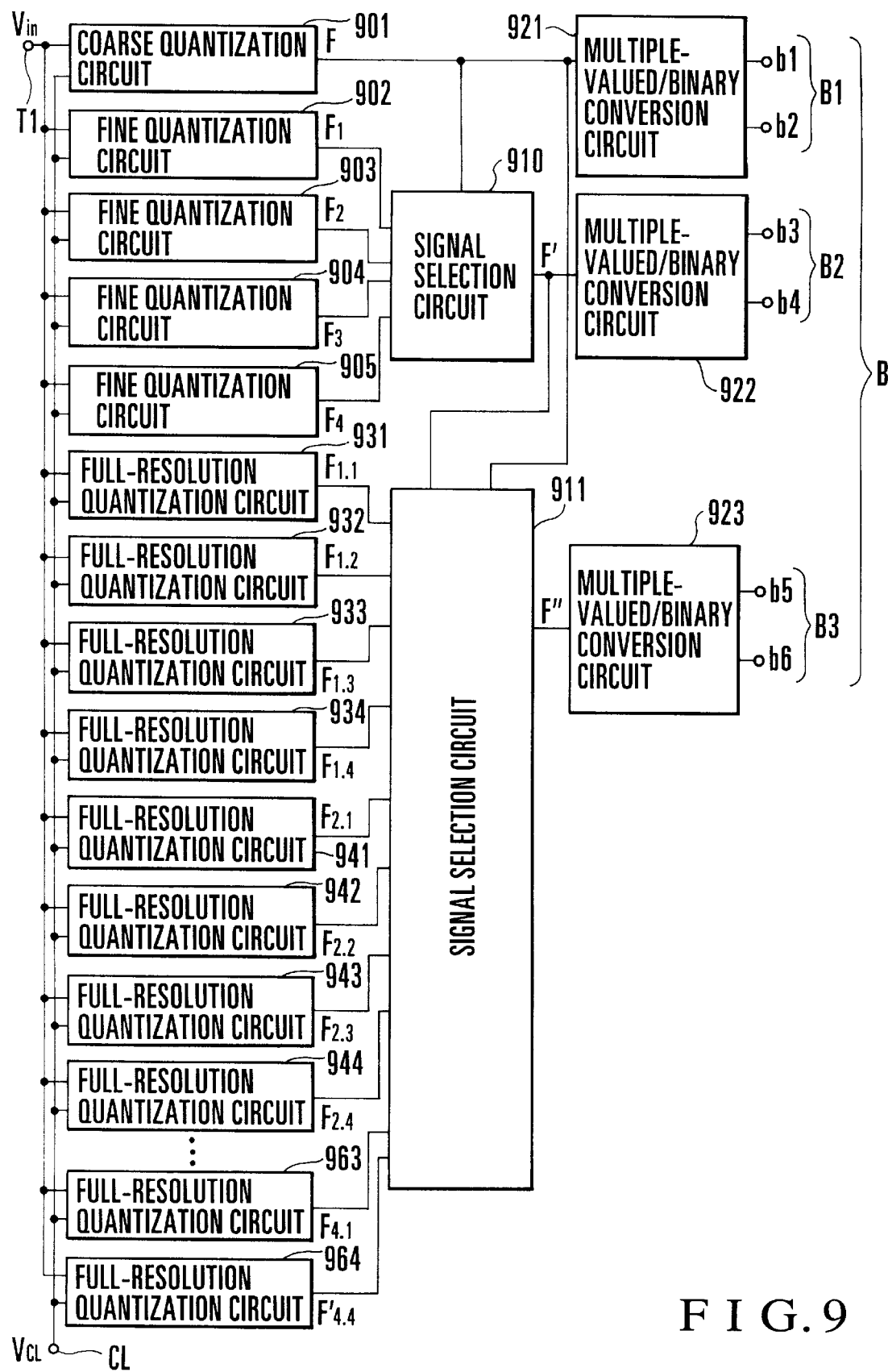
F I G. 9

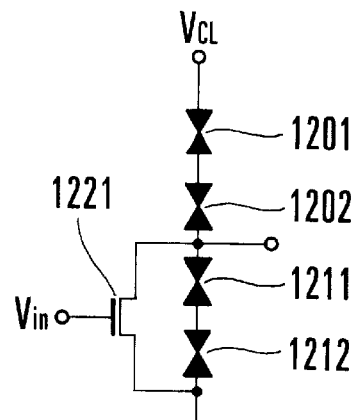
F I G. 12
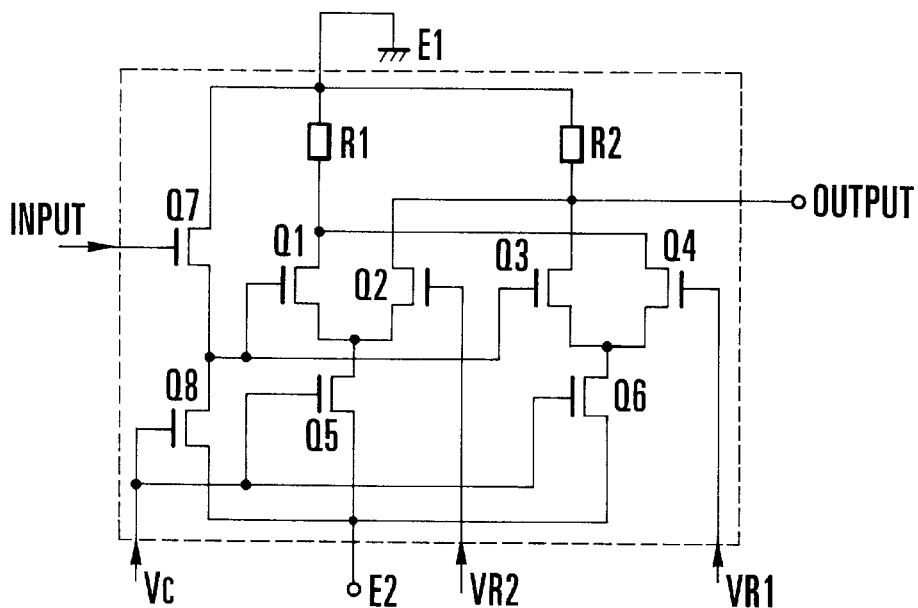
F I G. 13
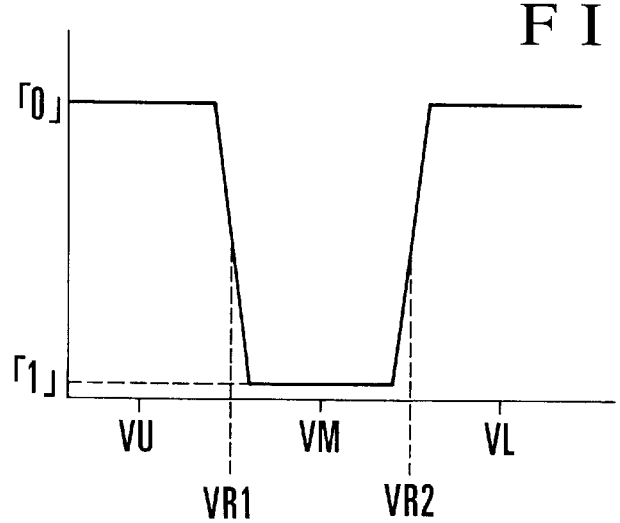
F I G. 14

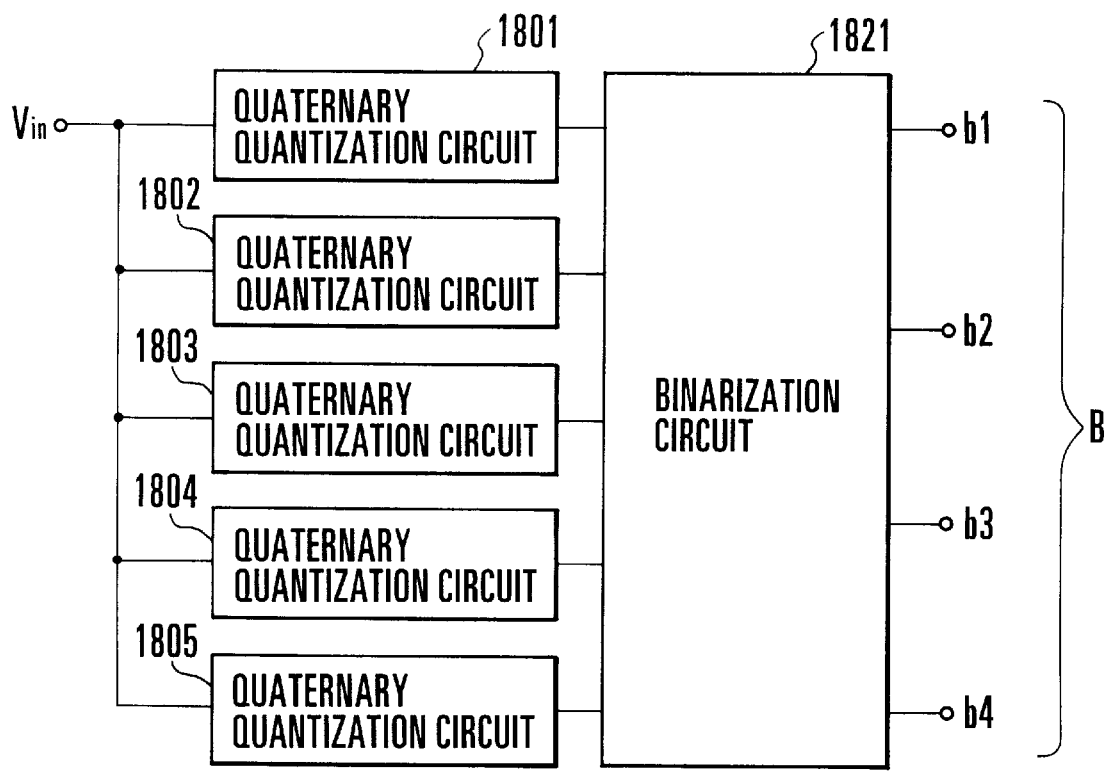
F I G. 18

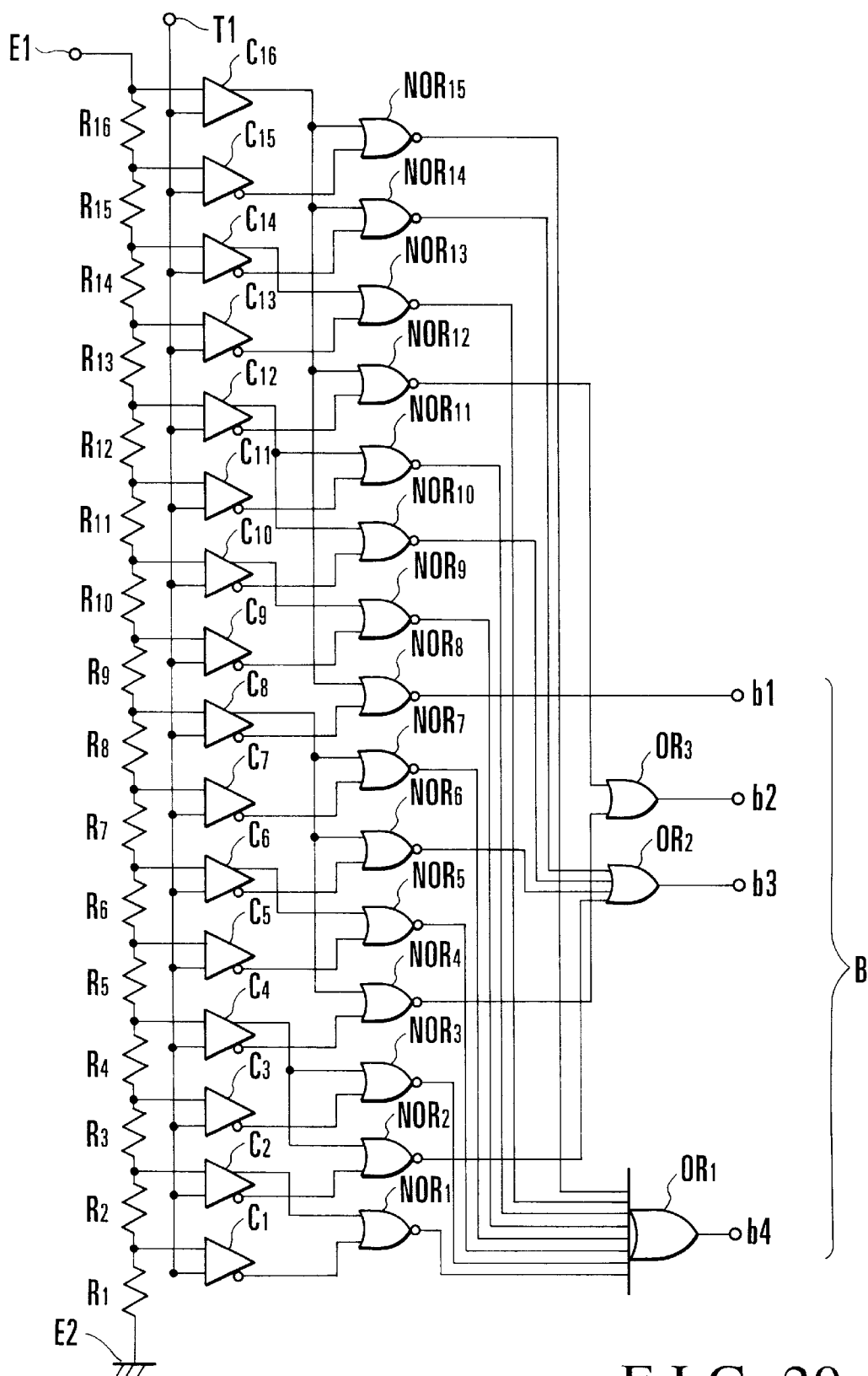
F I G. 20

ANALOG-TO-DIGITAL CONVERSION DEVICE

BACKGROUND OF THE INVENTION

The present invention relates to an analog-to-digital conversion device for converting an analog signal into a digital signal, a binary code.

As a conventional ultra-high-speed analog-to-digital converter (analog-to-digital conversion device), for example, a parallel comparison type (flash type) analog-to-digital converter, like the one shown in FIG. 20, has been used (reference: Kazuo Kurokawa, Comp., "Analog IC Application Handbook", Industrial Investigation Committee, 1976, p. 333"). This analog-to-digital converter is constituted by voltage comparison circuits for comparing the magnitude of an analog input signal with a plurality of reference voltages prepared in advance and outputting each result in the form of a binary signal representing "0" or "1", and conversion circuits for encoding the respective binary outputs into a common binary code.

More specifically, the converter shown in FIG. 20 has been proposed as a 4-bit parallel comparison type analog-to-digital converter designed to convert an analog signal $V_{in}$ into a 4-bit binary code. This converter includes 16 ($=4^2$) voltage comparison circuits $C_1$ to $C_{16}$ having input terminals. The analog signal $V_{in}$ from an input terminal T1 is supplied to one input terminal of each voltage comparison circuit.

This converter also has 16 voltage-dividing resistors $R_1$ to $R_{16}$ connected in series between power supply terminals E1 and E2. Each of reference voltages obtained at the nodes of the resistors $R_1$ and $R_2$, $R_2$ and $R_3$ . . . , $R_{15}$ and $R_{16}$ is applied to the other input terminal of a corresponding voltage comparison circuit ($C_1$ to $C_{15}$). In addition, a reference voltage obtained on the opposite side of the resistor $R_{16}$ to the resistor $R_{15}$ is applied to the other input terminal of the voltage comparison circuit $C_{16}$.

This converter also includes 15 ($4^2-1$) NOR circuits $NOR_1$ to $NOR_{15}$ each having two input terminals. These NOR circuits are connected as follows.

First of all, the negative output from the voltage comparison circuit $C_1$ and the positive output from the voltage comparison circuit $C_2$ are supplied to the two input terminals of the NOR circuit $NOR_1$.

The negative output from the voltage comparison circuit $C_2$ and the positive output from the voltage comparison circuit $C_4$ are supplied to the two input terminals of the NOR circuit $NOR_2$.

The negative output from the voltage comparison circuit $C_3$ and the positive output from the voltage comparison circuit $C_4$ are supplied to the two input terminals of the NOR circuit $NOR_3$.

The negative output from the voltage comparison circuit $C_4$ and the positive output from the voltage comparison circuit $C_8$ are supplied to the two input terminals of the NOR circuit $NOR_4$.

The negative output from the voltage comparison circuit $C_5$ and the positive output from the voltage comparison circuit $C_6$ are supplied to the two input terminals of the NOR circuit $NOR_5$.

The negative output from the voltage comparison circuit $C_6$ and the positive output from the voltage comparison circuit $C_8$ are supplied to the two input terminals of the NOR circuit $NOR_6$.

The negative output from the voltage comparison circuit $C_7$ and the positive output from the voltage comparison circuit $C_8$ are supplied to the two input terminals of the NOR circuit $NOR_7$.

The negative output from the voltage comparison circuit $C_8$ and the positive output from the voltage comparison circuit $C_{16}$ are supplied to the two input terminals of the NOR circuit $NOR_8$.

The negative output from the voltage comparison circuit $C_9$ and the positive output from the voltage comparison circuit $C_{10}$ are supplied to the two input terminals of the NOR circuit $NOR_9$.

The negative output from the voltage comparison circuit $C_{10}$ and the positive output from the voltage comparison circuit $C_{12}$ are supplied to the two input terminals of the NOR circuit $NOR_{10}$.

The negative output from the voltage comparison circuit $C_{11}$ and the positive output from the voltage comparison circuit $C_{12}$ are supplied to the two input terminals of the NOR circuit $NOR_{11}$.

The negative output from the voltage comparison circuit $C_{12}$ and the positive output from the voltage comparison circuit $C_{16}$ are supplied to the two input terminals of the NOR circuit $NOR_{12}$.

The negative output from the voltage comparison circuit $C_{13}$ and the positive output from the voltage comparison circuit $C_{14}$ are supplied to the two input terminals of the NOR circuit $NOR_{13}$.

The negative output from the voltage comparison circuit $C_{14}$ and the positive output from the voltage comparison circuit $C_{16}$ are supplied to the two input terminals of the NOR circuit $NOR_{14}$.

The negative output from the voltage comparison circuit $C_{15}$ and the positive output from the voltage comparison circuit $C_{16}$ are supplied to the two input terminals of the NOR circuit $NOR_{15}$.

This analog-to-digital converter includes an OR circuit $OR_1$ having eight input terminals, an OR circuit $OR_2$ having four input terminals, and an OR circuit $OR_3$ having two input terminals. The outputs from the NOR circuits $NOR_1$, $NOR_3$, $NOR_5$, $NOR_7$, $NOR_9$, $NOR_{11}$, $NOR_{13}$, and $NOR_{15}$ are supplied to the eight input terminals of the OR circuit $OR_1$. The outputs from the NOR circuits $NOR_2$, $NOR_6$, $NOR_{10}$, and $NOR_{14}$ are supplied to the four input terminals of the OR circuit $OR_2$. The outputs from the NOR circuits $NOR_4$ and $NOR_{12}$ are supplied to the two input terminals of the OR circuit $OR_3$.

In this analog-to-digital converter, the output from the OR circuit $OR_1$ is output as the first (least significant) bit of a 4-bit binary code B to a bit terminal b4. Similarly, the output from the OR circuit $OR_2$ is obtained as the second bit of the binary code B at a bit terminal b3. The output from the OR circuit $OR_3$ is obtained as the third bit of the binary code B at a bit terminal b2. The output from the NOR circuit $NOR_8$ is obtained as the fourth (most significant) bit of the binary code B at a bit terminal b1.

According to the above analog-to-digital converter, the analog signal $V_{in}$ can be converted into the binary code B consisting of the four bits at the bit terminals b4 to b1.

In the above conventional analog-to-digital converter, however, to convert the analog signal $V_{in}$ into the 4-bit binary code B, the following many elements are required: the 16 voltage comparison circuits $C_1$ to $C_{16}$, the 16 resistors $R_1$ to $R_{16}$, the 15 NOR circuits $NOR_1$ to $NOR_{15}$, and the three OR circuits $OR_1$ to $OR_3$.

When, therefore, the conventional analog-to-digital converter and other circuit devices are to be integrated into a monolithic unit on one substrate, the analog-to-digital converter occupies a large area, interfering with an increase in integration degree. In addition, since many elements are required, the power consumption becomes large. This inhibits an increase in operation speed.

SUMMARY OF THE INVENTION

It is, therefore, a principal object of the present invention to provide an analog-to-digital conversion device which is constituted by a small number of elements and can operate at high speed with low power consumption.

In order to achieve the above object, according to an aspect of the present invention, there is provided an analog-to-digital conversion device comprising quantization means for sampling an input analog signal at a predetermined period to obtain a sample, quantizing the sample into a (n+1)-valued signal with n (n is a natural number not less than two) thresholds, and outputting the quantized value, and binarization means for converting the (n+1)-valued quantized value output from the quantization means into a binary code.

With this arrangement, an input analog signal is temporarily quantized into a (n+1)-valued signal, which is then converted into a binary code. As a result, the input analog signal is converted into a digital signal.

According to another aspect of the present invention, there is provided an analog-to-digital conversion device comprising:

coarse quantization means for sampling an input analog signal at a predetermined period to obtain a sample, quantizing the sample with n coarse thresholds, and outputting the coarsely quantized value;

n+1 fine quantization means each for sampling the analog signal at a predetermined period to obtain a sample, quantizing the sample with n fine thresholds between two adjacent coarse thresholds of the coarse thresholds in the coarse quantization means, and outputting the finely quantized value;

signal selection means for selecting the finely quantized value output from the fine quantization means which has a threshold between the two thresholds used to quantize the coarsely quantized value output from the coarse quantization means;

first binarization means for converting the coarsely quantized value output from the coarse quantization means into a binary code; and second binarization means for converting the finely quantized value selected by the signal selection means into a binary code.

With this arrangement, an input analog signal is converted into a digital signal consisting of a binary code output from the first binarization means as upper bits and a binary code output from the second binarization means as lower bits.

According to still another aspect of the present invention, in addition to the above arrangement, the device includes $(n+1)^2$ full-resolution quantization means each for sampling the analog signal at a predetermined period to obtain a sample, quantizing the sample with n full-resolution thresholds between two adjacent thresholds of the thresholds in the fine quantization means, and outputting the full-resolution quantized value, full-resolution signal selection means for selecting the full-resolution quantized value output from the full-resolution quantization means which has a threshold between the two thresholds used to quantize the finely quantized value output from the fine quantization means, and third binarization means for converting the full-resolution quantized value selected by the full-resolution signal selection means into a binary code.

With this arrangement, analog-to-digital conversion with higher precision can be performed by using the binary code output from the second binarization means.

According to still another aspect of the present invention, there is provided an analog-to-digital conversion device comprising:

coarse quantization means for sampling an input analog signal at a predetermined period to obtain a sample, quantizing the sample with n coarse thresholds, and outputting the coarsely quantized value;

n+1 fine quantization means each for sampling the analog signal at a predetermined period to obtain a sample, quantizing the sample with n fine thresholds between two adjacent coarse thresholds of the coarse thresholds in the coarse quantization means, and outputting the finely quantized value;

coarse binarization means for converting the coarsely quantized value output from the coarse quantization means into a binary code;

n fine binarization means for converting the finely quantized values output from the fine quantization means into binary codes;

first bit selection means for selecting one of bit values obtained by the fine binarization means by converting the finely quantized value output from the fine quantization means which has a threshold between the two thresholds used to quantize the coarsely quantized value output from the coarse quantization means; and second bit selection means for selecting the other of the bit values obtained by the fine binarization means by converting the finely quantized value output from the fine quantization means which has a threshold between the two thresholds used to quantize the coarsely quantized value output from the coarse quantization means.

With this arrangement, an input analog signal is converted into a digital signal consisting of a binary code output from the coarse quantization means as upper bits and a binary code output from the first and second bit conversion means as lower bits.

According to still another aspect of the present invention, the analog-to-digital conversion device comprising the quantization means for sampling an input analog signal at a predetermined period to obtain a sample, quantizing the sample into a (n+1)-valued signal with n (n is a natural number not less than two) thresholds, and outputting the quantized value, and the binarization means for converting the (n+1)-valued quantized value output from the quantization means into a binary code, further including least significant bit quantization means, having $2^n$ (n is a natural number not less than two) conversion means each including the quantization means and the binarization means, for generating a least significant bit, n intermediate bit quantization means having the conversion means half the number of conversion means of bit quantization means for generating a bit one bit lower than itself, and most significant bit quantization means, having one the conversion means, for generating a most significant bit, wherein the least significant bit quantization means and the intermediate bit quantization means respectively include output means each for calculating an OR of outputs from the conversion means, each of the conversion means of the least significant bit quantization means, the intermediate bit quantization means, and the most significant bit quantization means has two thresholds having a difference larger than that in the quantization means for a bit one bit lower than itself, and each of the conversion means of the least significant bit quantization means, the intermediate bit quantization means, and the most significant bit quantization means has two different thresholds.

With this arrangement, an input analog signal is converted into a digital signal consisting of bits output from the respective bit quantization means.

According to still another aspect of the present invention, the analog-to-digital conversion device comprising the quantization means for sampling an input analog signal at a predetermined period to obtain a sample, quantizing the sample into a (n+1)-valued signal with n (n is a natural number not less than two) thresholds, and outputting the quantized value, and the binarization means for converting the (n+1)-valued quantized value output from the quantization means into a binary code, further including first conversion means, constituted by the quantization means in which n is 3 and the binarization means, for outputting a most significant bit and a first intermediate bit one bit lower than the most significant bit, second to fifth conversion means, constituted by the quantization means in which n is 3 and the binarization means, for outputting first and second binary codes, first output means for outputting a second intermediate bit one bit lower than the first intermediate bit using a combination of first binary codes output from the second to fifth conversion means, and second output means for outputting a least significant bit using a combination of second binary codes output from the second to fifth conversion means, wherein the second binarization means outputs a binary value, as a first binary code, which is binarized between a largest value or a second largest value of four values output from the quantization means and other values thereof, and outputs a binary value, as a second binary code, which is binarized between a largest value or a smallest value of four values output from the quantization means and other values thereof, three thresholds in a quantization circuit of the second conversion means are smaller than a minimum threshold in a quantization circuit of the first conversion means, three thresholds in a quantization circuit of the third conversion means are larger than the minimum threshold in the quantization circuit of the first conversion means and smaller than an intermediate threshold in the quantization circuit of the first conversion means, three thresholds in a quantization circuit of the fourth conversion means are larger than the intermediate threshold in the quantization circuit of the first conversion means and smaller than a maximum threshold in the quantization circuit of the first conversion means, and three thresholds in a quantization circuit of the fifth conversion means are larger than the maximum threshold in the quantization circuit of the first conversion means.

With this arrangement, an input analog signal is converted into a digital signal consisting of the bits of a binary code output from the binarization means.

BRIEF DESCRIPTION OF THE DRAWINGS

FIGS. 1-A and 1-B are views showing the arrangement of an analog-to-digital conversion device according to the first embodiment of the present invention;

FIGS. 2-A to 2-D are graphs for explaining the characteristics of the resonant-tunneling diodes in FIG. 1-B;

FIGS. 5-A to 5-C are graphs showing the characteristics of a resonant-tunneling diode;

FIG. 9 is a block diagram showing the arrangement of an analog-to-digital conversion device according to the third embodiment of the present invention;

FIG. 12 is a circuit diagram showing a multiple-valued quantization circuit in FIG. 11;

FIG. 13 is a circuit diagram showing a binarization circuit in FIG. 11;

FIG. 14 is a graph showing the voltage characteristics of signals output from the binarization circuit in FIG. 11;

FIG. 18 is a block diagram showing the arrangement of an analog-to-digital conversion device according to the ninth embodiment of the present invention;

FIG. 20 is a circuit diagram showing the arrangement of a conventional analog-to-digital conversion device.

DESCRIPTION OF THE PREFERRED EMBODIMENTS

Figure 3:
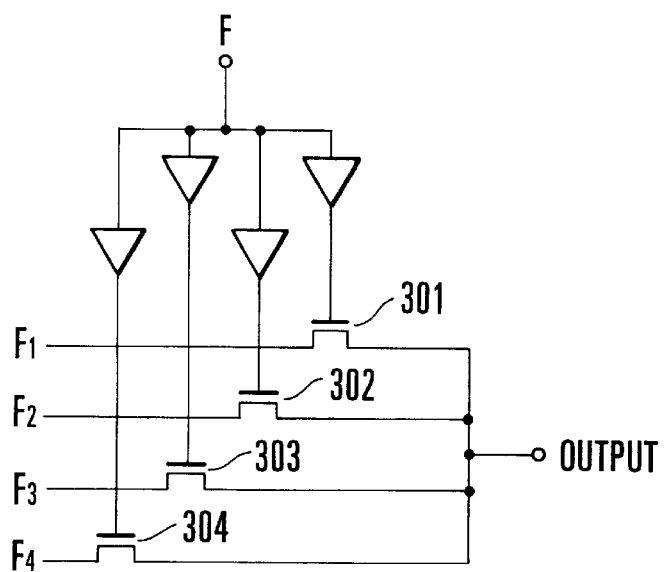
FIG. 3 is a circuit diagram showing the arrangement of a signal selection circuit in FIG. 1-A.

Embodiments of the present invention will be described in detail below with reference to the accompanying drawings.
First Embodiment The first embodiment of the present invention will be described first.

FIGS. 1-A and 1-B show the arrangement of an analog-to-digital conversion device according to the first embodiment of the present invention. This analog-to-digital conversion device quantizes an analog signal $V_{in}$ into a multiple-valued signal, which is a quaternary signal or four-valued signal, and digitally converts the multiple-valued signal into a binary signal as a binary code B.

As shown in FIG. 1-A, this analog-to-digital conversion device includes a coarse quantization circuit 101 and fine quantization circuits 102 to 105. These circuits operate in synchronism with a clock signal $V_{CL}$ input through a terminal CL. The device also includes a signal selection circuit 110 for selecting and outputting one of output signals from the fine quantization circuits 102 to 105 on the basis of a signal output from the coarse quantization circuit 101. The device includes multiple-valued/binary conversion circuits 121 and 122 serving as quaternary/binary conversion circuits.

In this analog-to-digital conversion device, first of all, the analog signal $V_{in}$ input through an input terminal T1 is temporarily quantized into a quaternary signal by the coarse quantization circuit 101 and the fine quantization circuits 102 to 105. The quantized quaternary signal is then converted into a common binary code by the multiple-valued/binary conversion circuits 121 and 122. Thereafter, a binary signal B1 is output from bit terminals b1 and b2, and a binary signal B2 is output from bit terminals b3 and b4. The binary code B includes these binary signals B1 and B2 as its bits.

This device will be described in more detail below.

The coarse quantization circuit 101 and the fine quantization circuits 102 to 105 will be described first.

First of all, as indicated by Table 1 below, the coarse quantization circuit 101 quantizes the analog signal $V_{in}$ input through the input terminal T1 into a multiple-valued signal F as a quaternary signal by dividing the analog signal $V_{in}$ with thresholds $V_1$, $V_2$, and $V_3$ satisfying $V_1<V_2<V_3$.

TABLE 1

| Input Value | Value of Quaternary Signal F | B1 | | Quantization Circuit (Output) to Be Selected |
|---|---|---|---|---|
| $V_1 < V_2 < V_3$ | | b1 | b2 | |
| $V_{in} \leq V_1$ (= 3.5 V) | $f_1$ (= 3) | 0 | 0 | $Q_1(F_1)$ |
| $V_{in}$ (= 3.5 V) $V_{in} \leq V_2$ (= 7.5 V) | $f_2$ (= 2) | 0 | 1 | $Q_3(F_2)$ |
| $V_2$ (= 7.5 V) $< V_{in} \leq V_3$ (= 11.5 V) | $f_3$ (= 1) | 1 | 0 | $Q_3(F_2)$ |
| $V_3$ (= 11.5 V) $< V_{in}$ | $f_4$ (= 0) | 1 | 1 | $Q_4(F_4)$ |

That is, the coarse quantization circuit 101 quantizes the analog signal $V_{in}$ input through the input terminal T1 to take the value of $f_1$ if $V_{in} \leq V_1$; the value $f_2$ if $V_1 < V_{in} < V_2$; the value of $f_3$ if $V_2 < V_{in} \leq V_3$; and the value of $f_4$ if $V_3 < V_{in}$.

In the first embodiment, as indicated by Table 1, for example, the quantization thresholds $V_1$ to $V_3$ are $V_1$=3.5 V, $V_2$=7.5 V, and $V_3$=11.5 V, and the values $f_1$ to $f_4$ of the multiple-valued signal F output from the coarse quantization circuit 101 are $f_1$=3, $f_2$=2, and $f_3$=1, and $f_4$=0.

As indicated by Table 2 below, the fine quantization circuit 102 quantizes the analog signal $V_{in}$ input through the input terminal T1 into a multiple-valued signal $F_1$ as a quaternary signal by dividing the analog signal $V_{in}$ with thresholds $V_{1,1}$, $V_{1,2}$, and $V_{1,3}$ satisfying $V_{1,1}<V_{1,2}<V_{1,3}$.

TABLE 2

| Input Value | Value of Quaternary Signal $F_1$ | B2 | |
|---|---|---|---|
| $V_{1,1} < V_{1,2} < V_{1,3} < V_1$ (= 3.5 V) | | b3 | b4 |
| $V_{in} \leq V_{1,1}$ (0.5 V) | $f_{1,1}$ (= 3) | 0 | 0 |
| $V_{1,1}$ (= 0.5 V) $< V_{in} \leq V_{1,2}$ (= 1.5 V) | $f_{1,2}$ (= 2) | 0 | 1 |
| $V_{1,2}$ (= 1.5 V) $< V_{in} \leq V_{1,3}$ (= 2.5 V) | $f_{1,3}$ (= 1) | 1 | 0 |
| $V_{1,3}$ (= 2.5 V) $< V_{in}$ | $f_{1,4}$ (= 0) | 1 | 1 |

That is, the fine quantization circuit 102 quantizes the analog signal $V_{in}$ input through the input terminal T1 to take the value of $f_{1,1}$ if $V_{in} \leq V_{1,1}$; the value of $f_{1,2}$ if $V_{1,1} < V_{in} \leq V_{1,2}$; the value of $f_{1,3}$ if $V_{1,2} < V_{in} \leq V_{1,3}$; and the value of $f_{1,4}$ if $V_{1,3} < V_{in}$.

In this embodiment, as indicated by Table 2, for example, the quantization thresholds $V_{1,1}$ to $V_{1,3}$ are $V_{1,1}$=0.5 V, $V_{1,2}$=1.5 V, and $V_{1,3}$=2.5 V, and the values $f_{1,1}$ to $f_{1,4}$ of the multiple-valued signal $F_1$ output from the fine quantization circuit 102 are $f_{1,1}$=3, $f_{1,2}$=2, $f_{1,3}$=1, and $f_{1,4}$=0.

Similarly, as indicated by Table 3 below, the fine quantization circuit 103 quantizes the analog signal $V_{in}$ input through the input terminal T1 into a multiple-valued signal $F_2$ as a quaternary signal by dividing the analog signal $V_{in}$ with thresholds $V_{2,1}$, $V_{2,2}$, and $V_{2,3}$ satisfying $(V_1<)$ $V_{2,1}<V_{2,2}<V_{2,3}$ $(<V_2)$.

TABLE 3

| Input Value | Value of Quaternary Signal $F_1$ | B2 | |
|---|---|---|---|
| $V_1$ (3.5 V) $< V_{2,1} < V_{2,2} < V_{2,3} < V_2$ (= 7.5 V) | | b3 | b4 |
| $V_{in} \leq V_{2,1}$ (4.5 V) | $f_{2,1}$ (= 3) | 0 | 0 |
| $V_{2,1}$ (= 4.5 V) $< V_{in} \leq V_{2,2}$ (= 5.5 V) | $f_{2,2}$ (= 2) | 0 | 1 |
| $V_{2,2}$ (= 5.5 V) $< V_{in} \leq V_{2,3}$ (= 6.5 V) | $f_{2,3}$ (= 1) | 1 | 0 |
| $V_{2,3}$ (= 6.5 V) $< V_{in}$ | $f_{2,4}$ (= 0) | 1 | 1 |

Likewise, as indicated by Table 4 below, the fine quantization circuit 104 quantizes the analog signal $V_{in}$ input through the input terminal T1 into a multiple-valued signal $F_3$ as a quaternary signal by dividing the analog signal $V_{in}$ with thresholds $V_{3,1}$, $V_{3,2}$, and $V_{3,3}$ satisfying $(V_2<)$ $V_{3,1}<V_{3,2}<V_{3,3}$ $(<V_3)$.

TABLE 4

| Input Value | Value of Quaternary Signal $F_3$ | B2 | |
|---|---|---|---|
| $V_2$ (7.5 V) $< V_{3,1} < V_{3,2} < V_{3,3} < V_3$ (= 11.5 V) | | b3 | b4 |
| $V_{in} \leq V_{3,1}$ (8.5 V) | $f_{3,1}$ (= 3) | 0 | 0 |
| $V_{3,1}$ (= 8.5 V) $< V_{in} \leq V_{3,2}$ (= 9.5 V) | $f_{3,2}$ (= 2) | 0 | 1 |
| $V_{3,2}$ (= 9.5 V) $< V_{in} \leq V_{3,3}$ (= 10.5 V) | $f_{3,3}$ (= 1) | 1 | 0 |
| $V_{3,3}$ (= 10.5 V) $< V_{in}$ | $f_{3,4}$ (= 0) | 1 | 1 |

In like manner, as indicated by Table 5 below, the fine quantization circuit 105 quantizes the analog signal $V_{in}$ input through the input terminal T1 into a multiple-valued signal $F_4$ as a quaternary signal by dividing the analog signal $V_{in}$ with thresholds $V_{4,1}$, $V_{4,2}$, and $V_{4,3}$ satisfying $(V_3<)$ $V_{4,1}<V_{4,2}<V_{4,3}$.

TABLE 5

| Input Value | Value of Quaternary Signal $F_4$ | B2 | |
|---|---|---|---|
| $V_3$ (11.5 V) < $V_{4,1}$ < $V_{4,2}$ < $V_{4,3}$ | | b3 | b4 |
| $V_{in} \leq V_{4,1}$ (12.5 V) | $f_{4,1}$ (= 3) | 0 | 0 |
| $V_{4,1}$ (= 12.5 V) < $V_{in} \leq V_{4,2}$ (= 13.5 V) | $f_{4,2}$ (= 2) | 0 | 1 |
| $V_{4,2}$ (= 13.5 V) < $V_{in} \leq V_{4,3}$ (= 14.5 V) | $f_{4,3}$ (= 1) | 1 | 0 |
| $V_{4,3}$ (= 14.5 V) < $V_{in}$ | $f_{4,4}$ (= 0) | 1 | 1 |

For example, each of the above coarse quantization circuit 101 and the fine quantization circuits 102 to 105 can be a quaternary quantization circuit like the one shown in FIG. 1-B.

This quaternary quantization circuit can be a series circuit of resonant-tunneling diodes 201 to 203 and 211 to 213 exhibiting negative differentiation resistance characteristics like those shown in FIG. 2-A. These resonant-tunneling diodes 201 to 203 and 211 to 213 exhibit different peak current values in the current/voltage characteristics between the two terminals of each diode.

A field-effect transistor 221 is connected in parallel with the resonant-tunneling diodes 211 to 213. If, for example, a high electron mobility transistor (HEMT) is used as the field-effect transistor 221, high-speed operation can be expected.

A clock signal (FIG. 1-B) is input through one end of the resonant-tunneling diode 201, and the analog signal $V_{in}$ is input through the gate (input terminal) of the field-effect transistor 221. As a result, a quantized multiple-valued signal is output from the node of the resonant-tunneling diodes 203 and 211.

In this quaternary quantization circuit, as the voltage of the signal input to the input terminal changes, the value of the current flowing in the parallel circuit of the resonant-tunneling diodes 211 to 213 and the field-effect transistor 221 changes. More specifically, since the current flowing in the overall parallel circuit is the sum of currents flowing in the field-effect transistor 221 and the resonant-tunneling diodes 211 to 213, the effective current flowing in the overall parallel circuit changes as the drain current in the field-effect transistor 221 changes with a change in input voltage.

FIG. 2-C shows changes in effective peak current values of the resonant-tunneling diodes 211 to 213 and the peak current values of the resonant-tunneling diodes 201 to 203. As may be seen from FIG. 2-C, input voltages $V_{th1}$, $V_{th2}$, and $V_{th3}$ corresponding to "P", "Q", and "R" provide three threshold voltages in this quaternary quantization circuit. Note that "P" corresponds to the intersection of the resonant-tunneling diodes 211 and 203; "Q", the intersection of the resonant-tunneling diodes 212 and 202; and "R", the intersection of the resonant-tunneling diodes 213 and 201.

In this case, to set these threshold voltages $V_{th1}$, $V_{th2}$, and $V_{th3}$ to 3.5 V, 7.5 V, and 11.5 V (Table 1), respectively, as in the coarse quantization circuit 101 in FIG. 1-A, the peak currents are adjusted by setting the area of each resonant-tunneling diode to a predetermined value. In addition, the mutual conductances (the slopes of changes in effective peak current values of the resonant-tunneling diodes 211 to 213) can be adjusted by setting the gate width of the field-effect transistor to a predetermined value.

According to this quaternary quantization circuit, input/output characteristics that serve to convert an analog signal into a quaternary signal can be obtained, as will be described below.

First of all, as shown in FIG. 2-B, a clock signal whose voltage value oscillates between $V_1$ and $V_2$ is supplied to this circuit.

In this case, $V_1$ is set to 0 V, and $V_2$ is set such that three of the resonant-tunneling diodes 201 to 203 and 211 to 213 are switched from the peak state to the valley state (FIG. 2-A).

This switching operation based on negative resistance components occurs in ascending order of peak current. If, $V_{in} \leq V_{th1}$, therefore, all the resonant-tunneling diodes 211 to 213 having small peak currents are switched (FIG. 2-C). At this time, since the voltages between the terminals of the switched resonant-tunneling diodes 211 to 213 rise, the voltage increases at the three diodes are superposed on each other. As a result, the maximum value "3" is output to the output terminal.

If $V_{th1} < V_{in} \leq V_{th2}$, the resonant-tunneling diodes 203, 212, and 213 having small peak currents are switched (FIG. 2-C). As a result, "2" corresponding to the sum of voltage increases at the two resonant-tunneling diodes 212 and 213 is output to the output terminal.

If $V_{th2} < V_{in} \leq Vth3$, the resonant-tunneling diodes 202, 203, and 213 having small peak currents are switched (FIG. 2-C). As a result, "1" corresponding to a voltage increase across one resonant-tunneling diode 213 is output to the output terminal.

If $V_{th3} \leq V_{in}$, the resonant-tunneling diodes 201, 202, and 203 having small peak currents are switched (FIG. 2-C). As a result, the minimum value "0" is output to the output terminal.

The signal selection circuit 110 will be described next.

The signal selection circuit 110 is controlled by the multiple-valued signal F (FIG. 1-A) output from the coarse quantization circuit 101 to select one of the multiple-valued signals $F_1$, $F_2$, $F_3$, and $F_4$ and output it as a multiple-valued signal F'.

More specifically, if the multiple-valued signal F as a quaternary signal output from the coarse quantization circuit 101 is $f_1$ (=3) as indicated by Table 1, the signal selection circuit 110 selects the multiple-valued (quaternary) signal $F_1$ output from the fine quantization circuit 102, and outputs it as the multiple-valued signal F'.

If the multiple-valued signal F as a quaternary signal output from the coarse quantization circuit 101 is $f_2$ (=2), the signal selection circuit 110 selects the multiple-valued signal $F_2$ output from the fine quantization circuit 103, and outputs it as the multiple-valued signal F'.

If the multiple-valued signal F as a quaternary signal output from the coarse quantization circuit 101 is $f_3$ (=1), the signal selection circuit 110 selects the multiple-valued signal $F_2$ output from the fine quantization circuit 104, and outputs it as the multiple-valued signal F'.

If the multiple-valued signal F as a quaternary signal output from the coarse quantization circuit 101 is $f_4$ (=0), the signal selection circuit 110 selects the multiple-valued signal $F_2$ output from the fine quantization circuit 105, and outputs it as the multiple-valued signal F'.

As this signal selection circuit 110, a known T gate circuit (K. Smith, "Multiple-valued logic: A tutorial and appreciation," IEEE Computer, pp. 17–27, April 1988) can be used, as shown in FIG. 3. In this case, four pass transistors 301 to 304 can be used.

Referring to FIG. 1-A, the signal selection circuit 110 is controlled by the multiple-valued signal F output from the coarse quantization circuit 101. However, the present invention is not limited to this. The signal selection circuit 110 may be controlled by the binary signal B1 output from the multiple-valued/binary conversion circuit 121.

The multiple-valued/binary conversion circuits 121 and 122 will be described next.

The multiple-valued/binary conversion circuit 121 digitally converts the multiple-valued signal F (quaternary signal) output from the coarse quantization circuit 101 into the binary signal B1 as bits of the binary code B. In the first embodiment, as indicated by Table 1, the multiple-valued/binary conversion circuit 121 converts the multiple-valued signal F output from the coarse quantization circuit 101 into the binary signal B1. More specifically, if the multiple-valued signal F is $f_1$ (=3), the signal is converted into "00". If the multiple-valued signal F is $f_2$ (=2), the signal is converted into "01". If the multiple-valued signal F is $f_3$ (=1), the signal is converted into "10". If the multiple-valued signal F is $f_4$ (=0), the signal is converted into "11". Of the two bits of each converted signal, the upper bit is output to the bit terminal b1, and the lower bit to the bit terminal b2 (FIG. 1-A).

The multiple-valued/binary conversion circuit 122 digitally converts one of the multiple-valued signals $F_1$ to $F_4$ output from the signal selection circuit 110 into the binary signal B2 as bits of the binary code B.

In this case, as indicated by Tables 2 to 5, if a multiple-valued (quaternary) signal $F_P$ (P=1, 2, 3, 4) is $f_{P,1}$ (=3), a signal represented by the two bits "00" is output as the binary signal B2.

If the multiple-valued (quaternary) signal $F_P$ (P=1, 2, 3, 4) is $f_{P,2}$ (=2), a signal represented by the two bits "01" is output.

If the multiple-valued (quaternary) signal $F_P$ (P=1, 2, 3, 4) is $f_{P,3}$ (=1), a signal represented by the two bits "10" is output.

If the multiple-valued (quaternary) signal $F_P$ (P=1, 2, 3, 4) is $f_{P,4}$ (=0), a signal represented by the two bits "11" is output.

Of the two bits of each signal, the upper bit is output from the bit terminal b3, and the lower bit from the bit terminal b4.

In this case, each of the multiple-valued/binary conversion circuits 121 and 122 can be constituted by a universal literal gate 401 known as a multiple-valued logic circuit (K. Smith, "Multiple-valued logic: A tutorial and appreciation," IEEE Computer, pp. 17–27, April 1988) and general inverters 402 and 403, as shown in FIG. 4-A.

Figure 4A:
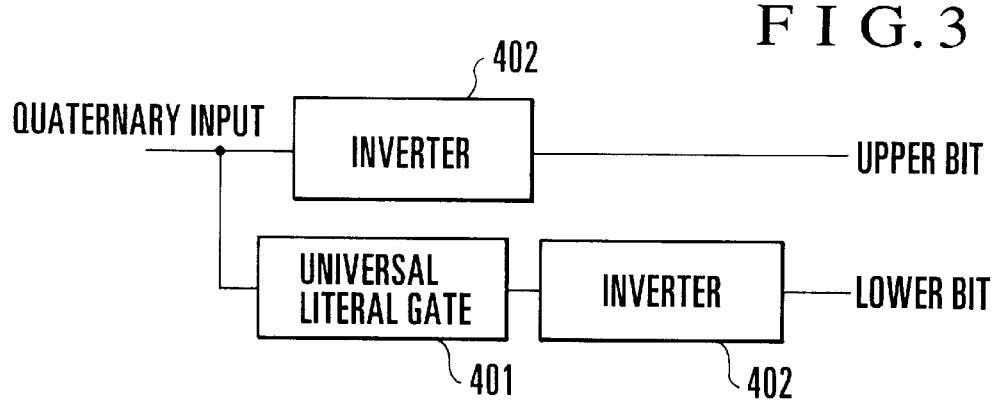
FIGS. 4-A and 4-B are views showing the arrangement of a multiple-valued/binary conversion circuit in FIG. 1-A.
Figure 4B:
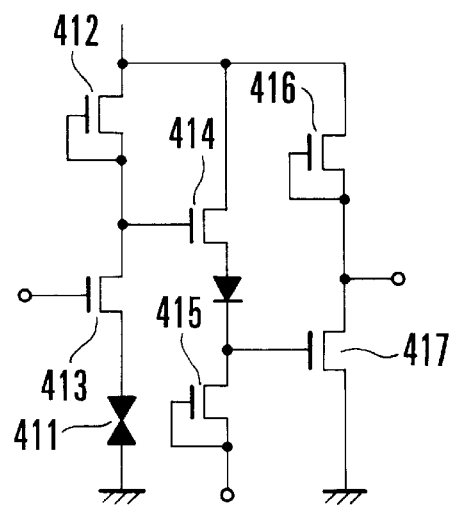

This universal literal gate 401 can be constructed by a resonant-tunneling diode 411 and field-effect transistors 412 to 417 such as HEMTs, as shown in FIG. 4-B. According to the universal literal gate 401, owing to the negative differentiation resistance characteristics of the resonant-tunneling diode 411, the voltage at a node $V_0$ and the analog signal $V_{in}$ have a relationship like the one shown in FIG. 5-A, and the input/output characteristics of this circuit in FIG. 5-B are obtained.

As a result, each of the multiple-valued/binary conversion circuits 121 and 122 has input/output characteristics like those indicated by Table 6.

TABLE 6

| Quaternary Input | Output of Inverter 402 | Output of Universal literal gate 401 | Output of Inverter 403 |
| --- | --- | --- | --- |
| 0 | 1 | 0 | 1 |
| 1 | 1 | 1 | 0 |
| 2 | 0 | 0 | 1 |
| 3 | 0 | 1 | 0 |

The analog-to-digital conversion device according to the first embodiment has been described above. With the above arrangement, this analog-to-digital conversion device operates as follows.

Assume that the voltage of the input analog signal $V_{in}$ is 9.0 V. In this case, since $V_2$ (=7.5 V)<$V_{in}$<$V_3$ (11. 5 V) , $f_3$ (=1) is output as the multiple-valued (quaternary) signal F from the coarse quantization circuit 101. In addition, "10" as the binary signal B1 is output as the upper two bits of the binary code B from the multiple-valued/binary conversion circuit 121 through the bit terminals b1 and b2.

In this case, since the multiple-valued (quaternary) signal F obtained from the coarse quantization circuit 101 is $f_3$ (=1), the signal selection circuit 110 selects the multiple-valued (quaternary) signal $F_3$ output from the fine quantization circuit 104 as an output. In this case, since the input analog signal $V_{in}$ satisfies the inequality $V_{3,1}$ (=8.5 V)<$V_{in}$ (=9 V)<($V_{3,2}$ (=9.5 V), the signal $F_3$ with $f_{3,2}$ (=2) is output from the fine quantization circuit 104. Therefore, the multiple-valued/binary conversion circuit 122, which has received this signal, outputs the binary signal B2 having "01" as the lower two bits of the binary code B from the bit terminals b3 and b4.

As a consequence, if the input analog signal $V_{in}$ is 9.0 V, the binary code B to be output is the 4-bit code "1001".

As described above, the analog-to-digital conversion device according to the first embodiment can convert the analog signal $V_{in}$ into the 4-bit binary code B and output it.

The analog-to-digital conversion device according to the present invention in FIG. 1-A uses only one coarse quantization circuit 101, four fine quantization circuits 102 to 105, one signal selection circuit 110, and two multiple-valued/binary conversion circuits 121 and 122, as shown in FIG. 1-A. The number of elements required to build the analog-to-digital conversion device according to the first embodiment is much smaller than that for the conventional analog-to-digital conversion device in FIG. 20.

According to the first embodiment, therefore, when this device and other devices are integrated into a monolithic unit, the area occupied by the analog-to-digital conversion device can be reduced as compared with the prior art. Again, according to the first embodiment, a compact analog-to-digital conversion device can be formed.

Furthermore, since the number of elements is decreased, the analog-to-digital conversion device of the first embodiment can reduce the power consumption and operate at high speed as compared with the conventional device.

Second Embodiment

The second embodiment of the present invention will be described next.

Figure 6:
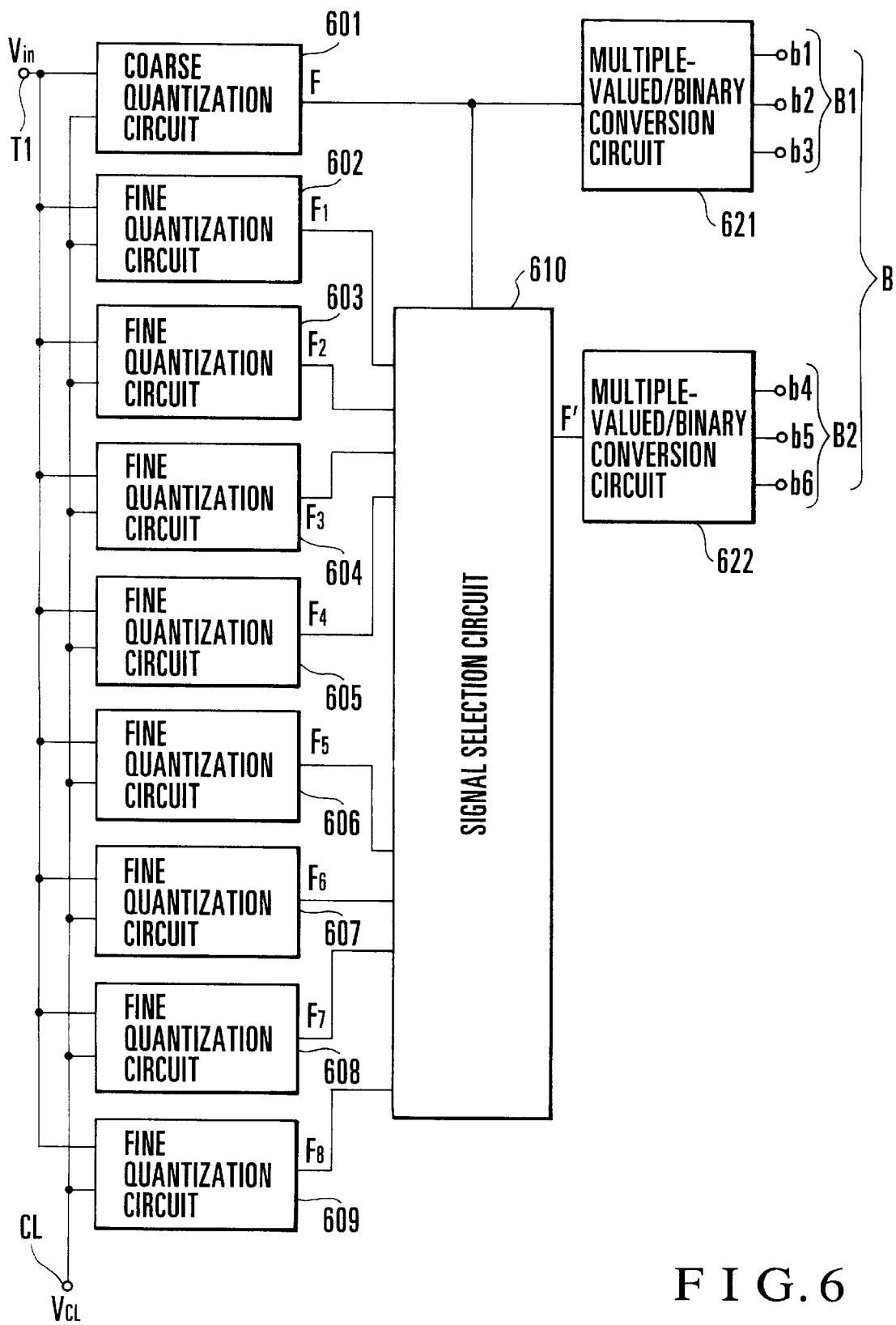
FIG. 6 is a block diagram showing the arrangement of an analog-to-digital conversion device according to the second embodiment of the present invention.

FIG. 6 shows the arrangement of an analog-to-digital conversion device according to the second embodiment. In the second embodiment, an analog signal $V_{in}$ is quantized into a multiple-valued signal, which is an octonary signal or eight-valued signal, and the multiple-valued signal is converted into a binary signal as a binary code.

As shown in FIG. 6, this analog-to-digital conversion device includes a coarse quantization circuit 601 and fine quantization circuits 602 to 609. These circuits operate in synchronism with a clock signal $V_{CL}$ input through a terminal CL. The device also includes a signal selection circuit 610 for selecting and outputting one of output signals from the fine quantization circuits 602 to 609 on the basis of the signal output from the coarse quantization circuit 601. The device includes multiple-valued/binary conversion circuits 621 and 622 as octonary/binary conversion circuits.

In this analog-to-digital conversion device, first of all, the analog signal $V_{in}$ input through a input terminal T1 is temporarily quantized into an octonary signal by the coarse quantization circuit 601 and the fine quantization circuits 602 to 609. The quantized octonary signal is then converted into a common binary code by the multiple-valued/binary conversion circuits 621 and 622. As a result, a binary signal B1 is output from bit terminals b1, b2, and b3, and a binary signal B2 is output from bit terminals b4, b5, and b6. A binary code B has these binary signals B1 and B2 as its bits.

This device will be described in more detail below.

The coarse quantization circuit 601 and the fine quantization circuits 602 to 609 will be described first.

First of all, the coarse quantization circuit 601 quantizes the analog signal $V_{in}$ input through the input terminal T1 into a multiple-valued signal F which is an octonary signal by dividing the analog signal $V_{in}$ with thresholds $V_1$, $V_2$, $V_3$, $V_4$, $V_5$, $V_6$, and $V_7$ satisfying $V_1<V_2<V_3<V_4<V_5<V_6<V_7$, as indicated by Table 7.

TABLE 7

| Input Value | Value of Octonary Signal F | B1 | | | Quantization Circuit to Be Selected |
|---|---|---|---|---|---|
| $V_1 < V_2 < V_3 < V_4 < V_5 < V_6 < V_7$ | | b1 | b2 | b3 | |
| $V_{in} \leq V_1$ (= 7.5 V) | $f_1$ (= 7) | 0 | 0 | 0 | $Q_1(F_1)$ |
| $V_1 < V_{in} \leq V_2$ (= 15.5 V) | $f_2$ (= 6) | 0 | 0 | 1 | $Q_2(F_2)$ |
| $V_2 < V_{in} \leq V_3$ (= 23.5 V) | $f_3$ (= 5) | 0 | 1 | 0 | $Q_3(F_3)$ |
| $V_3 < V_{in} \leq V_4$ (= 31.5 V) | $f_4$ (= 4) | 0 | 1 | 1 | $Q_4(F_4)$ |
| $V_4 < V_{in} \leq V_5$ (= 39.5 V) | $f_5$ (= 3) | 1 | 0 | 0 | $Q_5(F_5)$ |
| $V_5 < V_{in} \leq V_6$ (= 47.5 V) | $f_6$ (= 2) | 1 | 0 | 1 | $Q_6(F_6)$ |
| $V_6 < V_{in} \leq V_7$ (= 55.5 V) | $f_7$ (= 1) | 1 | 1 | 0 | $Q_7(F_7)$ |
| $V_7 < V_{in}$ | $f_8$ (= 0) | 1 | 1 | 1 | $Q_8(F_8)$ |

That is, the coarse quantization circuit 601 quantizes the analog signal $V_{in}$ input through the input terminal T1 to take the value of $f_1$ if $V_{in} \leq V_1$; the value of $f_2$ if $V_1<V_{in}\leq V_2$; the value of $f_3$ if $V_2<V_{in}\leq V_3$; the value of $f_4$ if $V_3<V_{in}\leq V_4$; the value of $f_5$ if $V_4<V_{in}\leq V_5$; the value of $f_6$ if $V_5<V_{in}\leq V_6$; the value of $f_7$ if $V_6<V_{in}\leq V_7$; and the value of $f_8$ if $V_7<V_{in}$.

In the second embodiment, as indicated by Table 7, for example, the quantization thresholds $V_1$ to $V_7$ are $V_1$=7.5 V, $V_2$=15.5 V, $V_3$=23.5 V, $V_4$=31.5 V, $V_5$=39.5 V, $V_6$=47.5 V, and $V_7$=55.5 V, and the values $f_1$ to $f_8$ of the multiple-valued signal F output from the coarse quantization circuit 601 are $f_1$=7, $f_2$=6, $f_3$=5, $f_4$=4, $f_5$=3, $f_6$=2, $f_7$=1, and $f_8$=0.

As indicated by Table 8, the fine quantization circuit 602 quantizes the analog signal $V_{in}$ input from the terminal T1 into a multiple-valued signal $F_1$ which is an octonary signal by dividing the analog signal $V_{in}$ with thresholds $V_{1,1}$, $V_{1,2}$, $V_{1,3}$, $V_{1,4}$, $V_{1,5}$, $V_{1,6}$, and $V_{1,7}$ satisfying $V_{1,1}<V_{1,2}<V_{1,3}<V_{1,4}<V_{1,5}<V_{1,6}<V_{1,7}(<V_1)$.

TABLE 8

| Input Value $V_{1,1} < V_{1,2} < V_{1,3} < V_{1,4} < V_{1,5} < V_{1,6} <$ | Value of Octonary | B2 | | |
|---|---|---|---|---|
| $V_{1,7} < V_1$ (= 7.5 V) | Signal $F_1$ | b4 | b5 | b6 |
| $V_{in} \leq V_{1,1}$ (= 0.5 V) | $f_{1,1}$ (= 7) | 0 | 0 | 0 |
| $V_{1,1} < V_{in} \leq V_{1,2}$ (= 1.5 V) | $f_{1,2}$ (= 6) | 0 | 0 | 1 |
| $V_{1,2} < V_{in} \leq V_{1,3}$ (= 2.5 V) | $f_{1,3}$ (= 5) | 0 | 1 | 0 |
| $V_{1,3} < V_{in} \leq V_{1,4}$ (= 3.5 V) | $f_{1,4}$ (= 4) | 0 | 1 | 1 |
| $V_{1,4} < V_{in} \leq V_{1,5}$ (= 4.5 V) | $f_{1,5}$ (= 3) | 1 | 0 | 0 |
| $V_{1,5} < V_{in} \leq V_{1,6}$ (= 5.5 V) | $f_{1,6}$ (= 2) | 1 | 0 | 1 |
| $V_{1,6} < V_{in} \leq V_{1,7}$ (= 6.5 V) | $f_{1,7}$ (= 1) | 1 | 1 | 0 |
| $V_{1,7} < V_{in}$ | $f_{1,8}$ (= 0) | 1 | 1 | 1 |

In the second embodiment, as indicated by Table 8, for example, the quantization thresholds $V_{1,1}$ to $V_{1,7}$ are $V_{1,1}$= 0.5 V, $V_{1,2}$=1.5 V, $V_{1,3}$=2.5 V, $V_{1,4}$=3.5 V, $V_{1,5}$=4.5 V, $V_{1,6}$=5.5 V, and $V_{1,7}$=6.5 V, and the values $f_{1,1}$ to $f_{1,8}$ of the multiple-valued signal $F_1$ output from the fine quantization circuit 602 are $f_{1,1}$=7, $f_{1,2}$=6, $f_{1,3}$=5, $f_{1,4}$=4, $f_{1,5}$=3, $f_{1,6}$=2, $f_{1,7}$=1, and $f_{1,8}$=0.

Similarly, as indicated by Table 9, the fine quantization circuit 603 quantizes the analog signal $V_{in}$ input from the terminal T1 into a multiple-valued signal $F_2$ which is an octonary signal by dividing the analog signal $V_{in}$ with thresholds $V_{2,1}$, $V_{2,2}$, $V_{2,3}$, $V_{2,4}$, $V_{2,5}$, $V_{2,6}$, and $V_{2,7}$ satisfying $(V_1<)$ $V_{2,1}<V_{2,2}<V_{2,3}<V_{2,4}<V_{2,5}<V_{2,6}<V_{2,7}$ $(<V_2)$.

TABLE 9

| Input Value $V_1$ (7.5 V) $< V_{2,1} < V_{2,2} < V_{2,3} < V_{2,4} <$ | Value of Octonary | B2 | | |
|---|---|---|---|---|
| $V_{2,5} < V_{2,6} < V_{2,7} < V_2$ (= 15.5 V) | Signal $F_2$ | b4 | b5 | b6 |
| $V_{in} \leq V_{2,1}$ (= 8.5 V) | $f_{2,1}$ (= 7) | 0 | 0 | 0 |
| $V_{2,1} < V_{in} \leq V_{2,2}$ (= 9.5 V) | $f_{2,2}$ (= 6) | 0 | 0 | 1 |
| $V_{2,2} < V_{in} \leq V_{2,3}$ (= 10.5 V) | $f_{2,3}$ (= 5) | 0 | 1 | 0 |
| $V_{2,3} < V_{in} \leq V_{2,4}$ (= 11.5 V) | $f_{2,4}$ (= 4) | 0 | 1 | 1 |
| $V_{2,4} < V_{in} \leq V_{2,5}$ (= 12.5 V) | $f_{2,5}$ (= 3) | 1 | 0 | 0 |
| $V_{2,5} < V_{in} \leq V_{2,6}$ (= 13.5 V) | $f_{2,6}$ (= 2) | 1 | 0 | 1 |
| $V_{2,6} < V_{in} \leq V_{2,7}$ (= 14.5 V) | $f_{2,7}$ (= 1) | 1 | 1 | 0 |
| $V_{2,7} < V_{in}$ | $f_{2,8}$ (= 0) | 1 | 1 | 1 |

Also, as indicated by Table 10, the fine quantization circuit 604 quantizes the analog signal $V_{in}$ input from the terminal T1 into a multiple-valued signal $F_3$ which is an octonary signal by dividing the analog signal $V_{in}$ with thresholds $V_{3,1}$, $V_{3,2}$, $V_{3,3}$, $V_{3,4}$, $V_{3,5}$, $V_{3,6}$, and $V_{3,7}$ satisfying $(V_2<)$ $V_{3,1}<V_{3,2}<V_{3,3}<V_{3,4}<V_{3,5}<V_{3,6}<V_{3,7}$ $(<V_3)$.

TABLE 10

| Input Value $V_2$ (15.5 V) $< V_{3,1} < V_{3,2} < V_{3,3} < V_{3,4} <$ | Value of Octonary | B2 | | |
|---|---|---|---|---|
| $V_{3,5} < V_{3,6} < V_{3,7} < V_3$ (= 23.5 V) | Signal $F_3$ | b4 | b5 | b6 |
| $V_{in} \leq V_{3,1}$ (= 16.5 V) | $f_{3,1}$ (= 7) | 0 | 0 | 0 |
| $V_{3,1} < V_{in} \leq V_{3,2}$ (= 17.5 V) | $f_{3,2}$ (= 6) | 0 | 0 | 1 |
| $V_{3,2} < V_{in} \leq V_{3,3}$ (= 18.5 V) | $f_{3,3}$ (= 5) | 0 | 1 | 0 |
| $V_{3,3} < V_{in} \leq V_{3,4}$ (= 19.5 V) | $f_{3,4}$ (= 4) | 0 | 1 | 1 |
| $V_{3,4} < V_{in} \leq V_{3,5}$ (= 20.5 V) | $f_{3,5}$ (= 3) | 1 | 0 | 0 |
| $V_{3,5} < V_{in} \leq V_{3,6}$ (= 21.5 V) | $f_{3,6}$ (= 2) | 1 | 0 | 1 |
| $V_{3,6} < V_{in} \leq V_{3,7}$ (= 22.5 V) | $f_{3,7}$ (= 1) | 1 | 1 | 0 |
| $V_{3,7} < V_{in}$ | $f_{3,8}$ (= 0) | 1 | 1 | 1 |

As indicated by Table 11, the fine quantization circuit 605 quantizes the analog signal $V_{in}$ input from the terminal T1 into a multiple-valued signal $F_4$ which is an octonary signal by dividing the analog signal $V_{in}$ with thresholds $V_{4,1}$, $V_{4,2}$, $V_{4,3}$, $V_{4,4}$, $V_{4,5}$, $V_{4,6}$, and $V_{4,7}$ satisfying $(V_3<)$ $V_{4,1}<V_{4,2}<V_{4,3}<V_{4,4}<V_{4,5}<V_{4,6}<V_{4,7}$ $(<V_4)$.

TABLE 11

| Input Value $V_3$ (23.5 V) $< V_{4,1} < V_{4,2} < V_{4,3} < V_{4,4} <$ | Value of Octonary | B2 | | |
|---|---|---|---|---|
| $V_{4,5} < V_{4,6} < V_{4,7} < V_4$ (= 31.5 V) | Signal $F_4$ | b4 | b5 | b6 |
| $V_{in} \leq V_{4,1}$ (= 24.5 V) | $f_{4,1}$ (= 7) | 0 | 0 | 0 |
| $V_{4,1} < V_{in} \leq V_{4,2}$ (= 25.5 V) | $f_{4,2}$ (= 6) | 0 | 0 | 1 |
| $V_{4,2} < V_{in} \leq V_{4,3}$ (= 26.5 V) | $f_{4,3}$ (= 5) | 0 | 1 | 0 |
| $V_{4,3} < V_{in} \leq V_{4,4}$ (= 27.5 V) | $f_{4,4}$ (= 4) | 0 | 1 | 1 |
| $V_{4,4} < V_{in} \leq V_{4,5}$ (= 28.5 V) | $f_{4,5}$ (= 3) | 1 | 0 | 0 |
| $V_{4,5} < V_{in} \leq V_{4,6}$ (= 29.5 V) | $f_{4,6}$ (= 2) | 1 | 0 | 1 |
| $V_{4,6} < V_{in} \leq V_{4,7}$ (= 30.5 V) | $f_{4,7}$ (= 1) | 1 | 1 | 0 |
| $V_{4,7} < V_{in}$ | $f_{4,8}$ (= 0) | 1 | 1 | 1 |

As indicated by Table 12, the fine quantization circuit 606 quantizes the analog signal $V_{in}$ input from the terminal T1 into a multiple-valued signal $F_5$ which is an octonary signal by dividing the analog signal $V_{in}$ with thresholds $V_{5,1}$, $V_{5,2}$, $V_{5,3}$, $V_{5,4}$, $V_{5,5}$, $V_{5,6}$, and $V_{5,7}$ satisfying $(V_4<)$ $V_{5,1}<V_{5,2}<V_{5,3}<V_{5,4}<V_{5,6}<V_{5,7}$ $(<V_5)$.

TABLE 12

| Input Value<br>$V_4$ (31.5 V) < $V_{5,1}$ < $V_{5,2}$ < $V_{5,3}$ < $V_{5,4}$ <<br>$V_{5,5}$ < $V_{5,6}$ < $V_{5,7}$ < $V_5$ (= 39.5 V) | Value of<br>Octonary<br>Signal $F_5$ | B2 | | |
|---|---|---|---|---|
| | | b4 | b5 | b6 |
| $V_{in} \leq V_{5,1}$ (= 32.5 V) | $f_{5,1}$ (= 7) | 0 | 0 | 0 |
| $V_{5,1} < V_{in} \leq V_{5,2}$ (= 33.5 V) | $f_{5,2}$ (= 6) | 0 | 0 | 1 |
| $V_{5,2} < V_{in} \leq V_{5,3}$ (= 34.5 V) | $f_{5,3}$ (= 5) | 0 | 1 | 0 |
| $V_{5,3} < V_{in} \leq V_{5,4}$ (= 35.5 V) | $f_{5,4}$ (= 4) | 0 | 1 | 1 |
| $V_{5,4} < V_{in} \leq V_{5,5}$ (= 36.5 V) | $f_{5,5}$ (= 3) | 1 | 0 | 0 |
| $V_{5,5} < V_{in} \leq V_{5,6}$ (= 37.5 V) | $f_{5,6}$ (= 2) | 1 | 0 | 1 |
| $V_{5,6} < V_{in} \leq V_{5,7}$ (= 38.5 V) | $f_{5,7}$ (= 1) | 1 | 1 | 0 |
| $V_{5,7} < V_{in}$ | $f_{5,8}$ (= 0) | 1 | 1 | 1 |

As indicated by Table 13, the fine quantization circuit 607 quantizes the analog signal $V_{in}$ input from the terminal T1 into a multiple-valued signal $F_6$ which is an octonary signal by dividing the analog signal $V_{in}$ with thresholds $V_{6,1}$, $V_{6,2}$, $V_{6,3}$, $V_{6,4}$, $V_{6,5}$, $V_{6,6}$, and $V_{6,7}$ satisfying $(V_5<)$ $V_{6,1}<V_{6,2}<V_{6,3}<V_{6,4}<V_{6,5}<V_{6,6}<V_{6,7}$ $(<V_6)$.

TABLE 13

| Input Value<br>$V_5$ (39.5 V) < $V_{6,1}$ < $V_{6,2}$ < $V_{6,3}$ < $V_{6,4}$ <<br>$V_{6,5}$ < $V_{6,6}$ < $V_{6,7}$ < $V_6$ (= 47.5 V) | Value of<br>Octonary<br>Signal $F_6$ | B2 | | |
|---|---|---|---|---|
| | | b4 | b5 | b6 |
| $V_{in} \leq V_{6,1}$ (= 40.5 V) | $f_{6,1}$ (= 7) | 0 | 0 | 0 |
| $V_{6,1} < V_{in} \leq V_{6,2}$ (= 41.5 V) | $f_{6,2}$ (= 6) | 0 | 0 | 1 |
| $V_{6,2} < V_{in} \leq V_{6,3}$ (= 42.5 V) | $f_{6,3}$ (= 5) | 0 | 1 | 0 |
| $V_{6,3} < V_{in} \leq V_{6,4}$ (= 43.5 V) | $f_{6,4}$ (= 4) | 0 | 1 | 1 |
| $V_{6,4} < V_{in} \leq V_{6,5}$ (= 44.5 V) | $f_{6,5}$ (= 3) | 1 | 0 | 0 |
| $V_{6,5} < V_{in} \leq V_{6,6}$ (= 45.5 V) | $f_{6,6}$ (= 2) | 1 | 0 | 1 |
| $V_{6,6} < V_{in} \leq V_{6,7}$ (= 46.5 V) | $f_{6,7}$ (= 1) | 1 | 1 | 0 |
| $V_{6,7} < V_{in}$ | $f_{6,8}$ (= 0) | 1 | 1 | 1 |

As indicated by Table 14, the fine quantization circuit 608 quantizes the analog signal $V_{in}$ input from the terminal T1 into a multiple-valued signal $F_7$ which is an octonary signal by dividing the analog signal $V_{in}$ with thresholds $V_{7,1}$, $V_{7,2}$, $V_{7,3}$, $V_{7,4}$, $V_{7,5}$, $V_{7,6}$, and $V_{7,7}$ satisfying $(V_6<)$ $V_{7,1}<V_{7,2}<V_{7,3}<V_{7,4}<V_{7,5}<V_{7,6}<V_{7,7}$ $(<V_7)$.

TABLE 14

| Input Value<br>$V_6$ (47.5 V) < $V_{7,1}$ < $V_{7,2}$ < $V_{7,3}$ < $V_{7,4}$ <<br>$V_{7,5}$ < $V_{7,6}$ < $V_{7,7}$ < $V_7$ (= 55.5 V) | Value of<br>Octonary<br>Signal $F_7$ | B2 | | |
|---|---|---|---|---|
| | | b4 | b5 | b6 |
| $V_{in} \leq V_{7,1}$ (= 48.5 V) | $f_{7,1}$ (= 7) | 0 | 0 | 0 |
| $V_{7,1} < V_{in} \leq V_{7,2}$ (= 49.5 V) | $f_{7,2}$ (= 6) | 0 | 0 | 1 |
| $V_{7,2} < V_{in} \leq V_{7,3}$ (= 50.5 V) | $f_{7,3}$ (= 5) | 0 | 1 | 0 |
| $V_{7,3} < V_{in} \leq V_{7,4}$ (= 51.5 V) | $f_{7,4}$ (= 4) | 0 | 1 | 1 |
| $V_{7,4} < V_{in} \leq V_{7,5}$ (= 52.5 V) | $f_{7,5}$ (= 3) | 1 | 0 | 0 |
| $V_{7,5} < V_{in} \leq V_{7,6}$ (= 53.5 V) | $f_{7,6}$ (= 2) | 1 | 0 | 1 |
| $V_{7,6} < V_{in} \leq V_{7,7}$ (= 54.5 V) | $f_{7,7}$ (= 1) | 1 | 1 | 0 |
| $V_{7,7} < V_{in}$ | $f_{7,8}$ (= 0) | 1 | 1 | 1 |

As indicated by Table 15, the fine quantization circuit 609 quantizes the analog signal $V_{in}$ input from the terminal T1 into a multiple-valued signal $F_7$ which is an octonary signal by dividing the analog signal $V_{in}$ with thresholds $V_{8,1}$, $V_{8,2}$, $V_{8,3}$, $V_{8,4}$, $V_{8,5}$, $V_{8,6}$, and $V_{8,7}$ satisfying $(V_7<)$ $V_{8,1}<V_{8,2}<V_{8,3}<V_{8,4}<V_{8,5}<V_{8,6}<V_{8,7}$ $(<V_8)$.

TABLE 15

| Input Value<br>$V_7$ (55.5 V) < $V_{8,1}$ < $V_{8,2}$ < $V_{8,3}$ < $V_{8,4}$ <<br>$V_{8,5}$ < $V_{8,6}$ < $V_{8,7}$ | Value of<br>Octonary<br>Signal $F_8$ | B2 | | |
|---|---|---|---|---|
| | | b4 | b5 | b6 |
| $V_{in} \leq V_{8,1}$ (= 56.5 V) | $f_{8,1}$ (= 7) | 0 | 0 | 0 |
| $V_{8,1} < V_{in} \leq V_{8,2}$ (= 57.5 V) | $f_{8,2}$ (= 6) | 0 | 0 | 1 |
| $V_{8,2} < V_{in} \leq V_{8,3}$ (= 58.5 V) | $f_{8,3}$ (= 5) | 0 | 1 | 0 |
| $V_{8,3} < V_{in} \leq V_{8,4}$ (= 59.5 V) | $f_{8,4}$ (= 4) | 0 | 1 | 1 |
| $V_{8,4} < V_{in} \leq V_{8,5}$ (= 60.5 V) | $f_{8,5}$ (= 3) | 1 | 0 | 0 |
| $V_{8,5} < V_{in} \leq V_{8,6}$ (= 61.5 V) | $f_{8,6}$ (= 2) | 1 | 0 | 1 |
| $V_{8,6} < V_{in} \leq V_{8,7}$ (= 62.5 V) | $f_{8,7}$ (= 1) | 1 | 1 | 0 |
| $V_{8,7} < V_{in}$ | $f_{8,8}$ (= 0) | 1 | 1 | 1 |

Figure 7:
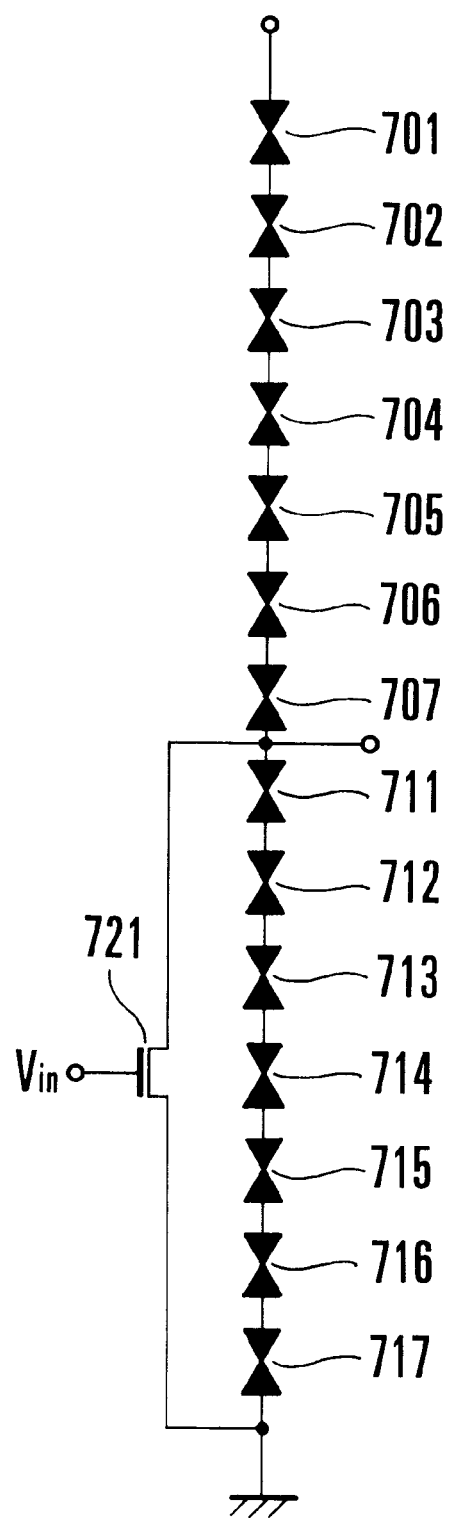
FIG. 7 is a circuit diagram showing a fine quantization circuit in FIG. 6.

Each of the coarse quantization circuit 601 and the fine quantization circuits 602 to 609 can be constituted by the octonary quantization circuit shown in FIG. 7.

This quaternary quantization circuit uses a series circuit of resonant-tunneling diodes 701 to 707 and 711 to 717 exhibiting negative differentiation resistance characteristics like those shown in FIG. 2-A. These resonant-tunneling diodes 701 to 707 and 711 to 717 exhibit different peak current values in the current/voltage characteristics between the two terminals of each diode.

A field-effect transistor 721 is connected in parallel with the resonant-tunneling diodes 701 to 707 and 711 to 717. If, for example, a high electron mobility transistor (HEMT) is used as the field-effect transistor 721, high-speed operation can be expected.

A clock signal (FIG. 2-B) is input through one end of the resonant-tunneling diode 701, and the analog signal $V_{in}$ is input through the gate (input terminal) of the field-effect transistor 721. As a result, a quantized multiple-valued signal is output from the node of the resonant-tunneling diodes 707 and 711.

In this octonary quantization circuit, as the voltage of the signal input to the input terminal changes, the value of the current flowing in the parallel circuit of the resonant-tunneling diodes 711 to 717 and the field-effect transistor 721 changes. More specifically, since the current flowing in the overall parallel circuit is the sum of currents flowing in the field-effect transistor 721 and the resonant-tunneling diodes 711 to 717, the effective current flowing in the overall parallel circuit changes as the drain current in the field-effect transistor 721 changes with a change in input voltage.

As a consequence, these quantization circuits operate in almost the same manner as the coarse quantization circuit 101 and the fine quantization circuits 102 to 105 in the first embodiment, thereby obtaining input/output characteristics that quantize the input analog signal $V_{in}$ into an octonary signal.

The signal selection circuit 610 will be described next.

The signal selection circuit 610 is controlled by the multiple-valued signal F (FIG. 6) output from the coarse quantization circuit 601 to select one of the multiple-valued signals $F_1$, $F_2$, $F_3$, $F_4$, $F_5$, $F_6$, $F_7$, and $F_8$ output from the coarse quantization circuit 601 and output it as a multiple-valued signal F'.

If, for example, the value of the quaternary signal as the multiple-valued signal F output from the coarse quantization circuit 601 is $f_1$ (=7), the signal selection circuit 610 selects the multiple-valued (octonary) signal $F_1$ output from the fine quantization circuit 602, and outputs it as the multiple-valued signal F'.

Figure 8:
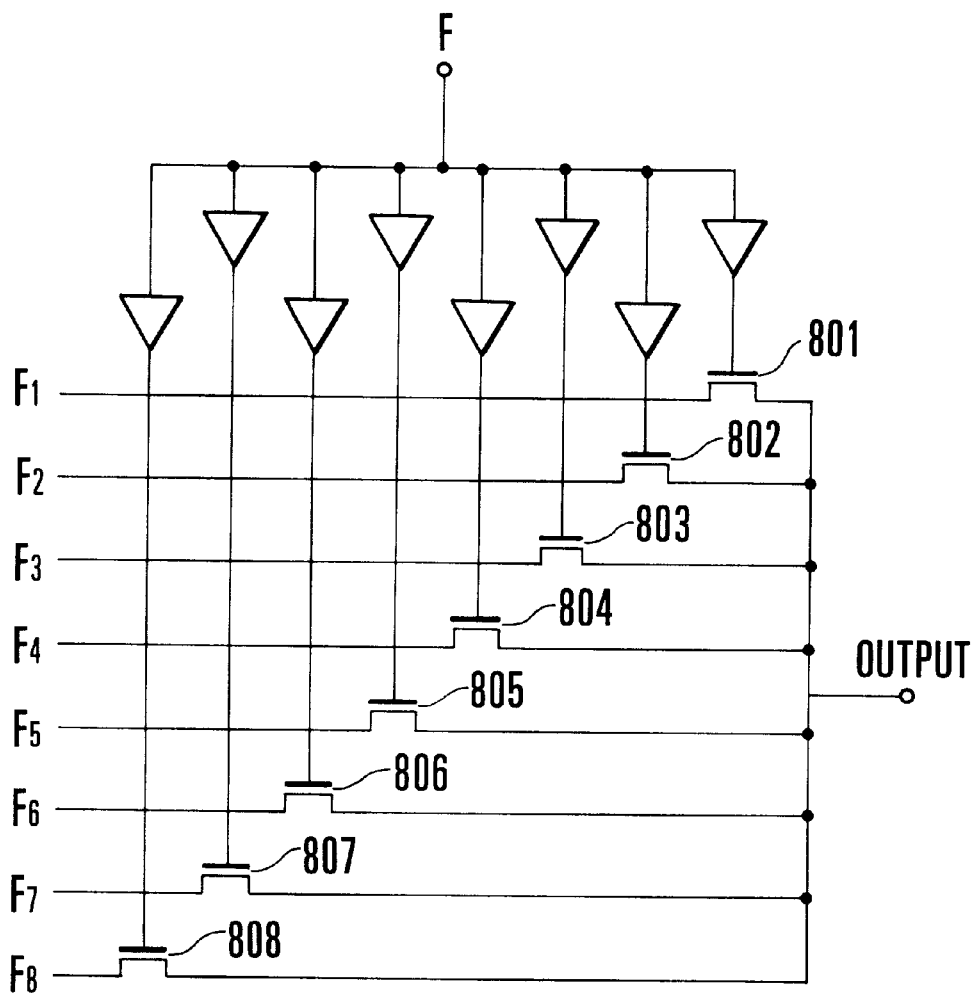
FIG. 8 is a circuit diagram showing the arrangement of a signal selection circuit in FIG. 6.

As this signal selection circuit 610, a known T gate circuit can be used, as shown in FIG. 8. In this case, eight pass transistors 801 to 808 can be used.

Referring to FIG. 6, the signal selection circuit 610 is controlled by the multiple-valued signal F output from the coarse quantization circuit 601. However, the present invention is not limited to this. The signal selection circuit 610 may be controlled by the binary signal B1 output from the multiple-valued/binary conversion circuit 621.

The multiple-valued/binary conversion circuits 621 and 622 will be described next.

The multiple-valued/binary conversion circuit 621 converts the multiple-valued signal F (octonary signal) output from the coarse quantization circuit 601 into the binary signal B1 as bits of the binary code B. In the sixth embodiment, as indicated by Table 7, the multiple-valued/binary conversion circuit 621 converts the multiple-valued signal F output from the coarse quantization circuit 601 into the binary signal B1. More specifically, if the multiple-valued signal F is $f_1$ (=7), the signal is converted into "000". If the multiple-valued signal F is $f_2$ (=6), the signal is converted into "010". If the multiple-valued signal F is $f_3$ (=5), the signal is converted into "010". If the multiple-valued signal F is $f_4$ (=4), the signal is converted into "011". If the multiple-valued signal F is $f_5$ (=3), the signal is converted into "100". If the multiple-valued signal F is $f_6$ (=2), the signal is converted into "101". If the multiple-valued signal F is $f_7$ (=1), the signal is converted into "110". If the multiple-valued signal F is $f_8$ (=0), the signal is converted into "111". Of the three bits of each converted signal, the upper bit is output to the bit terminal b1; the intermediate bit, to the bit terminal b2; and the lower bit, to the bit terminal b3 (FIG. 6).

The multiple-valued/binary conversion circuit 622 converts one of the multiple-valued signals $F_1$ to $F_8$ (octonary signals) output from the signal selection circuit 610 into the binary signal B2 as bits of the binary code B.

In this case, as indicated by Tables 8 to 15, if a multiple-valued (octonary) signal $F_P$ (P=1, 2, 3, 4, 5, 6, 7, 8) is $f_{P,1}$ (=7), a signal represented by the three bits "000" is output as the binary signal B2.

If the multiple-valued signal $F_P$ (P=1, 2, 3, 4, 5, 6, 7, 8) is $f_{P,2}$ (=6), a signal represented by the three bits "001" is output.

If the multiple-valued signal $F_P$ (P=1, 2, 3, 4, 5, 6, 7, 8) is $f_{P,3}$ (=5), a signal represented by the three bits "010" is output.

If the multiple-valued signal $F_P$ (P=1, 2, 3, 4, 5, 6, 7, 8) is $f_{P,4}$ (=4), a signal represented by the three bits "011" is output.

If the multiple-valued signal $F_P$ (P=1, 2, 3, 4, 5, 6, 7, 8) is $f_{P,5}$ (=3), a signal represented by the three bits "100" is output.

If the multiple-valued signal $F_P$ (P=1, 2, 3, 4, 5, 6, 7, 8) is $f_{P,6}$ (=2), a signal represented by the three bits "101" is output.

If the multiple-valued signal $F_P$ (P=1, 2, 3, 4, 5, 6, 7, 8) is $f_{P,7}$ (=1), a signal represented by the three bits "110" is output.

If the multiple-valued signal $F_P$ (P=1, 2, 3, 4, 5, 6, 7, 8) is $f_{P,8}$ (=0), a signal represented by the three bits "111" is output.

Of the three bits of each signal, the upper bit is output from the bit terminal b4; the intermediate bit, from the bit terminal b5; and the lower bit, from the bit terminal b6.

The analog-to-digital conversion device according to the second embodiment has been described above. With the above arrangement, this analog-to-digital conversion device operates as follows.

Assume that the voltage of the input analog signal $V_{in}$ is 26.0 V. In this case, since $V_3$ (=23.5 V)<$V_{in}$<$V_4$ (31.5 V), $f_4$ (=4) is output as the multiple-valued (octonary) signal F from the coarse quantization circuit 601. In addition, "001" as the binary signal B1 is output as the upper three bits of the binary code B from the multiple-valued/binary conversion circuit 621 through the bit terminals b1, b2, and b3.

In this case, since the multiple-valued signal F obtained from the coarse quantization circuit 601 is $f_4$ (=4), the signal selection circuit 610 selects the multiple-valued signal $F_4$ output from the fine quantization circuit 604 as an output. In this case, since the input analog signal $V_{in}$ satisfies the inequality $V_{4,2}$ (=25.5 V)<$V_{in}$ (=26 V)<$V_{4,3}$ (=26.5 V), the signal $F_4$ with $f_{4,3}$ (=5) is output from the fine quantization circuit 604. Therefore, the multiple-valued/binary conversion circuit 622, which has received this signal, outputs the binary signal B2 having "010" as the lower three bits of the binary code B from the bit terminals b4, b5, and b6.

As a result, if the voltage of the input analog signal $V_{in}$ is 26.0 V, the binary code B to be output is the 6-bit code "011010".

As described above, the analog-to-digital conversion device according to the second embodiment can converts the analog signal $V_{in}$ into the 6-bit binary code B and output it.

The analog-to-digital conversion device according to the present invention in FIG. 6 uses only one coarse quantization circuit 601, eight fine quantization circuits 602 to 609, one signal selection circuit 610, and two multiple-valued/binary conversion circuits 621 and 622, as shown in FIG. 6. The number of elements required to construct the analog-to-digital conversion device according to the second embodiment is much smaller than that for the conventional analog-to-digital conversion device in FIG. 20.

According to the second embodiment, therefore, when this device and other devices are integrated into a monolithic unit, the area occupied by the analog-to-digital conversion device can be reduced as compared with the prior art as in the first embodiment. In addition, according to the second embodiment, a compact analog-to-digital conversion device can be formed.

Furthermore, since the number of elements is decreased, the analog-to-digital conversion device of the second embodiment can reduce the power consumption and operate at high speed as compared with the conventional device.

Third Embodiment

The third embodiment of the present invention will be described next.

FIG. 9 shows the arrangement of an analog-to-digital conversion device according to the third embodiment of the present invention. This analog-to-digital conversion device quantizes an analog signal $V_{in}$ into a multiple-valued signal, which is a quaternary signal, and digitally converts the multiple-valued signal into a binary signal as a binary code B. The third embodiment is designed to perform analog-to-digital conversion with a higher precision than the first embodiment shown in FIGS. 1-A and 1-B.

As shown in FIG. 9, this analog-to-digital conversion device includes a coarse quantization circuit 901 and fine quantization circuits 902 to 905. In this embodiment, the device also includes full-resolution quantization circuits 931 to 934, 941 to 944, 951 to 954, and 961 to 964. These circuits operate in synchronism with a clock signal input through a terminal CL. Note that the full-resolution quantization circuits 951 to 954, 961, and 962 are not illustrated in FIG. 9.

This device also includes a signal selection circuit 910 for selecting and outputting one of output signals from the fine quantization circuits 902 to 905 on the basis of the signal output from the coarse quantization circuit 901. In addition, the device includes a signal selection circuit 911 for selecting and outputting one of output signals from the full-resolution quantization circuits 931 to 934, 941 to 944, 951 to 954, and 961 to 964 on the basis of the signals output from the coarse quantization circuit 901 and the signal selection circuit 910.

This device includes a multiple-valued/binary conversion circuit 923 in addition to multiple-valued/binary conversion circuits 921 and 922.

In this analog-to-digital conversion device, first of all, the analog signal $V_{in}$ input through an input terminal T1 is temporarily quantized into a quaternary signal by the coarse quantization circuit 901 and the fine quantization circuits 902 to 905. The quantized quaternary signal is converted into a common binary code by the multiple-valued/binary conversion circuits 921 and 922. Hence, a binary signal B1 is output from bit terminals b1 and b2, and a binary signal B2 is output from bit terminals b3 and b4. The binary code B is constituted by these binary signals B1 and B2 as bits.

The coarse quantization circuit 901, the fine quantization circuits 902 to 905, the signal selection circuit 910, and the multiple-valued/binary conversion circuits 921 and 922 are identical to those in the first embodiment, as described below.

The coarse quantization circuit 901 and the fine quantization circuits 902 to 905 will be described first.

The coarse quantization circuit 901 quantizes the analog signal $V_{in}$ input from the terminal T1 into a multiple-valued signal F, which is a quaternary signal, by dividing the analog signal $V_{in}$ with thresholds $V_1$, $V_2$, and $V_3$ satisfying $V_1<V_2<V_3$, as indicated by Table 1 described above.

The fine quantization circuit 902 quantizes the analog signal $V_{in}$ input from the terminal T1 into a multiple-valued signal $F_1$, which is a quaternary signal, by dividing the analog signal $V_{in}$ with thresholds $V_{1,1}$, $V_{1,2}$, and $V_{1,3}$ satisfying $V_{1,1}<V_{1,2}<V_{1,3}$ ($<V_1$), as indicated by Table 2 described above.

The fine quantization circuit 903 quantizes the analog signal $V_{in}$ input from the terminal T1 into a multiple-valued signal $F_2$, which is a quaternary signal, by dividing the analog signal $V_{in}$ with thresholds $V_{2,1}$, $V_{2,2}$, and $V_{2,3}$ satisfying $(V_1<) V_{2,1}<V_{2,2}<V_{2,3}$ ($<V_2$), as indicated by Table 3 described above.

The fine quantization circuit 904 quantizes the analog signal $V_{in}$ input from the terminal T1 into a multiple-valued signal $F_3$, which is a quaternary signal, by dividing the analog signal $V_{in}$ with thresholds $V_{3,1}$, $V_{3,2}$, and $V_{3,3}$ satisfying $(V_2<) V_{3,1}<V_{3,2}<V_{3,3}$ ($<V_3$), as indicated by Table 4 described above.

The fine quantization circuit 905 quantizes the analog signal $V_{in}$ input from the terminal T1 into a multiple-valued signal $F_4$, which is a quaternary signal, by dividing the analog signal $V_{in}$ with thresholds $V_{4,1}$, $V_{4,2}$, and $V_{4,3}$ satisfying $(V_3<) V_{4,1}<V_{4,2}<V_{4,3}$, as indicated by Table 5 described above.

The signal selection circuit 910 is controlled by the multiple-valued signal F (FIG. 1-A) output from the coarse quantization circuit 901 to select one of the multiple-valued signals $F_1$, $F_2$, $F_3$, and $F_4$ and output it as a multiple-valued signal F'.

More specifically, if the value of the multiple-valued signal F which is the quaternary signal output from the coarse quantization circuit 901 is $f_1$ (=3), as indicated by Table 1, the signal selection circuit 910 selects the multiple-valued (quaternary) signal $F_1$ output from the fine quantization circuit 902, and outputs it as the multiple-valued signal F'.

If the value of the multiple-valued signal F which output from the coarse quantization circuit 901 is $f_2$ (=2), the signal selection circuit 910 selects the multiple-valued signal $F_2$ output from the fine quantization circuit 903, and outputs it as the multiple-valued signal F'.

If the value of the multiple-valued signal F which output from the coarse quantization circuit 901 is $f_3$ (=1), the signal selection circuit 910 selects the multiple-valued signal $F_3$ output from the fine quantization circuit 904, and outputs it as the multiple-valued signal F'.

If the value of the multiple-valued signal F which output from the coarse quantization circuit 901 is $f_4$ (=0), the signal selection circuit 910 selects the multiple-valued signal $F_4$ output from the fine quantization circuit 905, and outputs it as the multiple-valued signal F'.

The multiple-valued/binary conversion circuit 921 converts the multiple-valued signal F (quaternary signal) output from the coarse quantization circuit 901 into the binary signal B1 as bits of the binary code B.

In this embodiment, as indicated by Table 1, the multiple-valued/binary conversion circuit 921 converts the multiple-valued signal F output from the coarse quantization circuit 901 into the binary signal B1.

More specifically, if the value of the multiple-valued signal F is $f_1$ (=1), the signal is converted into "00". Similarly, if the value is $f_2$ (=2), the signal is converted into "01". If the value is $f_3$ (=1), the signal is converted into "10". If the value is $f_4$ (=0), the signal is converted into "11". Of the two bits of each converted signal, the upper bit is output to the bit terminal b1, and the lower bit to the bit terminal b2 (FIG. 9).

The multiple-valued/binary conversion circuit 922 converts one of the multiple-valued signals $F_1$ to $F_4$ (quaternary signals) output from the signal selection circuit 910 into the binary signal B2 as bits of the binary code B.

In this case, as indicated by Tables 2 to 5, if the value of a multiple-valued (quaternary) signal $F_P$ (P=1, 2, 3, 4) is $f_{P,1}$ (=3), a signal represented by the two bits "00" is output as the binary signal B2.

If the value of the multiple-valued (quaternary) signal (P=1, 2, 3, 4) is $f_{P,2}$ (=2), a signal represented by the two bits "01" is output.

If the value of the multiple-valued (quaternary) signal (P=1, 2, 3, 4) is $f_{P,3}$ (=1), a signal represented by the tow bits "10" is output.

If the value of the multiple-valued (quaternary) signal (P=1, 2, 3, 4) is $f_{P,4}$ (=0), a signal represented by the tow bits "11" is output.

Of the two bits of each signal, the upper bit is output from the bit terminal b3, and the lower bit from the bit terminal b4 (FIG. 9).

The full-resolution quantization circuits 931 to 934, 941 to 944, 951 to 954, and 961 to 964, the signal selection circuit 911, the multiple-valued/binary conversion circuit 923, which are newly added to the third embodiment, will be described next.

The full-resolution quantization circuits 931 to 934, 941 to 944, 951 to 954, and 961 to 964 are identical to the fine quantization circuits 902 to 905.

More specifically, the full-resolution quantization circuit 931 quantizes the analog signal $V_{in}$ input through the terminal T1 into a multiple-valued signal $F_{1,1}$, which is a quaternary signal, by dividing the analog signal $V_{in}$ with thresholds $V_{1,1,1}$, $V_{1,1,2}$, and $V_{1,1,3}$ satisfying $V_{1,1,1}<V_{1,1,2}<V_{1,1,3}$ ($<V_{1,1}$), as indicated by Table 16 below.

TABLE 16

| Input Value $V_{1,1,1} < V_{1,1,2} < V_{1,1,3} < V_{1,1}$ (= 0.5 V) | Value of $F_{1,1}$ | B3 b5 | b6 |
|---|---|---|---|
| $V_{in} \leq V_{1,1,1}$ (−0.25 V) | $f_{1,1,1}$ (= 3) | 0 | 0 |
| $V_{1,1,1} < V_{in} \leq V_{1,1,2}$ (= 0V) | $f_{1,1,2}$ (= 2) | 0 | 1 |
| $V_{1,1,2} < V_{in} \leq V_{1,1,3}$ (= 0.25 V) | $f_{1,1,3}$ (= 1) | 1 | 0 |
| $V_{1,1,3} < V_{in}$ | $f_{1,1,4}$ (= 0) | 1 | 1 |

Similarly, the full-resolution quantization circuit 932 quantizes the analog signal $V_{in}$ input through the terminal T1 into a multiple-valued signal $F_{1,2}$, which is a quaternary signal, by dividing the analog signal $V_{in}$ with thresholds $V_{1,2,1}$, $V_{1,2,2}$, and $V_{1,2,3}$ satisfying $(V_{1,1}<) V_{1,2,1}<V_{1,2,2}<V_{1,2,3} (<V_{1,2})$, as indicated by Table 17 below.

TABLE 17

| Input Value $V_{1,1}$ (= 0.5 V) < $V_{1,2,1}$ < $V_{1,2,2}$ < $V_{1,2,3}$ < $V_{1,2}$ (= 1.5 V) | Value of $F_{1,2}$ | B3 b5 | b6 |
|---|---|---|---|
| $V_{in} \leq V_{1,2,1}$ (0.7 V) | $f_{1,2,1}$ (= 3) | 0 | 0 |
| $V_{1,2,1} < V_{in} \leq V_{1,2,2}$ (= 1.0V) | $f_{1,2,2}$ (= 2) | 0 | 1 |
| $V_{1,2,2} < V_{in} \leq V_{1,2,3}$ (= 1.25 V) | $f_{1,2,3}$ (= 1) | 1 | 0 |
| $V_{1,2,3} < V_{in}$ | $f_{1,2,4}$ (= 0) | 1 | 1 |

In like manner, the full-resolution quantization circuit 933 quantizes the analog signal $V_{in}$ input through the terminal T1 into a multiple-valued signal $F_{1,3}$, which is a quaternary signal, by dividing the analog signal $V_{in}$ with thresholds $V_{1,3,1}$, $V_{1,3,2}$, and $V_{1,3,3}$ satisfying $(V_{1,2}<) V_{1,3,1}<V_{1,3,2}<V_{1,3,3} (<V_{1,3})$, as indicated by Table 18 below.

TABLE 18

| Input Value $V_{1,1}$ (= 0.5 V) < $V_{1,3,1}$ < $V_{1,3,2}$ < $V_{1,3,3}$ < $V_{1,3}$ (= 1.5 V) | Value of $F_{1,3}$ | B3 b5 | b6 |
|---|---|---|---|
| $V_{in} \leq V_{1,3,1}$ (1.75 V) | $f_{1,3,1}$ (= 3) | 0 | 0 |
| $V_{1,3,1} < V_{in} \leq V_{1,3,2}$ (= 2.0V) | $f_{1,3,2}$ (= 2) | 0 | 1 |
| $V_{1,3,2} < V_{in} \leq V_{1,3,3}$ (= 2.25 V) | $f_{1,3,3}$ (= 1) | 1 | 0 |
| $V_{1,3,3} < V_{in}$ | $f_{1,3,4}$ (= 0) | 1 | 1 |

Likewise, the full-resolution quantization circuit 934 quantizes the analog signal $V_{in}$ input through the terminal T1 into a multiple-valued signal $F_{1,4}$, which is a quaternary signal, by dividing the analog signal $V_{in}$ with thresholds $V_{1,4,1}$, $V_{1,4,2}$, and $V_{1,4,3}$ satisfying $(V_{1,3}<) V_{1,4,1}<V_{1,4,2}<V_{1,4,3}$, as indicated by Table 19 below.

TABLE 19

| Input Value $V_{1,3}$ (= 2.5 V) < $V_{1,4,1}$ < $V_{1,4,2}$ < $V_{1,4,3}$ | Value of $F_{1,4}$ | B3 b5 | b6 |
|---|---|---|---|
| $V_{in} \leq V_{1,4,1}$ (2.75 V) | $f_{1,4,1}$ (= 3) | 0 | 0 |
| $V_{1,4,1} < V_{in} \leq V_{1,4,2}$ (= 3.0V) | $f_{1,4,2}$ (= 2) | 0 | 1 |
| $V_{1,4,2} < V_{in} \leq V_{1,4,3}$ (= 3.25 V) | $f_{1,4,3}$ (= 1) | 1 | 0 |
| $V_{1,4,3} < V_{in}$ | $f_{1,4,4}$ (= 0) | 1 | 1 |

Also, the full-resolution quantization circuit 941 quantizes the analog signal $V_{in}$ input through the terminal T1 into a multiple-valued signal $F_{2,1}$, which is a quaternary signal, by dividing the analog signal $V_{in}$ with thresholds $V_{2,1,1}$, $V_{2,1,2}$, and $V_{2,1,3}$ satisfying $V_{2,1,1}<V_{2,1,2}<V_{2,1,3} (<V_{2,1})$, as indicated by Table 20 below.

TABLE 20

| Input Value $V_{2,1}$ (= 0.5 V) < $V_{2,1,1}$ < $V_{2,1,2}$ < $V_{2,1,3}$ < $V_{2,1}$ (= 4.5 V) | Value of $F_{2,1}$ | B3 b5 | b6 |
|---|---|---|---|
| $V_{in} \leq V_{2,1,1}$ (3.75 V) | $f_{2,1,1}$ (= 3) | 0 | 0 |
| $V_{2,1,1} < V_{in} \leq V_{2,1,2}$ (= 4.0 V) | $f_{2,1,2}$ (= 2) | 0 | 1 |
| $V_{2,1,2} < V_{in} \leq V_{2,1,3}$ (= 4.25 V) | $f_{2,1,3}$ (= 1) | 1 | 0 |
| $V_{2,1,3} < V_{in}$ | $f_{2,1,4}$ (= 0) | 1 | 1 |

Analogously, the full-resolution quantization circuit 942 quantizes the analog signal $V_{in}$ input through the terminal T1 into a multiple-valued signal $F_{2,2}$, which is a quaternary signal, by dividing the analog signal $V_{in}$ with thresholds $V_{2,2,1}$, $V_{2,2,2}$, and $V_{2,2,3}$ satisfying $(V_{2,1}<) V_{2,2,1}<V_{2,2,2}<V_{2,2,3} (<V_{2,2})$, as indicated by Table 21 below.

TABLE 21

| Input Value $V_{2,1}$ (= 4.5 V) < $V_{2,2,1}$ < $V_{2,2,2}$ < $V_{2,2,3}$ < $V_{2,2}$ (= 5.5 V) | Value of $F_{2,2}$ | B3 b5 | b6 |
|---|---|---|---|
| $V_{in} \leq V_{2,2,1}$ (4.7 V) | $f_{2,2,1}$ (= 3) | 0 | 0 |
| $V_{2,2,1} < V_{in} \leq V_{2,2,2}$ (= 5.0 V) | $f_{2,2,2}$ (= 2) | 0 | 1 |
| $V_{2,2,2} < V_{in} \leq V_{2,2,3}$ (= 5.25 V) | $f_{2,2,3}$ (= 1) | 1 | 0 |
| $V_{2,2,3} < V_{in}$ | $f_{2,2,4}$ (= 0) | 1 | 1 |

Likewise, the full-resolution quantization circuit 943 quantizes the analog signal $V_{in}$ input through the terminal T1 into a multiple-valued signal $F_{2,3}$, which is a quaternary signal, by dividing the analog signal $V_{in}$ with thresholds $V_{2,3,1}$, $V_{2,3,2}$, and $V_{2,3,3}$ satisfying $(V_{2,2}<) V_{2,3,1}<V_{2,3,2}<V_{2,3,3} (<V_{2,3})$, as indicated by Table 22 below.

TABLE 22

| Input Value $V_{2,2}$ (= 5.5 V) < $V_{2,3,1}$ < $V_{2,3,2}$ < $V_{2,3,3}$ < $V_{2,3}$ (= 6.5 V) | Value of $F_{2,3}$ | B3 b5 | b6 |
|---|---|---|---|
| $V_{in} \leq V_{2,3,1}$ (5.75 V) | $f_{2,3,1}$ (= 3) | 0 | 0 |
| $V_{2,3,1} < V_{in} \leq V_{2,3,2}$ (= 6.0 V) | $f_{2,3,2}$ (= 2) | 0 | 1 |
| $V_{2,3,2} < V_{in} \leq V_{2,3,3}$ (= 6.25 V) | $f_{2,3,3}$ (= 1) | 1 | 0 |
| $V_{2,3,3} < V_{in}$ | $f_{2,3,4}$ (= 0) | 1 | 1 |

Similarly, the full-resolution quantization circuit 944 quantizes the analog signal $V_{in}$ input through the terminal T1 into a multiple-valued signal $F_{2,4}$, which is a quaternary signal, by dividing the analog signal $V_{in}$ with thresholds $V_{2,4,1}$, $V_{2,4,2}$, and $V_{2,4,3}$ satisfying $(V_{2,1}<) V_{2,4,1}<V_{2,4,2}<V_{2,4,3} (<V_{2,4})$, as indicated by Table 23 below.

TABLE 23

| Input Value $V_{2,3}$ (= 6.5 V) < $V_{2,4,1}$ < $V_{2,4,2}$ < $V_{2,4,3}$ | Value of $F_{2,4}$ | B3 b5 | b6 |
|---|---|---|---|
| $V_{in} \leq V_{2,4,1}$ (6.75 V) | $f_{2,4,1}$ (= 3) | 0 | 0 |
| $V_{2,4,1} < V_{in} \leq V_{2,4,2}$ (= 7.0 V) | $f_{2,4,2}$ (= 2) | 0 | 1 |
| $V_{2,4,2} < V_{in} \leq V_{2,4,3}$ (= 7.25 V) | $f_{2,4,3}$ (= 1) | 1 | 0 |
| $V_{2,4,3} < V_{in}$ | $f_{2,4,4}$ (= 0) | 1 | 1 |

In a similar way, the full-resolution quantization circuit 951 quantizes the analog signal $V_{in}$ input through the terminal T1 into a multiple-valued signal $F_{3,1}$, which is a quaternary signal, by dividing the analog signal $V_{in}$ with thresholds $V_{3,1,1}$, $V_{3,1,2}$, and $V_{3,1,3}$ satisfying $V_{3,1,1} < V_{3,1,2} < V_{3,1,3}$ ($<V_{3,1}$), as indicated by Table 24 below.

TABLE 24

| Input Value<br>$V_{3,1,1} < V_{3,1,2} < V_{3,1,3} < V_{3,1}$ (= 8.5 V) | Value of<br>$F_{3,1}$ | B3 | |
|---|---|---|---|
| | | b5 | b6 |
| $V_{in} \leq V_{3,1,1}$ (7.75 V) | $f_{3,1,1}$ (= 3) | 0 | 0 |
| $V_{3,1,1} < V_{in} \leq V_{3,1,2}$ (= 8.0 V) | $f_{3,1,2}$ (= 2) | 0 | 1 |
| $V_{3,1,2} < V_{in} \leq V_{3,1,3}$ (= 8.25 V) | $f_{3,1,3}$ (= 1) | 1 | 0 |
| $V_{3,1,3} < V_{in}$ | $f_{3,1,4}$ (= 0) | 1 | 1 |

Also, the full-resolution quantization circuit 952 quantizes the analog signal $V_{in}$ input through the terminal T1 into a multiple-valued signal $F_{3,2}$, which is a quaternary signal, by dividing the analog signal $V_{in}$ with thresholds $V_{3,2,1}$, $V_{3,2,2}$, and $V_{3,2,3}$ satisfying ($V_{3,1}<$) $V_{3,2,1}<V_{3,2,2}<V_{3,2,3}$ ($<V_{3,2}$), as indicated by Table 25 below.

TABLE 25

| Input Value<br>$V_{3,1}$ (= 8.5 V) $< V_{3,2,1} < V_{3,2,2} < V_{3,2,3}$<br>$< V_{3,2}$ (= 9.5 V) | Value of<br>$F_{3,2}$ | B3 | |
|---|---|---|---|
| | | b5 | b6 |
| $V_{in} \leq V_{3,2,1}$ (8.75 V) | $f_{3,2,1}$ (= 3) | 0 | 0 |
| $V_{3,2,1} < V_{in} \leq V_{3,2,2}$ (= 9.0 V) | $f_{3,2,2}$ (= 2) | 0 | 1 |
| $V_{3,2,2} < V_{in} \leq V_{3,2,3}$ (= 9.25 V) | $f_{3,2,3}$ (= 1) | 1 | 0 |
| $V_{3,2,3} < V_{in}$ | $f_{3,2,4}$ (= 0) | 1 | 1 |

Likewise, the full-resolution quantization circuit 953 quantizes the analog signal $V_{in}$ input through the terminal T1 into a multiple-valued signal $F_{3,3}$, which is a quaternary signal, by dividing the analog signal $V_{in}$ with thresholds $V_{3,3,1}$, $V_{3,3,2}$, and $V_{3,3,3}$ satisfying ($V_{3,2}<$) $V_{3,3,1}<V_{3,3,2}<V_{3,3,3}$ ($<V_{3,3}$), as indicated by Table 26 below.

TABLE 26

| Input Value<br>$V_{3,2}$ (= 9.5 V) $< V_{3,3,1} < V_{3,3,2} < V_{3,3,3}$<br>$< V_{3,3}$ (= 10.5 V) | Value of<br>$F_{3,3}$ | B3 | |
|---|---|---|---|
| | | b5 | b6 |
| $V_{in} \leq V_{3,3,1}$ (9.75 V) | $f_{3,3,1}$ (= 3) | 0 | 0 |
| $V_{3,3,1} < V_{in} \leq V_{3,3,2}$ (= 10.0 V) | $f_{3,3,2}$ (= 2) | 0 | 1 |
| $V_{3,3,2} < V_{in} \leq V_{3,3,3}$ (= 10.25 V) | $f_{3,3,3}$ (= 1) | 1 | 0 |
| $V_{3,3,3} < V_{in}$ | $f_{3,3,4}$ (= 0) | 1 | 1 |

Similarly, the full-resolution quantization circuit 954 quantizes the analog signal $V_{in}$ input through the terminal T1 into a multiple-valued signal $F_{3,4}$, which is a quaternary signal, by dividing the analog signal $V_{in}$ with thresholds $V_{3,4,1}$, $V_{3,4,2}$, and $V_{3,4,3}$ satisfying ($V_{3,3}<$) $V_{3,4,1}<V_{3,4,2}<V_{3,4,3}$ ($<V_{3,4}$), as indicated by Table 27 below.

TABLE 27

| Input Value<br>$V_{3,3}$ (= 10.5 V) $< V_{3,4,1} < V_{3,4,2} < V_{3,4,3}$ | Value of<br>$F_{3,4}$ | B3 | |
|---|---|---|---|
| | | b5 | b6 |
| $V_{in} \leq V_{3,4,1}$ (10.75 V) | $f_{3,4,1}$ (= 3) | 0 | 0 |
| $V_{3,4,1} < V_{in} \leq V_{3,4,2}$ (= 11.0 V) | $f_{3,4,2}$ (= 2) | 0 | 1 |
| $V_{3,4,2} < V_{in} \leq V_{3,4,3}$ (= 11.25 V) | $f_{3,4,3}$ (= 1) | 1 | 0 |
| $V_{3,4,3} < V_{in}$ | $f_{3,4,4}$ (= 0) | 1 | 1 |

The full-resolution quantization circuit 961 quantizes the analog signal $V_{in}$ input through the terminal T1 into a multiple-valued signal $F_{4,1}$, which is a quaternary signal, by dividing the analog signal $V_{in}$ with thresholds $V_{4,1,1}$, $V_{4,1,2}$, and $V_{4,1,3}$ satisfying $V_{4,1,1}<V_{4,1,2}<V_{4,1,3}$ ($<V_{4,1}$), as indicated by Table 28 below.

TABLE 28

| Input Value<br>$V_{4,1,1} < V_{4,1,2} < V_{4,1,3} < V_{4,1}$ (= 12.5 V) | Value of<br>$F_{4,1}$ | B3 | |
|---|---|---|---|
| | | b5 | b6 |
| $V_{in} \leq V_{4,1,1}$ (11.75 V) | $f_{4,1,1}$ (= 3) | 0 | 0 |
| $V_{4,1,1} < V_{in} \leq V_{4,1,2}$ (= 12.0 V) | $f_{4,1,2}$ (= 2) | 0 | 1 |
| $V_{4,1,2} < V_{in} \leq V_{4,1,3}$ (= 12.25 V) | $f_{4,1,3}$ (= 1) | 1 | 0 |
| $V_{4,1,3} < V_{in}$ | $f_{4,1,4}$ (= 0) | 1 | 1 |

Similarly, the full-resolution quantization circuit 962 quantizes the analog signal $V_{in}$ input through the terminal T1 into a multiple-valued signal $F_{4,2}$, which is a quaternary signal, by dividing the analog signal $V_{in}$ with thresholds $V_{4,2,1}$, $V_{4,2,2}$, and $V_{4,2,3}$ satisfying ($V_{4,1}<$) $V_{4,2,1}<V_{4,2,2}<V_{4,2,3}$ ($<V_{4,2}$), as indicated by Table 29 below.

TABLE 29

| Input Value<br>$V_{4,1}$ (= 12.5 V) $< V_{4,2,1} < V_{4,2,2} < V_{4,2,3}$<br>$< V_{4,2}$ (= 13.5 V) | Value of<br>$F_{4,2}$ | B3 | |
|---|---|---|---|
| | | b5 | b6 |
| $V_{in} \leq V_{4,2,1}$ (12.75 V) | $f_{4,2,1}$ (= 3) | 0 | 0 |
| $V_{4,2,1} < V_{in} \leq V_{4,2,2}$ (= 13.0 V) | $f_{4,2,2}$ (= 2) | 0 | 1 |
| $V_{4,2,2} < V_{in} \leq V_{4,2,3}$ (= 13.25 V) | $f_{4,2,3}$ (= 1) | 1 | 0 |
| $V_{4,2,3} < V_{in}$ | $f_{4,2,4}$ (= 0) | 1 | 1 |

In like manner, the full-resolution quantization circuit 963 quantizes the analog signal $V_{in}$ input through the terminal T1 into a multiple-valued signal $F_{4,3}$, which is a quaternary signal, by dividing the analog signal $V_{in}$ with thresholds $V_{4,3,1}$, $V_{4,3,2}$, and $V_{4,3,3}$ satisfying ($V_{4,2}<$) $V_{4,3,1}<V_{4,3,2}<V_{4,3,3}$ ($<V_{4,3}$), as indicated by Table 30 below.

TABLE 30

| Input Value<br>$V_{4,2}$ (= 13.5 V) $< V_{4,3,1} < V_{4,3,2} < V_{4,3,3}$<br>$< V_{4,3}$ (= 14.5 V) | Value of<br>$F_{4,3}$ | B3 | |
|---|---|---|---|
| | | b5 | b6 |
| $V_{in} \leq V_{4,3,1}$ (13.75 V) | $f_{4,3,1}$ (= 3) | 0 | 0 |
| $V_{4,3,1} < V_{in} \leq V_{4,3,2}$ (= 14.0 V) | $f_{4,3,2}$ (= 2) | 0 | 1 |
| $V_{4,3,2} < V_{in} \leq V_{4,3,3}$ (= 14.25 V) | $f_{4,3,3}$ (= 1) | 1 | 0 |
| $V_{4,3,3} < V_{in}$ | $f_{4,3,4}$ (= 0) | 1 | 1 |

The full-resolution quantization circuit 964 quantizes the analog signal $V_{in}$ input through the terminal T1 into a multiple-valued signal $F_{4,4}$, which is a quaternary signal, by dividing the analog signal $V_{in}$ with thresholds $V_{4,4,1}$, $V_{4,4,2}$, and $V_{4,4,3}$ satisfying ($V_{4,3}<$) $V_{4,4,1}<V_{4,4,2}<V_{4,4,3}$, as indicated by Table 31 below.

TABLE 31

| Input Value<br>$V_{4,3}$ (= 14.5 V) $< V_{4,4,1} < V_{4,4,2} < V_{4,4,3}$ | Value of<br>$F_{4,4}$ | B3 | |
|---|---|---|---|
| | | b5 | b6 |
| $V_{in} \leq V_{4,4,1}$ (14.75 V) | $f_{4,4,1}$ (= 3) | 0 | 0 |
| $V_{4,4,1} < V_{in} \leq V_{4,4,2}$ (= 15.0 V) | $f_{4,4,2}$ (= 2) | 0 | 1 |
| $V_{4,4,2} < V_{in} \leq V_{4,4,3}$ (= 15.25 V) | $f_{4,4,3}$ (= 1) | 1 | 0 |
| $V_{4,4,3} < V_{in}$ | $f_{4,4,4}$ (= 0) | 1 | 1 |

The signal selection circuit 911 will be described next.

As shown in FIG. 9, this signal selection circuit 911 is controlled by the multiple-valued (quaternary) signal F output from the coarse quantization circuit 901 and the multiple-valued (quaternary) signal F' output from the signal selection circuit 910 to select one of the multiple-valued (quaternary) signals $F_{1,1}$ to $F_{1,4}$, $F_{2,1}$ to $F_{2,4}$, $F_{3,1}$ to $F_{3,4}$, and $F_{4,1}$ to $F_{4,4}$ and output it as a multiple-valued (quaternary) signal F".

That is, the signal selection circuit 911 selects and outputs one of input signals as follows.

Assume that the value of the multiple-valued (quaternary) signal F output from the coarse quantization circuit 901 is $f_1$ (=3) as indicated by Table 1, the multiple-valued (quaternary) signal F' output from the signal selection circuit 910 is the multiple-valued signal $F_1$, and the value of the multiple-valued signal $F_1$ is $f_{1,P}$ (P=1, 2, 3, 4). In this case, the signal selection circuit 911 selects a corresponding one of multiple-valued signals $F_{1,P}$ (P=1, 2, 3, 4) output from the full-resolution quantization circuits 931 to 934, and outputs the selected signal as the multiple-valued signal F", which is a quaternary signal.

Assume that the value of the multiple-valued signal F output from the coarse quantization circuit 901 is $f_2$ (=2) as indicated by Table 1, the multiple-valued signal F' output from the signal selection circuit 910 is the multiple-valued signal $F_2$, and the value of the multiple-valued signal $F_2$ is $f_{2,P}$ (P=1, 2, 3, 4). In this case, the signal selection circuit 911 selects a corresponding one of multiple-valued signals $F_{2,P}$ (P=1, 2, 3, 4) output from the full-resolution quantization circuits 941 to 944, and outputs the selected signal as the multiple-valued signal F", which is a quaternary signal.

Assume that the value of the multiple-valued signal F output from the coarse quantization circuit 901 is $f_3$ (=1) as indicated by Table 1, the multiple-valued signal F' output from the signal selection circuit 910 is the multiple-valued signal $F_3$, and the value of the multiple-valued signal $F_3$ is $f_{3,P}$ (P=1, 2, 3, 4). In this case, the signal selection circuit 911 selects a corresponding one of multiple-valued signals $F_{3,P}$ (P=1, 2, 3, 4) output from the full-resolution quantization circuits 951 to 954, and outputs the selected signal as the multiple-valued signal F", which is a quaternary signal.

Assume that the value of the multiple-valued signal F output from the coarse quantization circuit 901 is $f_4$ (=0) as indicated by Table 1, the multiple-valued signal F' output from the signal selection circuit 910 is the multiple-valued signal $F_4$, and the value of the multiple-valued signal $F_4$ is $f_{4,P}$ (P=1, 2, 3, 4). In this case, the signal selection circuit 911 selects a corresponding one of multiple-valued signals $F_{4,P}$ (P=1, 2, 3, 4) output from the full-resolution quantization circuits 961 to 964, and outputs the selected signal as the multiple-valued signal F", which is a quaternary signal.

Note that the signal selection circuit 911 may be controlled by the binary signal B1 output from the multiple-valued/binary conversion circuit 921 and the binary signal B2 output from the multiple-valued/binary conversion circuit 922 or the multiple-valued signal F' output from the signal selection circuit 910, unlike in the third embodiment. In addition, the signal selection circuit 911 may be controlled by the multiple-valued signal F output from the coarse quantization circuit 901 and the binary signal B2 output from the multiple-valued/binary conversion circuit 922.

The multiple-valued/binary conversion circuit 923 will be described next.

The multiple-valued/binary conversion circuit 923 in the third embodiment converts the negative output F'" output from the signal selection circuit 911 into a binary signal B3 as the remaining bits of the binary code B.

As indicated by Tables 16 to 31, a two-bit value "00" is generated as the binary signal B3 if the value of a multiple-valued (quaternary) signal $F_{P,P'}$ (P=1, 2, 3, 4; P'=1, 2, 3, 4) is $f_{P,P',1}$ (=3); "01", if the value is $f_{P,P',2}$ (=2); "10", if the value is $f_{P,P',3}$ (=1); and "11", if the value is for $f_{P,P',4}$ (=0). Of the two bits of each signal, the upper and lower bits are respectively output to the bit terminals b5 and b6.

In the analog-to-digital conversion device according to the third embodiment, therefore, the binary code B obtained by converting the analog signal $V_{in}$ into a digital signal is obtained as six bits at the six bit terminals b1 to b6. That is, according to the third embodiment, the analog signal $V_{in}$ can be digitally converted into the 6-bit binary code B, which is higher in precision than the binary code in the first embodiment.

The analog-to-digital conversion device according to the third embodiment uses only one coarse quantization circuit, five fine quantization circuits, 16 full-resolution quantization circuits, two signal selection circuits, and three multiple-valued/binary conversion circuits, as shown in FIG. 9. The number of elements required to build the analog-to-digital conversion device according to the third embodiment is much smaller than that for the conventional analog-to-digital conversion device.

According to the third embodiment, therefore, when this device and other devices are integrated into a monolithic unit, the area occupied by the analog-to-digital conversion device can be reduced as compared with the prior art. Again, according to the third embodiment, a compact analog-to-digital conversion device can be formed.

Furthermore, since the number of elements is decreased, the analog-to-digital conversion device of the third embodiment can reduce the power consumption and operate at high speed as compared with the conventional device.

Fourth Embodiment

Figure 10:
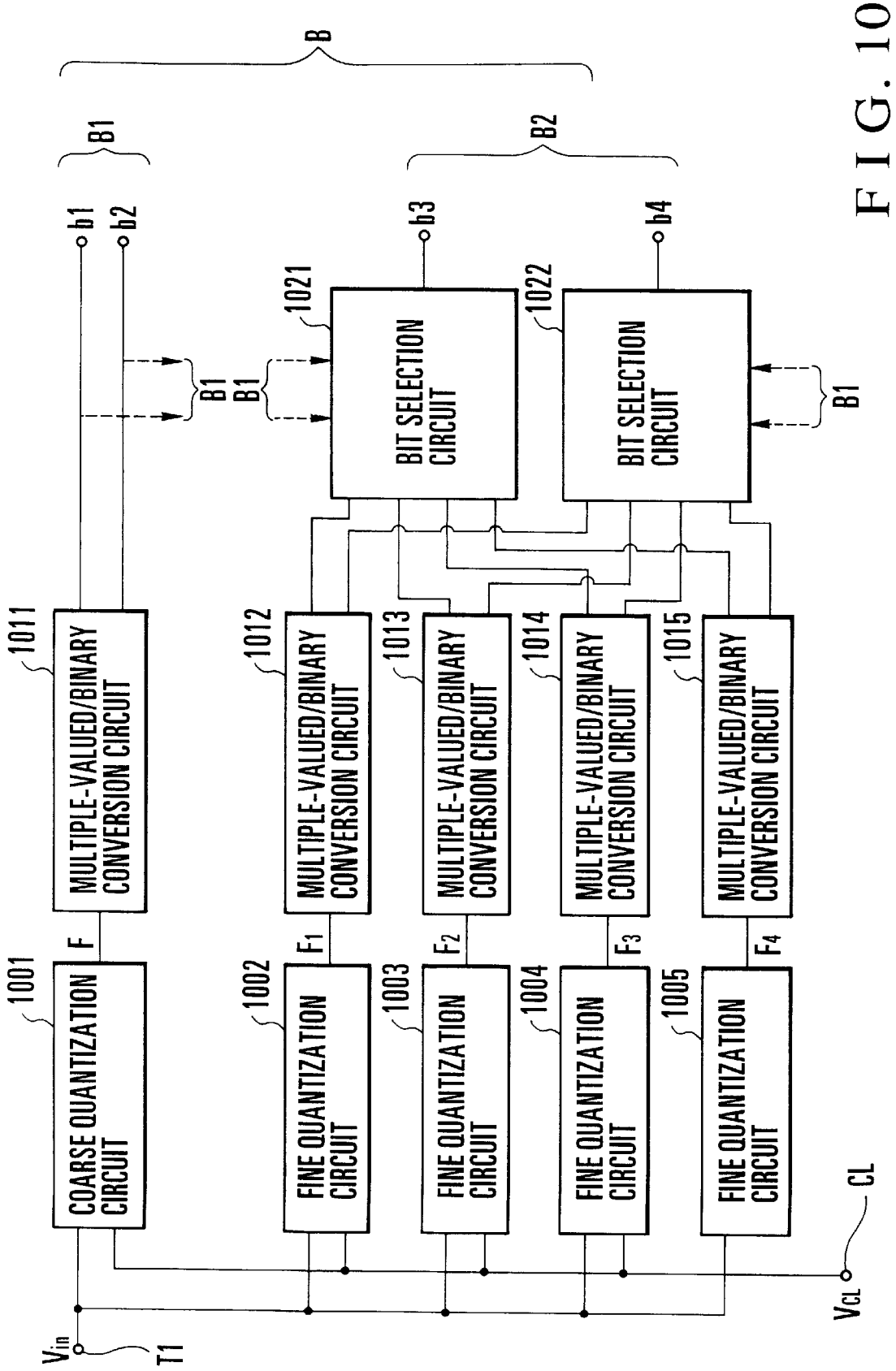
FIG. 10 is a block diagram showing the arrangement of an analog-to-digital conversion device according to the fourth embodiment of the present invention.

The fourth embodiment of the present invention will be described below. As shown in FIG. 10, the fourth embodiment includes a coarse quantization circuit 1001, fine quantization circuits 1002 to 1005, and multiple-valued (quaternary)/binary conversion circuits 1011 to 1015. Outputs from the multiple-valued/binary conversion circuit 1011 are used as upper two bits, and outputs from the multiple-valued/binary conversion circuits 1012 to 1015 are selected by bit selection circuits 1021 and 1022 to be used as lower two bits, thereby outputting a 4-bit binary code B.

The coarse quantization circuit 1001 and the fine quantization circuits 1002 to 1005 are identical to the coarse quantization circuit 101 and the fine quantization circuits 102 to 105 in the first embodiment. Each of the multiple-valued/binary conversion circuits 1011 to 1015 is identical to the multiple-valued/binary conversion circuit 121 in the first embodiment.

The bit selection circuits 1021 and 1022 will be described below.

The bit selection circuit 1021 is controlled by a signal B1 as upper two bits output from the multiple-valued/binary conversion circuit 1011.

More specifically, if the signal B1 is "00", the bit selection circuit 1021 selects and outputs the upper bit of the two bits output from the multiple-valued/binary conversion circuit 1012.

If the signal B1 is "01", the bit selection circuit 1021 selects and outputs the upper bit of the two bits output from the multiple-valued/binary conversion circuit 1013.

If the signal B1 is "10", the bit selection circuit 1021 selects and outputs the upper bit of the two bits output from the multiple-valued/binary conversion circuit 1014.

If the signal B1 is "11", the bit selection circuit 1021 selects and outputs the upper bit of the two bits output from the multiple-valued/binary conversion circuit 1015.

Similarly, the bit selection circuit 1022 is controlled by the signal B1 as the upper two bits output from the multiple-valued/binary conversion circuit 1011.

More specifically, if the signal B1 is "00", the bit selection circuit 1022 selects and outputs the lower bit of the two bits output from the multiple-valued/binary conversion circuit 1012.

If the signal B1 is "01", the bit selection circuit 1022 selects and outputs the lower bit of the two bits output from the multiple-valued/binary conversion circuit 1013.

If the signal B1 is "10", the bit selection circuit 1022 selects and outputs the lower bit of the two bits output from the multiple-valued/binary conversion circuit 1014.

If the signal B1 is "11", the bit selection circuit 1022 selects and outputs the lower bit of the two bits output from the multiple-valued/binary conversion circuit 1015.

The analog-to-digital conversion device of the fourth embodiment converts an input analog signal $V_{in}$ into the 4-bit binary code B, and outputs it in the same manner as the analog-to-digital conversion device of the first embodiment.

The analog-to-digital conversion device according to the present invention in FIG. 10 uses only one coarse quantization circuit, four fine quantization circuits, two signal selection circuits, and five multiple-valued/binary conversion circuits. The number of elements required to construct the analog-to-digital conversion device according to the fourth embodiment is much smaller than that for the conventional analog-to-digital conversion device.

According to the fourth embodiment as well, therefore, when this device and other devices are integrated into a monolithic unit, the area occupied by the analog-to-digital conversion device can be reduced as compared with the prior art. According to the fourth embodiment, a compact analog-to-digital conversion device can be formed.

Furthermore, since the number of elements is decreased, the analog-to-digital conversion device of the fourth embodiment can reduce the power consumption and operate at high speed as compared with the conventional device.

Fifth Embodiment

The fifth embodiment of the present invention will be described below. An analog-to-digital conversion device according to the fifth embodiment includes a plurality of multiple-valued quantization circuits, each serving to quantize an input continuous analog signal into a ternary signal or three-valued and output it, and a plurality of binarization circuits, each binarizing between the central value and the remaining values of the three values.

Figure 11:
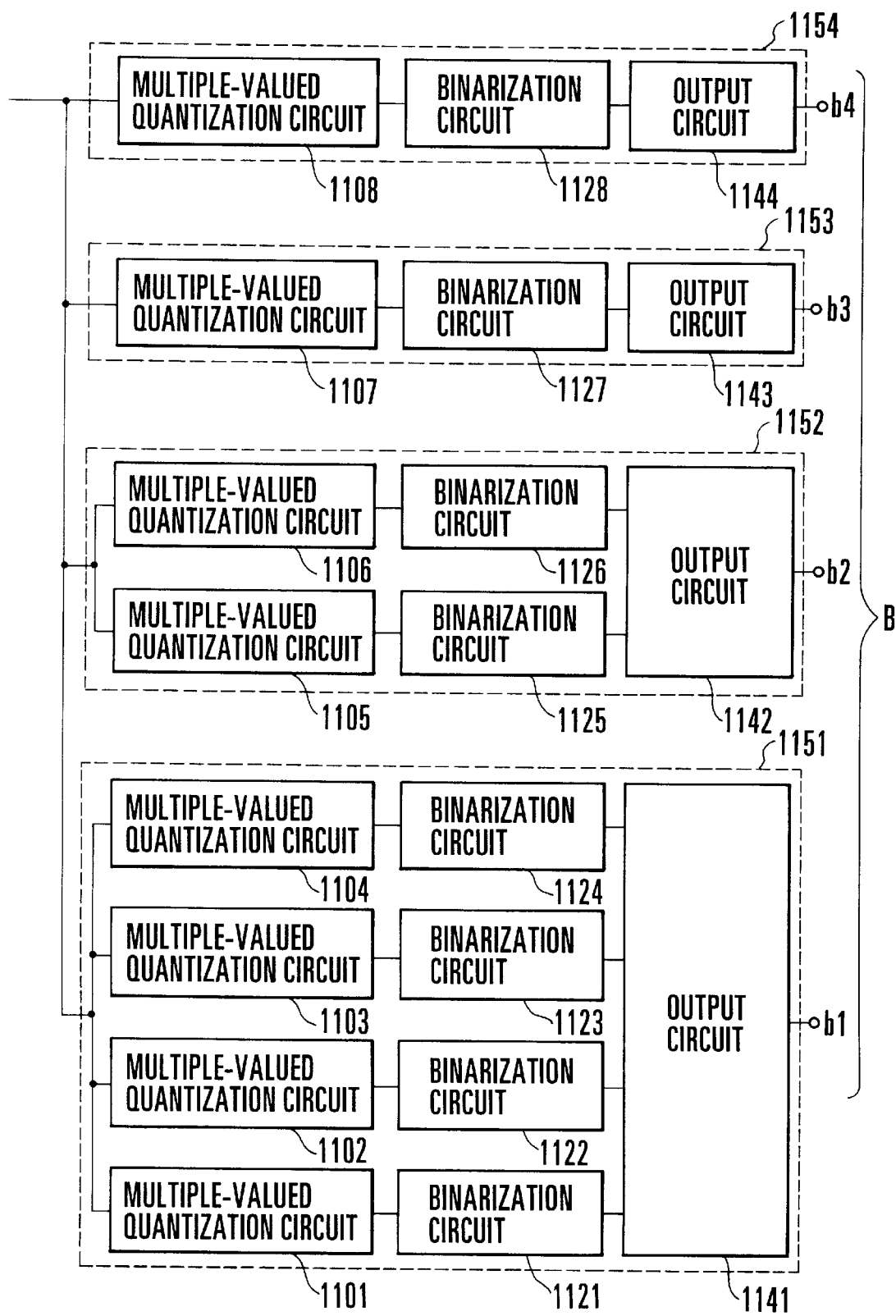
FIG. 11 is a block diagram showing the arrangement of an analog-to-digital conversion device according to the fifth embodiment of the present invention.

As shown in FIG. 11, the analog-to-digital conversion device of the fifth embodiment includes multiple-valued quantization circuits 1101 to 1108 and binarization circuits 1121 to 1128 for binarizing outputs from the circuits 1101 to 1108. Although not shown, the multiple-valued quantization circuits 1101 to 1108 operate in synchronism with the same clock signal.

This device also includes an output circuit 1141 for outputting the OR of outputs from the binarization circuits 1121 to 1124 to a terminal b1. A first bit forming circuit 1151 is constituted by the multiple-valued quantization circuits 1101 to 1104, the binarization circuits 1121 to 1124, and the output circuit 1141.

In addition, this device includes an output circuit 1142 for outputting the OR of outputs from the binarization circuits 1125 and 1126 to a terminal b2. A second bit forming circuit 1152 is constituted by the multiple-valued quantization circuits 1105 and 1106, the binarization circuits 1125 and 1126, and the output circuit 1142.

Furthermore, this device includes an output circuit 1143 for outputting an output from the binarization circuit 1127 to a terminal b3, and an output circuit 1144 for outputting an output from the binarization circuit 1128 to a terminal b4. A third bit forming circuit 1153 is constituted by the multiple-valued quantization circuit 1107, the binarization circuit 1127, and the output circuit 1143. A fourth bit forming circuit 1154 is constituted by the multiple-valued quantization circuit 1108, the binarization circuit 1128, and the output circuit 1144.

The multiple-valued quantization circuits 1101 to 1108 will be described in detail first.

For example, as shown in FIG. 12, each of the multiple-valued quantization circuits 1101 to 1108 can be constituted by a series circuit of resonant-tunneling diodes 1201, 1202, 1211, and 1212 exhibiting negative differentiation resistance characteristics. These resonant-tunneling diodes 1201, 1202, 1211, and 1212 exhibit different peak current values in the current/voltage characteristics between the two terminals of each diode. A field-effect transistor 1221 is connected in parallel with the resonant-tunneling diodes 1211 and 1212. If, for example, a high electron mobility transistor (HEMT) is used as the field-effect transistor 1221, high-speed operation can be expected. A clock signal is input through one end of the resonant-tunneling diode 1201, and an analog signal $V_{in}$ is input through the gate (input terminal) of the field-effect transistor 1221. As a result, a quantized multiple-valued signal is output from the node of the resonant-tunneling diodes 1202 and 1211.

Each of the multiple-valued quantization circuits 1101 to 1108 outputs a high-voltage value VU, a low-voltage value VL, and a middle value VM between the values VU and VL.

These resonant-tunneling diodes are almost identical to the resonant-tunneling diodes 201 to 203 and 211 to 213 described with reference to FIGS. 1-A and 2-A to 2-D. Although the diodes in the first embodiment are used for quaternary quantization, the diodes in the fifth embodiment are used for ternary quantization.

Each of the multiple-valued quantization circuits 1101 to 1108 has two of the following thresholds: VT1<VT2<VT3<VT4<VT5<VT6<VT7<VT8<VT9<VT10<VT11<VT12<VT13<VT14<VT15<VT16.

The multiple-valued quantization circuit 1101 has VT1 and VT3; it outputs the value VL for $V_{in} \leq VT1$, the value VM for $VT1 < V_{in} \leq VT3$, and the value VU for $VT3 < V_{in}$.

The multiple-valued quantization circuit 1102 has VT5 and VT7; it outputs the value VL for $V_{in} \leq VT5$, the value VM for $VT5 < V_{in} \leq VT7$, and the value VU for $VT7 < V_{in}$.

The multiple-valued quantization circuit 1103 has VT9 and VT11; it outputs the value VL for $V_{in} \leq VT9$, the value VM for $VT9 < V_{in} \leq VT11$, and the value VU for $VT11 < V_{in}$.

The multiple-valued quantization circuit 1104 has VT13 and VT15; it outputs the value VL for $V_{in} \leq VT13$, the value VM for $VT13 < V_{in} \leq VT15$, and the value VU for $VT15 < V_{in}$.

The multiple-valued quantization circuit 1105 has VT2 and VT6; it outputs the value VL for $V_{in} \leq VT2$, the value VM for $VT2 < V_{in} \leq VT6$, and the value VU for $VT6 < V_{in}$.

The multiple-valued quantization circuit 1106 has VT10 and VT14; it outputs the value VL for $V_{in} \leq VT10$, the value VM for $VT10 < V_{in} \leq VT14$, and the value VU for $VT14 < V_{in}$.

The multiple-valued quantization circuit 1107 has VT4 and VT12; it outputs the value VL for $V_{in} \leq VT4$, the value VM for $VT4 < V_{in} \leq VT12$, and the value VU for $VT12 < V_{in}$.

The multiple-valued quantization circuit 1108 has VT8 and VT16; it outputs the value VL for $V_{in} \leq VT8$, the value VM for $VT8 < V_{in} \leq VT16$, and the value VU for $VT16 < V_{in}$.

The binarization circuits 1121 to 1128 will be described next.

For example, each of the binarization circuits 1121 to 1128 can have an arrangement like the one shown in FIG.

13. This circuit is made up of field-effect transistors Q1 to Q8 and resistors R1 and R2. The drains of the transistors Q1 and Q4 are connected to a power supply terminal E1 through the resistor R1. Similarly, the drains of the transistors Q2 and Q3 are connected to the power supply terminal E1 through the resistor R2.

The transistor Q3 is controlled by an input ternary signal. A source follower circuit is formed by the transistors Q7 and Q8. The transistors Q1 and Q3 are controlled by an output voltage from this circuit. The drain of the transistor Q7 is connected to the power supply terminal E1.

The field-effect transistors Q5 and Q8 are controlled by a control signal VC. The source of the field-effect transistor Q5 is connected to a power supply terminal E2.

The field-effect transistor Q2 is controlled by a reference voltage VR2, which is an intermediate voltage value between the values VM and VL of the ternary signal input to each of the binarization circuits 1121 to 1128. The field-effect transistor Q4 is controlled by a reference voltage VR1, which is an intermediate voltage value between the values VU and VM of an input ternary signal.

The binary signal obtained by each of the binarization circuits 1121 to 1128 is output from the drains of the transistors Q2 and Q3.

When the voltage value output from the source follow circuit constituted by the transistors Q7 and Q8 is represented by Vm, if Vm>VR2, a current can flow through the resistor R1. If Vm>VR2 does not hold, a current can flow through the resistor R2. If Vm>VR1, a current can flow through the resistor R2. If Vm>VR1 does not hold, a current can flow through the resistor R1. That is, a current can flow through the resistor R2 only when VR1<Vm<VR2.

The voltage Vm output from the source follow circuit formed by the transistors Q7 and Q8 corresponds to the ternary value (VU, VM, VL) input to the transistor Q7. For this reason, the voltage of the signal output from each of the binarization circuits 1121 to 1128 exhibits the characteristics shown in FIG. 14. That is, the input ternary signal is binarized, and the binary signal is output.

According to the analog-to-digital conversion device of the fifth embodiment described above, the analog signal voltage $V_{in}$ applied to an input terminal T1 is quantized as indicated by Tables 32 to 35 below, and the resultant signal is output as a bit signal. Table 32 shows data about the fourth bit forming circuit 1154. Table 33 shows data about the third bit forming circuit 1153. Table 34 shows data about the second bit forming circuit 1152. Table 35 shows data about first bit forming circuit 1151. The 4-digit numbers in Tables 32 to 35 correspond to reference numerals in FIG. 11.

For example, in Table 32, when the input analog signal $V_{in}$ satisfies VT14<$V_{in}$≦VT15, the value VM is output first from the multiple-valued quantization circuit 1108 in the fourth bit forming circuit 1154. Then, "1" is output from the binarization circuit 1128, and "1" is output as a bit signal from the output circuit 1144.

TABLE 32

| | Voltage Value of Analog Signal $V_{in}$ | Ternary Signal 1108 | Binary Signal 1128 | Bit Signal 1144 |
|---|---|---|---|---|
| 16 | VT15 < $V_{in}$ ≦ VT16 | VM | 1 | 1 |
| 15 | VT14 < $V_{in}$ ≦ VT15 | VM | 1 | 1 |
| 14 | VT13 < $V_{in}$ ≦ VT14 | VM | 1 | 1 |
| 13 | VT12 < $V_{in}$ ≦ VT13 | VM | 1 | 1 |
| 12 | VT11 < $V_{in}$ ≦ VT12 | VM | 1 | 1 |
| 11 | VT10 < $V_{in}$ ≦ VT11 | VM | 1 | 1 |

TABLE 32-continued

| | Voltage Value of Analog Signal $V_{in}$ | Ternary Signal 1108 | Binary Signal 1128 | Bit Signal 1144 |
|---|---|---|---|---|
| 10 | VT9 < $V_{in}$ ≦ VT10 | VM | 1 | 1 |
| 9 | VT8 < $V_{in}$ ≦ VT9 | VM | 1 | 1 |
| 8 | VT7 < $V_{in}$ ≦ VT8 | VL | 0 | 0 |
| 7 | VT6 < $V_{in}$ ≦ VT7 | VL | 0 | 0 |
| 6 | VT5 < $V_{in}$ ≦ VT6 | VL | 0 | 0 |
| 5 | VT4 < $V_{in}$ ≦ VT5 | VL | 0 | 0 |
| 4 | VT3 < $V_{in}$ ≦ VT4 | VL | 0 | 0 |
| 3 | VT2 < $V_{in}$ ≦ VT3 | VL | 0 | 0 |
| 2 | VT1 < $V_{in}$ ≦ VT2 | VL | 0 | 0 |
| 1 | $V_{in}$ ≦ VT1 | VL | 0 | 0 |

TABLE 33

| | Voltage Value of Analog Signal $V_{in}$ | Ternary Signal 1107 | Binary Signal 1127 | Bit Signal 1143 |
|---|---|---|---|---|
| 16 | VT15 < $V_{in}$ ≦ VT16 | VU | 0 | 0 |
| 15 | VT14 < $V_{in}$ ≦ VT15 | VU | 0 | 0 |
| 14 | VT13 < $V_{in}$ ≦ VT14 | VU | 0 | 0 |
| 13 | VT12 < $V_{in}$ ≦ VT13 | VU | 0 | 0 |
| 12 | VT11 < $V_{in}$ ≦ VT12 | VM | 1 | 1 |
| 11 | VT10 < $V_{in}$ ≦ VT11 | VM | 1 | 1 |
| 10 | VT9 < $V_{in}$ ≦ VT10 | VM | 1 | 1 |
| 9 | VT8 < $V_{in}$ ≦ VT9 | VM | 1 | 1 |
| 8 | VT7 < $V_{in}$ ≦ VT8 | VM | 1 | 1 |
| 7 | VT6 < $V_{in}$ ≦ VT7 | VM | 1 | 1 |
| 6 | VT5 < $V_{in}$ ≦ VT6 | VM | 1 | 1 |
| 5 | VT4 < $V_{in}$ ≦ VT5 | VM | 1 | 1 |
| 4 | VT3 < $V_{in}$ ≦ VT4 | VL | 0 | 0 |
| 3 | VT2 < $V_{in}$ ≦ VT3 | VL | 0 | 0 |
| 2 | VT1 < $V_{in}$ ≦ VT2 | VL | 0 | 0 |
| 1 | $V_{in}$ ≦ VT1 | VL | 0 | 0 |

TABLE 34

| | Voltage Value of Analog Signal $V_{in}$ | Ternary Signal 1106 | Binary Signal 1126 | Ternary Signal 1105 | Binary Signal 1125 | Bit Signal 1142 |
|---|---|---|---|---|---|---|
| 16 | VT15 < $V_{in}$ ≦ VT16 | VU | 0 | VU | 0 | 0 |
| 15 | VT14 < $V_{in}$ ≦ VT15 | VU | 0 | VU | 0 | 0 |
| 14 | VT13 < $V_{in}$ ≦ VT14 | VM | 1 | VU | 0 | 1 |
| 13 | VT12 < $V_{in}$ ≦ VT13 | VM | 1 | VU | 0 | 1 |
| 12 | VT11 < $V_{in}$ ≦ VT12 | VM | 1 | VU | 0 | 1 |
| 11 | VT10 < $V_{in}$ ≦ VT11 | VM | 1 | VU | 0 | 1 |
| 10 | VT9 < $V_{in}$ ≦ VT10 | VL | 0 | VU | 0 | 0 |
| 9 | VT8 < $V_{in}$ ≦ VT9 | VL | 0 | VU | 0 | 0 |
| 8 | VT7 < $V_{in}$ ≦ VT8 | VL | 0 | VU | 0 | 0 |
| 7 | VT6 < $V_{in}$ ≦ VT7 | VL | 0 | VU | 0 | 0 |
| 6 | VT5 < $V_{in}$ ≦ VT6 | VL | 0 | VM | 1 | 1 |
| 5 | VT4 < $V_{in}$ ≦ VT5 | VL | 0 | VM | 1 | 1 |
| 4 | VT3 < $V_{in}$ ≦ VT4 | VL | 0 | VM | 1 | 1 |
| 3 | VT2 < $V_{in}$ ≦ VT3 | VL | 0 | VM | 1 | 1 |
| 2 | VT1 < $V_{in}$ ≦ VT2 | VL | 0 | VL | 0 | 0 |
| 1 | $V_{in}$ ≦ VT1 | VL | 0 | VL | 0 | 0 |

TABLE 35

| Voltage Value of Analog Signal $V_{in}$ | Ternary Signal 1104 | Binary Signal 1124 | Ternary Signal 1103 | Binary Signal 1123 | Ternary Signal 1102 | Binary Signal 1122 | Ternary Signal 1101 | Binary Signal 1121 | Bit Signal 1141 |
|---|---|---|---|---|---|---|---|---|---|
| 16 VT15 < $V_{in}$ ≦ VT16 | VU | 0 | VU | 0 | VU | 0 | VU | 0 | 0 |
| 15 VT14 < $V_{in}$ ≦ VT15 | VM | 1 | VU | 0 | VU | 0 | VU | 0 | 1 |
| 14 VT13 < $V_{in}$ ≦ VT14 | VM | 1 | VU | 0 | VU | 0 | VU | 0 | 1 |
| 13 VT12 < $V_{in}$ ≦ VT13 | VL | 0 | VU | 0 | VU | 0 | VU | 0 | 0 |
| 12 VT11 < $V_{in}$ ≦ VT12 | VL | 0 | VU | 0 | VU | 0 | VU | 0 | 0 |
| 11 VT10 < $V_{in}$ ≦ VT11 | VL | 0 | VM | 1 | VU | 0 | VU | 0 | 1 |
| 10 VT9 < $V_{in}$ ≦ VT10 | VL | 0 | VM | 1 | VU | 0 | VU | 0 | 1 |
| 9 VT8 < $V_{in}$ ≦ VT9 | VL | 0 | VL | 0 | VU | 0 | VU | 0 | 0 |
| 8 VT7 < $V_{in}$ ≦ VT8 | VL | 0 | VL | 0 | VU | 0 | VU | 0 | 0 |
| 7 VT6 < $V_{in}$ ≦ VT7 | VL | 0 | VL | 0 | VM | 1 | VU | 0 | 1 |
| 6 VT5 < $V_{in}$ ≦ VT6 | VL | 0 | VL | 0 | VM | 1 | VU | 0 | 1 |
| 5 VT4 < $V_{in}$ ≦ VT5 | VL | 0 | VL | 0 | VL | 0 | VU | 0 | 0 |
| 4 VT3 < $V_{in}$ ≦ VT4 | VL | 0 | VL | 0 | VL | 0 | VU | 0 | 0 |
| 3 VT2 < $V_{in}$ ≦ VT3 | VL | 0 | VL | 0 | VL | 0 | VM | 1 | 1 |
| 2 VT1 < $V_{in}$ ≦ VT2 | VL | 0 | VL | 0 | VL | 0 | VM | 1 | 1 |
| 1 $V_{in}$ ≦ VT1 | VL | 0 | VL | 0 | VL | 0 | VL | 0 | 0 |

Table 36 provides a summary of the above data. If, for example, the analog signal $V_{in}$ input to this analog-to-digital conversion device satisfies VT14<$V_{in}$≦VT15, the binary code "1001" is output. Note that analog-to-digital conversion in the fifth embodiment is called Gray code conversion.

TABLE 36

| Voltage Value of Analog Signal $V_{in}$ | Binary Code B | | | |
|---|---|---|---|---|
| | Bit Signal b4 | Bit signal b3 | Bit signal b2 | Bit signal b1 |
| 16 VT15 < $V_{in}$ ≦ VT16 | 1 | 0 | 0 | 0 |
| 15 VT14 < $V_{in}$ ≦ VT15 | 1 | 0 | 0 | 1 |
| 14 VT13 < $V_{in}$ ≦ VT14 | 1 | 0 | 1 | 1 |
| 13 VT12 < $V_{in}$ ≦ VT13 | 1 | 0 | 1 | 0 |
| 12 VT11 < $V_{in}$ ≦ VT12 | 1 | 1 | 1 | 0 |
| 11 VT10 < $V_{in}$ ≦ VT11 | 1 | 1 | 1 | 1 |
| 10 VT9 < $V_{in}$ ≦ VT10 | 1 | 1 | 0 | 1 |
| 9 VT8 < $V_{in}$ ≦ VT9 | 1 | 1 | 0 | 0 |
| 8 VT7 < $V_{in}$ ≦ VT8 | 0 | 1 | 0 | 0 |
| 7 VT6 < $V_{in}$ ≦ VT7 | 0 | 1 | 0 | 1 |
| 6 VT5 < $V_{in}$ ≦ VT6 | 0 | 1 | 1 | 1 |
| 5 VT4 < $V_{in}$ ≦ VT5 | 0 | 1 | 1 | 0 |
| 4 VT3 < $V_{in}$ ≦ VT4 | 0 | 0 | 1 | 0 |
| 3 VT2 < $V_{in}$ ≦ VT3 | 0 | 0 | 1 | 1 |
| 2 VT1 < $V_{in}$ ≦ VT2 | 0 | 0 | 0 | 1 |
| 1 $V_{in}$ ≦ VT1 | 0 | 0 | 0 | 0 |

As described above, according to the analog-to-digital conversion device of the fifth embodiment, the analog signal $V_{in}$ can be digitally converted into the 4-bit binary code B, and the binary code B can be output.

As shown in FIG. 11, the analog-to-digital conversion device according to the fifth embodiment substantially uses only eight multiple-valued quantization circuits, eight binarization circuits, and two output circuits (1141, 1142). The number of elements required to construct the analog-to-digital conversion device according to the fifth embodiment is much smaller than that for the conventional analog-to-digital conversion device in FIG. 20.

According to the fifth embodiment, therefore, when this device and other devices are integrated into a monolithic unit, the area occupied by the analog-to-digital conversion device can be reduced as compared with the prior art. Again, according to the fifth embodiment, a more compact analog-to-digital conversion device can be formed.

Furthermore, since the number of elements is decreased, the analog-to-digital conversion device of the fifth embodiment can reduce the power consumption and operate at high speed as compared with the conventional device.

In the fifth embodiment, as ternary quantization is performed as multiple-valued quantization, high-frequency operation can performed more easily than in the first to fourth embodiments. In addition, in the fifth embodiment, as is obvious from FIG. 11, the signal lines for connecting the circuits forming the respective bits constituting a digital signal to be output are only required to serve as input lines. Therefore, multiple-valued quantization circuits and binarization circuits can be wired in units of bits. For this reason, according to the analog-to-digital conversion device of the fifth embodiment, the overall interconnection length can be reduced as compared with the first to fourth embodiments described above. This shortens the interconnection delay times and facilitates circuit design. In addition, the thresholds for digitization (VT1<VT2<VT3<VT4<VT5<VT6<VT7<VT8<VT9<VT10<VT11<VT12<VT13<VT14<VT15) are set in only the multiple-valued quantization circuits, and all the binarization circuit can have the same characteristics. This also facilitates circuit design.

If the universal literal gate 401 (FIG. 4-A) having the resonant-tunneling diode 411 in FIG. 4-B with the input/output characteristics shown in FIG. 5-C is used, a Gray code can be output. If the binarization circuit shown in FIG. 13 is used in place of the universal literal gate 401, a Gray code can be output.

In the fifth embodiment, a 4-bit signal is output as a binary code. The present invention is not limited to this.

Sixth Embodiment

The sixth embodiment of the present invention will be described below. The sixth embodiment is a modification of the analog-to-digital conversion device of the fifth embodiment and designed to output a 3-bit signal as a binary code.

Figure 15:
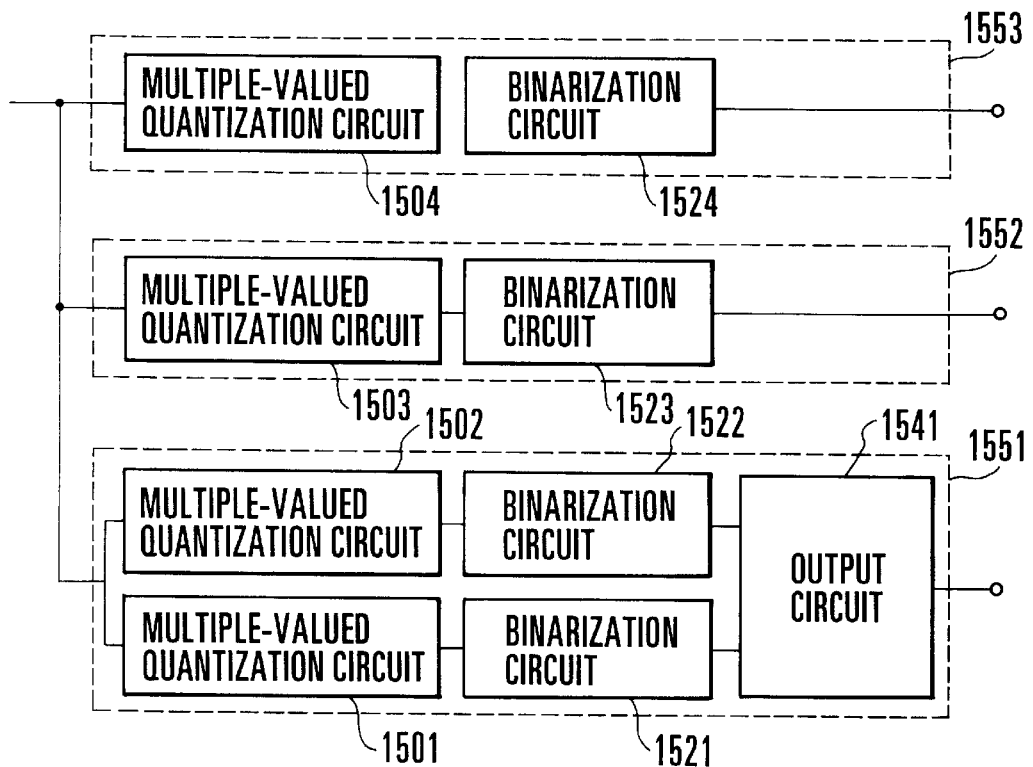
FIG. 15 is a block diagram showing the arrangement of an analog-to-digital conversion device according to the sixth embodiment of the present invention.

As shown in FIG. 15, this embodiment includes multiple-valued quantization circuits 1501 to 1504 and binarization circuits 1521 to 1524 for binarizing outputs from the circuits 1501 to 1504. The multiple-valued quantization circuits 1501 to 1504 are identical to those in the fifth embodiment. Although not shown, the multiple-valued quantization circuits 1501 to 1504 operate in synchronism with the same clock signal. The embodiment also includes an output circuit 1541 for outputting the OR of outputs from the binarization circuits 1521 and 1522 to a terminal b1.

A first bit forming circuit 1551 is constituted by the multiple-valued quantization circuits 1501 and 1502, the binarization circuits 1521 and 1522, and the output circuit 1541.

A second bit forming circuit 1553 is constituted by the multiple-valued quantization circuit 1503 and the binarization circuit 1523.

Similarly, a third bit forming circuit 1554 is constitute by the multiple-valued quantization circuit 1504 and the binarization circuit 1524.

In the sixth embodiment, each of the multiple-valued quantization circuits 1501 to 1504 has two of the following thresholds: VT1<VT2<VT3<VT4<VT5<VT6<VT7<VT8.

The multiple-valued quantization circuit 1501 has VT1 and VT3; it outputs a value VL for $V_{in} \leq$ VT1, a value VM for VT1<$V_{in} \leq$ VT3, and a value VU for VT3<$V_{in}$.

The multiple-valued quantization circuit 1502 has VT5 and VT7; it outputs a value VL for $V_{in} \leq$ VT5, a value VM for VT5<$V_{in} \leq$ VT7, and a value VU for VT7<$V_{in}$.

The multiple-valued quantization circuit 1503 has VT2 and VT6; it outputs a value VL for $V_{in} \leq$ VT2, a value VM for VT2<$V_{in} \leq$ VT6, and a value VU for VT6<$V_{in}$.

The multiple-valued quantization circuit 1504 has VT4 and VT8; it outputs a value VL for $V_{in} \leq$ VT4, a value VM for VT4<$V_{in} \leq$ VT8, and a value VU for VT8<$V_{in}$.

According to the analog-to-digital conversion device of the sixth embodiment, therefore, the input analog signal $V_{in}$ is converted into a 3-bit binary code B, as indicated by Table 37.

TABLE 37

| Voltage Value of Analog Signal $V_{in}$ | | Binary Code B | |
|---|---|---|---|
| | Bit signal b3 | Bit signal b2 | Bit signal b1 |
| 8 VT7 < $V_{in}$ ≦ VT8 | 1 | 0 | 0 |
| 7 VT6 < $V_{in}$ ≦ VT7 | 1 | 0 | 1 |
| 6 VT5 < $V_{in}$ ≦ VT6 | 1 | 1 | 1 |
| 5 VT4 < $V_{in}$ ≦ VT5 | 1 | 1 | 0 |
| 4 VT3 < $V_{in}$ ≦ VT4 | 0 | 1 | 1 |
| 3 VT2 < $V_{in}$ ≦ VT3 | 0 | 1 | 0 |
| 2 VT1 < $V_{in}$ ≦ VT2 | 0 | 0 | 1 |
| 1 $V_{in}$ ≦ VT1 | 0 | 0 | 0 |

Seventh Embodiment

The seventh embodiment of the present invention will be described below. The seventh embodiment is a modification of the analog-to-digital conversion devices of the fifth and sixth embodiments and designed to output a 2-bit signal as a binary code.

Figure 16:
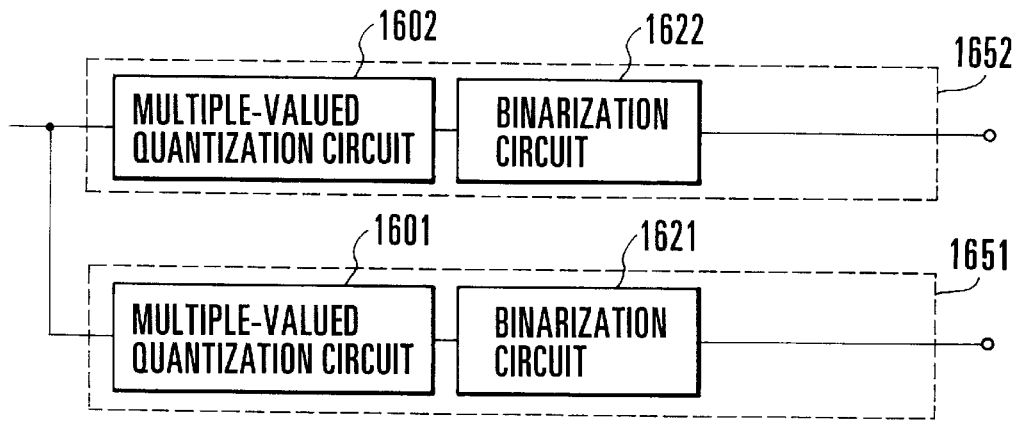
FIG. 16 is a block diagram showing the arrangement of an analog-to-digital conversion device according to the seventh embodiment of the present invention.

As shown in FIG. 16, this embodiment includes multiple-valued quantization circuits 1601 and 1602 and binarization circuits 1621 and 1622 for binarizing outputs from the circuits 1601 and 1602. The multiple-valued quantization circuits 1621 and 1622 are identical to those in the fifth embodiment. Although not shown, the multiple-valued quantization circuits 1601 and 1602 operate in synchronism with the same clock signal.

A first bit forming circuit 1651 is constituted by the multiple-valued quantization circuit 1601 and the binarization circuit 1621. A second bit forming circuit 1652 is constituted by the multiple-valued quantization circuit 1602 and the binarization circuit 1622.

In the seventh embodiment, each of the multiple-valued quantization circuits 1601 and 1602 has two of the following thresholds: VT1<VT2<VT3<VT4.

The multiple-valued quantization circuit 1601 has VT1 and VT3; it outputs a value VL for $V_{in} \leq$ VT1, a value VM for VT1<$V_{in} \leq$ VT3, and a value VU for VT3<$V_{in}$.

The multiple-valued quantization circuit 1602 has VT2 and VT4; it outputs a value VL for $V_{in} \leq$ VT2, a value VM for VT2<$V_{in} \leq$ VT4, and a value VU for VT4<$V_{in}$.

According to the analog-to-digital conversion device of the seventh embodiment, therefore, the input analog signal $V_{in}$ is converted into a 2-bit binary code B, as indicated by Table 38.

TABLE 38

| Voltage Value of Analog Signal $V_{in}$ | | Binary Code B | |
|---|---|---|---|
| | | Bit signal b2 | Bit signal b1 |
| 4 | VT3 < $V_{in}$ ≦ VT4 | 1 | 1 |
| 3 | VT2 < $V_{in}$ ≦ VT3 | 1 | 0 |
| 2 | VT1 < $V_{in}$ ≦ VT2 | 0 | 1 |
| 1 | $V_{in}$ ≦ VT1 | 0 | 0 |

Eighth Embodiment

The eighth embodiment of the present invention will be described below. The eighth embodiment is a modification of the analog-to-digital conversion devices of the fifth to seventh embodiments described above and designed to output a 1-bit signal as a binary code.

Figure 17:
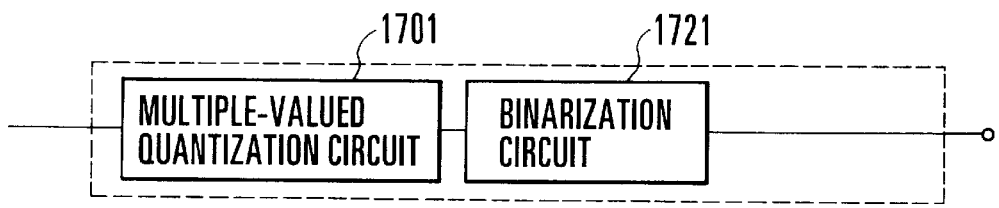
FIG. 17 is a block diagram showing the arrangement of an analog-to-digital conversion device according to the eighth embodiment of the present invention.

As shown in FIG. 17, this embodiment includes a multiple-valued quantization circuit 1701 and a binarization circuit 1721 for binarizing an output from the circuit 1701. The binarization circuit 1721 is identical to those in the fifth to seventh embodiments. Although not shown, the multiple-valued quantization circuit 1701 operates in synchronism with a predetermined clock.

In the eighth embodiment, the multiple-valued quantization circuit 1701 has thresholds VT1 and VT2 satisfying VT1<VT2.

The multiple-valued quantization circuit 1701 has VT1 and VT2; it outputs a value VL for $V_{in} \leq$ VT1, a value VM for VT1<$V_{in} \leq$ VT2, and a value VU for VT2<$V_{in}$.

According to the analog-to-digital conversion device of the eighth embodiment, therefore, the input analog signal $V_{in}$ is converted into a 1-bit binary code B, as indicated by Table 39.

TABLE 39

| Voltage Value of Analog Signal $V_{in}$ | | Binary Code B Bit signal |
|---|---|---|
| 2 | VT1 < $V_{in}$ ≦ VT2 | 1 |
| 1 | $V_{in}$ ≦ VT1 | 0 |

Ninth Embodiment

In the fifth to eighth embodiments, the multiple-valued quantization circuits for outputting quantized ternary signals are used as multiple-valued quantization means. However, the present invention is not limited to this.

The ninth embodiment of the present invention will be described below.

As shown in FIG. 18, an analog-to-digital coversion device according to the ninth embodiment includes quaternary quantization circuits 1801 to 1805 and a binarization circuit 1821 for binarizing outputs from the circuits 1801 to 1805. Although not shown, the quaternary quantization circuits 1801 to 1805 operate in synchronism with the same clock signal.

Table 40 shows the relationship between thresholds and inputs/outputs in the quaternary quantization circuits 1801 to 1805. Note that i=1, 2, 3, 4, and 5, and i=1 represents the quaternary quantization circuit 1801; i=2, the quaternary quantization circuit 1802; i=3, the quaternary quanntization circuit 1803; i=4, the quaternary quanntization circuit 1804; and i=5, the quaternary quanntization circuit 1805. For example, VT3(1) represents the third threshold in the quaternary quanntization 1801.

TABLE 40

| | Voltage Value of Analog Signal $V_{in}$ | Output Value |
|---|---|---|
| 4 | $V_{in} \leq VT1(i)$ | 3 |
| 3 | $VT1(i) < V_{in} \leq VT2(i)$ | 2 |
| 2 | $VT2(i) < V_{in} \leq VT3(i)$ | 1 |
| 1 | $VT3(i) < V_{in}$ | 0 |

In this case, the relationship between the respective thresholds is: VT1(2)<VT1(3)<VT1(4)<VT 1(1)<VT1(5) <VT2(2)<VT2(3)<VT<(1)<VT2(4)<VT2(5)<VT3(2)<VT3 (1)<VT3(3)<VT3(4)<VT3(5).

As indicated by Table 42 below, a binarization circuit 1821 outputs a binary code to output terminals b1 to b4 upon reception of signals input from quaternary quantization circuits 1901 to 1905.

TABLE 41

| Output from Quaternary Quantization Circuit 1 | Output from Quaternary Quantization Circuit 2 | Output from Quaternary Quantization Circuit 3 | Output from Quaternary Quantization Circuit 4 | Output from Quaternary Quantization Circuit 5 | Output from Terminal b4 | Output from Terminal b3 | Output from Terminal b2 | Output from Terminal b1 |
|---|---|---|---|---|---|---|---|---|
| 3 | 3 | 3 | 3 | 3 | 0 | 0 | 0 | 0 |
| 3 | 2 | 3 | 3 | 3 | 0 | 0 | 0 | 1 |
| 3 | 2 | 2 | 3 | 3 | 0 | 0 | 1 | 1 |
| 3 | 2 | 2 | 2 | 3 | 0 | 0 | 1 | 0 |
| 2 | 2 | 2 | 2 | 3 | 0 | 1 | 1 | 0 |
| 2 | 2 | 2 | 2 | 2 | 0 | 1 | 1 | 1 |
| 2 | 1 | 2 | 2 | 2 | 0 | 1 | 0 | 1 |
| 2 | 1 | 1 | 2 | 2 | 0 | 1 | 0 | 0 |
| 1 | 1 | 1 | 2 | 2 | 1 | 1 | 0 | 0 |
| 1 | 1 | 1 | 1 | 2 | 1 | 1 | 0 | 1 |
| 1 | 1 | 1 | 1 | 1 | 1 | 1 | 1 | 1 |
| 1 | 0 | 1 | 1 | 1 | 1 | 1 | 1 | 0 |
| 0 | 0 | 1 | 1 | 1 | 1 | 0 | 1 | 0 |
| 0 | 0 | 0 | 1 | 1 | 1 | 0 | 1 | 1 |
| 0 | 0 | 0 | 0 | 1 | 1 | 0 | 0 | 1 |
| 0 | 0 | 0 | 0 | 0 | 1 | 0 | 0 | 0 |

In summary, according to the analog-to-digital conversion device of the ninth embodiment, analog-to-digital conversion can be performed in the manner indicated by Table 42.

TABLE 42

| | Voltage Value of Analog Signal $V_{in}$ | Binary Code B | | | |
|---|---|---|---|---|---|
| | | Bit Signal b4 | Bit signal b3 | Bit signal b2 | Bit signal b1 |
| 1 | $V_{in} \leq VT1(2)$ | 1 | 0 | 0 | 0 |
| 2 | $VT1(2) < V_{in} \leq VT1(4)$ | 1 | 0 | 0 | 1 |
| 3 | $VT1(3) < V_{in} \leq VT1(4)$ | 1 | 0 | 1 | 1 |
| 4 | $VT1(4) < V_{in} \leq VT1(1)$ | 1 | 0 | 1 | 0 |
| 5 | $VT1(1) < V_{in} \leq VT1(5)$ | 1 | 1 | 1 | 0 |
| 6 | $VT1(5) < V_{in} \leq VT1(2)$ | 1 | 1 | 1 | 1 |
| 7 | $VT2(2) < V_{in} \leq VT2(3)$ | 1 | 1 | 0 | 1 |
| 8 | $VT2(3) < V_{in} \leq VT2(1)$ | 1 | 1 | 0 | 0 |
| 9 | $VT2(1) < V_{in} \leq VT2(4)$ | 0 | 1 | 0 | 0 |
| 10 | $VT2(4) < V_{in} \leq VT2(5)$ | 0 | 1 | 0 | 1 |
| 11 | $VT2(5) < V_{in} \leq VT3(2)$ | 0 | 1 | 1 | 1 |
| 12 | $VT3(2) < V_{in} \leq VT3(1)$ | 0 | 1 | 1 | 0 |
| 13 | $VT3(1) < V_{in} \leq VT3(3)$ | 0 | 0 | 1 | 0 |

TABLE 42-continued

| | Voltage Value of Analog Signal $V_{in}$ | Binary Code B | | | |
|---|---|---|---|---|---|
| | | Bit Signal b4 | Bit signal b3 | Bit signal b2 | Bit signal b1 |
| 14 | $VT3(3) < V_{in} \leq VT3(4)$ | 0 | 0 | 1 | 1 |
| 15 | $VT3(4) < V_{in} \leq VT3(5)$ | 0 | 0 | 0 | 1 |
| 16 | $VT3(5) < V_{in}$ | 0 | 0 | 0 | 0 |

10th Embodiment

The 10th embodiment of the present invention will be described below.

Figure 19:
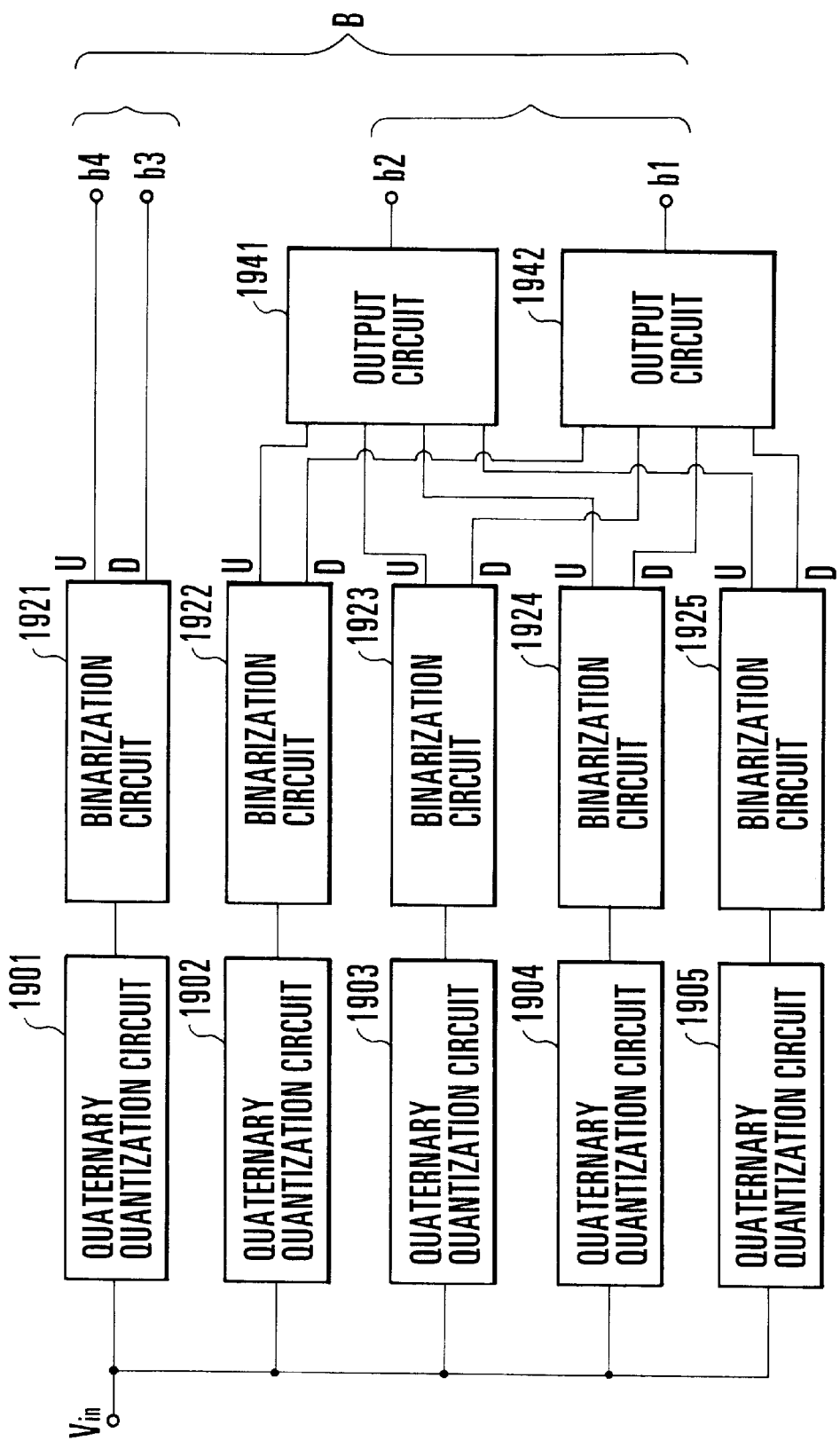
FIG. 19 is a block diagram showing the arrangement of an analog-to-digital conversion device according to the 10th embodiment of the present invention.

As shown in FIG. 19, an analog-to-digital conversion device according to the 10th embodiment includes quaternary quantization circuits 1901 to 1905 and binarization circuits 1921 to 1925 for binarizing outputs from the circuits 1901 to 1905. Each of the binarization circuits 1921 to 1925 has outputs U and D. Although not shown, the quaternary quantization circuits 1901 to 1905 operate in synchronism with the same clock signal.

First of all, the output U of the binarization circuit 1921 is set as an output from an output terminal b4 (most significant bit), and the output D from the binarization circuit 1921 is set as an output from an output terminal b3. One of the outputs U from the binarization circuits 1922 to 1925 is set as an output from an output terminal b2 by an output circuit 1941. One of the outputs D from the binarization circuits 1922 to 1925 is set as an output from an output terminal bl (least significant bit) by an output circuit 1942.

Table 43 shows the relationship between thresholds and inputs/outputs in the quaternary quantization circuits 1901 to 1905. Note that i=1, 2, 3, 4, and 5, and i=1 represents the quaternary quantization circuit 1901; i=2, the quaternary quantization circuit 1902; i=3, the quaternary quantization circuit 1903; i=4, the quaternary quantization circuit 1904; and i=5, the quaternary quantization circuit 1905. For example, VT3(1) represents the third threshold in the quaternary quantization 1901.

TABLE 43

| Voltage Value of Analog Signal $V_{in}$ | Output Value |
|---|---|
| 4 $V_{in} \leq VT1(i)$ | 3 |
| 3 $VT1(i) < V_{in} \leq VT2(i)$ | 2 |
| 2 $VT2(i) < V_{in} \leq VT3(i)$ | 1 |
| 1 $VT3(i) < V_{in}$ | 0 |

In this case, the relationship between the respective thresholds is: $VT1(2)<VT2(2)<VT3(2)<VT1(1)<VT1(3)<VT2(3)<VT3(3)<VT2(1)<VT1(4)<VT2(4)<VT3(4)<VT3(1)<VT1(5)<VT2(5)<VT3(5)$.

The binarization circuits 1921 to 1925 output a binary code to the output terminals b1 to b4 upon reception of inputs from the quaternary quantization circuits 1901 to 1905.

TABLE 44

| Input Value | Output U | Output D |
|---|---|---|
| 3 | 0 | 0 |
| 2 | 0 | 1 |
| 1 | 1 | 1 |
| 0 | 1 | 0 |

The output circuit 1941 outputs a binary code to the output terminal b2 upon reception of the outputs U from the binarization circuits 1922 to 1925, as indicated by Table 45 below.

TABLE 45

| Output from Binarization Circuit 2 | Output from Binarization Circuit 3 | Output from Binarization Circuit 4 | Output from Binarization Circuit 5 | Output From Output Circuit |
|---|---|---|---|---|
| 0 | 0 | 0 | 0 | 0 |
| 1 | 0 | 0 | 0 | 1 |
| 1 | 1 | 0 | 0 | 0 |
| 1 | 1 | 1 | 0 | 1 |
| 1 | 1 | 1 | 1 | 0 |

The output circuit 1942 outputs a binary code to the output terminal b1 upon reception of the outputs D from the binarization circuits 1922 to 1925, as indicated by Table 46 below.

TABLE 46

| Output from Binarization Circuit 2 | Output from Binarization Circuit 3 | Output from Binarization Circuit 4 | Output from Binarization Circuit 5 | Output From Output Circuit |
|---|---|---|---|---|
| 0 | 0 | 0 | 0 | 0 |
| 1 | 0 | 0 | 0 | 1 |
| 0 | 1 | 0 | 0 | 1 |
| 0 | 0 | 1 | 0 | 1 |
| 0 | 0 | 0 | 1 | 1 |

Im summary, according to the analog-to-digital conversion device of the 10th embodiment, analog-to-digital conversion can be performed in the manner indicated by Table 47.

TABLE 47

| | Voltage Value of Analog Signal $V_{in}$ | Binary Code B | | | |
|---|---|---|---|---|---|
| | | Bit Signal b4 | Bit signal b3 | Bit signal b2 | Bit signal b1 |
| 1 | $V_{in} \leq VT1(2)$ | 0 | 0 | 0 | 0 |
| 2 | $VT1(2) < V_{in} \leq VT2(2)$ | 0 | 0 | 0 | 1 |
| 3 | $VT2(2) < V_{in} \leq VT3(2)$ | 0 | 0 | 1 | 1 |
| 4 | $VT3(2) < V_{in} \leq VT1(1)$ | 0 | 0 | 1 | 0 |
| 5 | $VT1(1) < V_{in} \leq VT1(3)$ | 0 | 1 | 1 | 0 |
| 6 | $VT1(3) < V_{in} \leq VT2(3)$ | 0 | 1 | 1 | 1 |
| 7 | $VT2(3) < V_{in} \leq VT3(3)$ | 0 | 1 | 0 | 1 |
| 8 | $VT3(3) < V_{in} \leq VT2(1)$ | 0 | 1 | 0 | 0 |
| 9 | $VT2(1) < V_{in} \leq VT1(4)$ | 1 | 1 | 0 | 0 |
| 10 | $VT1(4) < V_{in} \leq VT2(4)$ | 1 | 1 | 0 | 1 |
| 11 | $VT2(4) < V_{in} \leq VT3(4)$ | 1 | 1 | 1 | 1 |
| 12 | $VT3(4) < V_{in} \leq VT3(1)$ | 1 | 1 | 1 | 0 |
| 13 | $VT3(1) < V_{in} \leq VT1(5)$ | 1 | 0 | 1 | 0 |
| 14 | $VT1(5) < V_{in} \leq VT2(5)$ | 1 | 0 | 1 | 1 |
| 15 | $VT2(5) < V_{in} \leq VT3(5)$ | 1 | 0 | 0 | 1 |
| 16 | $VT3(5) < V_{in}$ | 1 | 0 | 0 | 0 |

As has been described above, the analog-to-digital conversion device (first to 10th embodiments) according to the present invention comprises quantization means for sampling an input analog signal at a predetermined period to obtain a sample, quantizing the sample into a (n+1)-valued signal with n (n is an integer not less than two) thresholds, and outputting the quantized value, and binarization means for converting the (n+1)-valued quantized value output from the quantization means into a binary code.

With this arrangement, an input analog signal is temporarily quantized into a (n+1)-valued signal, which is then converted into a binary code. As a result, the input analog signal is converted into a digital signal.

The arrangement built by the quantization means and the binarization means requires fewer elements than an arrangement designed to perform analog-to-digital conversion at once, provided that an analog signal is to be converted into a digital signal having the same number of bits. When, therefore, the analog-to-digital conversion device of the present invention and other devices are integrated into a monolithic unit, the area occupied by the analog-to-digital conversion device can be reduced as compared with the prior art. In addition, a more compact analog-to-digital conversion device can be formed. Furthermore, since the number of elements is decreased, the analog-to-digital conversion device of the present invention can reduce the power consumption and operate at high speed as compared with the conventional device.

According to another embodiment (first embodiment) of the present invention, there is provided an analog-to-digital conversion device comprising coarse quantization means for sampling an input analog signal at a predetermined period to obtain a sample, quantizing the sample with n coarse thresholds, and outputting the coarsely quantized value, n+1 fine quantization means each for sampling the analog signal at a predetermined period to obtain a sample, quantizing the sample with n fine thresholds between two adjacent coarse thresholds of the coarse thresholds in the coarse quantization means, and outputting the finely quantized value, signal selection means for selecting the finely quantized value output from the fine quantization means which has a threshold between the two thresholds used to quantize the coarsely quantized value output from the coarse quantization means, first binarization means for converting the coarsely quantized value output from the coarse quantization means into a binary code, and second binarization means for converting the finely quantized value selected by the signal selection means into a binary code.

With this arrangement, an input analog signal is converted into a digital signal consisting of a binary code output from the first binarization means as upper bits and a binary code output from the second binarization means as lower bits.

This arrangement can greatly reduce the number of elements required as compared with an arrangement designed to perform analog-to-digital conversion at once, provided that an analog signal is to be converted into a digital signal having the same number of bits. When, therefore, this analog-to-digital conversion device and other devices are integrated into a monolithic unit, the area occupied by the analog-to-digital conversion device can be reduced as compared with the prior art. Also, a more compact analog-to-digital conversion device can be formed. Furthermore, since the number of elements is decreased, the analog-to-digital conversion device of the present invention can reduce the power consumption and operate at high speed as compared with the conventional device.

According to still another embodiment (third embodiment) of the present invention, in addition to the above arrangement, this device includes $(n+1)^2$ full-resolution quantization means each for sampling the analog signal at a predetermined period to obtain a sample, quantizing the sample with n full-resolution thresholds between two adjacent thresholds of the thresholds in the fine quantization means, and outputting the full-resolution quantized value, full-resolution signal selection means for selecting the full-resolution quantized value output from the full-resolution quantization means which has a threshold between the two thresholds used to quantize the finely quantized value output from the fine quantization means, and third binarization means for converting the full-resolution quantized value selected by the full-resolution signal selection means into a binary code.

With this arrangement, analog-to-digital conversion with higher precision can be performed by using the binary code output from the second binarization means.

According to still another embodiment of the present invention (fourth embodiment) of the present invention, there is provided an analog-to-digital conversion device comprising coarse quantization means for sampling an input analog signal at a predetermined period to obtain a sample, quantizing the sample with n coarse thresholds, and outputting the coarsely quantized value, n+1 fine quantization means each for sampling the analog signal at a predetermined period to obtain a sample, quantizing the sample with n fine thresholds between two adjacent coarse thresholds of the coarse thresholds in the coarse quantization means, and outputting the finely quantized value, coarse binarization means for converting the coarsely quantized value output from the coarse quantization means into a binary code, n fine binarization means for converting the finely quantized values output from the fine quantization means into binary codes, first bit selection means for selecting one of bit values obtained by the fine binarization means by converting the finely quantized value output from the fine quantization means which has a threshold between the two thresholds used to quantize the coarsely quantized value output from the coarse quantization means, and second bit selection means for selecting the other of the bit values obtained by the fine binarization means by converting the finely quantized value output from the fine quantization means which has a threshold between the two thresholds used to quantize the coarsely quantized value output from the coarse quantization means.

With this arrangement, an input analog signal is converted into a digital signal consisting of a binary code output from the coarse binarization means as upper bits and a binary code output from the first and second bit conversion means as lower bits.

This arrangement can greatly reduce the number of elements required as compared with an arrangement designed to perform analog-to-digital conversion at once, provided that an analog signal is to be converted into a digital signal having the same number of bits. When, therefore, this analog-to-digital conversion device and other devices are integrated into a monolithic unit, the area occupied by the analog-to-digital conversion device can be reduced as compared with the prior art. Moreover, a more compact analog-to-digital conversion device can be formed. Furthermore, since the number of elements is decreased, the analog-to-digital conversion device of the present invention can reduce the power consumption and operate at high speed as compared with the conventional device.

According to still another embodiment (fifth to eighth embodiments) of the present invention, there is provided an analog-to-digital conversion device comprising quantization means for sampling an input analog signal at a predetermined period to obtain a sample, quantizing the sample into a (n+1)-valued signal with n (n is a natural number not less than two) thresholds, and outputting the quantized value, and binarization means for converting the (n+1)-valued quantized value output from the quantization means into a binary code, the device further comprising least significant bit quantization means, having $2^n$ (n is a natural number not less than two) conversion means each including the quantization means and the binarization means, for generating a least significant bit, n intermediate bit quantization means having the conversion means half the number of conversion means of bit quantization means for generating a bit one bit lower than itself, and most significant bit quantization means, having one conversion means, for generating a most significant bit, wherein the least significant bit quantization means and the intermediate bit quantization means respectively include output means each for calculating an OR of outputs from the conversion means, each of ternary conversion means of the least significant bit quantization means, the intermediate bit quantization means, and the most significant bit quantization means has two thresholds having a difference larger than that in ternary quantization means for a bit one bit lower than itself, and each of the conversion means of the least significant bit quantization means, the intermediate bit quantization means, and the most significant bit quantization means has two different thresholds.

With this arrangement, an input analog signal is converted into a digital signal consisting of bits output from the respective bit quantization means.

This arrangement can greatly reduce the number of elements required as compared with an arrangement designed to perform analog-to-digital conversion at once, provided that an analog signal is to be converted into a digital signal having the same number of bits. When, therefore, this analog-to-digital conversion device and other devices are integrated into a monolithic unit, the area occupied by the analog-to-digital conversion device can be reduced as compared with the prior art. Similarly, a more compact analog-to-digital conversion device can be formed. Furthermore, since the number of elements is decreased, the analog-to-digital conversion device of the present invention can reduce the power consumption and operate at high speed as compared with the conventional device.

According to still another embodiment (10th embodiment) of the present invention, there is provided an analog-to-digital conversion device comprising quantization means for sampling an input analog signal at a predetermined period to obtain a sample, quantizing the sample into a (n+1)-valued signal with n (n is a natural number not less than two) thresholds, and outputting the quantized value, and binarization means for converting the (n+1)-valued quantized value output from the quantization means into a binary code, the device further comprising first conversion means, constituted by the quantization means in which n is 3 and the binarization means, for outputting a most significant bit and a first intermediate bit one bit lower than the most significant bit, second to fifth conversion means, constituted by the quantization means in which n is 3 and the binarization means, for outputting first and second binary codes, first output means for outputting a second intermediate bit one bit lower than the first intermediate bit using a combination of first binary codes output from the second to fifth conversion means, and second output means for outputting a least significant bit using a combination of second binary codes output from the second to fifth conversion means. The binarization means outputs a binary value, as a first binary code, which is binarized between a largest value or a second largest value of four values output from the quantization means and other values thereof, and outputs a binary value, as a second binary code, which is binarized between a largest value or a smallest value of four values output from the quantization means and other values thereof. Three thresholds in a quantization circuit of the second conversion means are smaller than a minimum threshold in a quantization circuit of the first conversion means. Three thresholds in a quantization circuit of the third conversion means are larger than the minimum threshold in the quantization circuit of the first conversion means and smaller than an intermediate threshold in the quantization circuit of the first conversion means. Three thresholds in a quantization circuit of the fourth conversion means are larger than the intermediate threshold in the quantization circuit of the first conversion means and smaller than a maximum threshold in the quantization circuit of the first conversion means. Three thresholds in a quantization circuit of the fifth conversion means are larger than the maximum threshold in the quantization circuit of the first conversion means.

With this arrangement, an input analog signal is converted into a digital signal consisting of the bits of a binary code output from the binarization means.

This arrangement can greatly reduce the number of elements required as compared with an arrangement designed to perform analog-to-digital conversion at once, provided that an analog signal is to be converted into a digital signal having the same number of bits. When, therefore, this analog-to-digital conversion device and other devices are integrated into a monolithic unit, the area occupied by the analog-to-digital conversion device can be reduced as compared with the prior art. Similarly, a more compact analog-to-digital conversion device can be formed. Furthermore, since the number of elements is decreased, the analog-to-digital conversion device of the present invention can reduce the power consumption and operate at high speed as compared with the conventional device.

What is claimed is:

1. An analog-to-digital conversion device comprising:
   quantization means for sampling an input analog signal at a predetermined period to obtain a sample, quantizing the sample into a (n+1)-valued signal with n (n is an integer not less than two) thresholds, and outputting the quantized value;
   binarization means for converting the (n+1)-valued quantized value output from said quantization means into a binary code;
   least significant bit quantization means, having $2^m/n$ (m is an integer not less than two) conversion means each including said quantization means and said binarization means, for generating a least significant bit;
   (m−2) intermediate bit quantization means having said conversion means half the number of conversion means of bit quantization means for generating a bit one bit lower than itself; and
   most significant bit quantization means, having one said conversion means, for generating a most significant bit,
   wherein said least significant bit quantization means and said intermediate bit quantization means respectively include output means each for calculating an OR of outputs from said conversion means,
   each of said conversion means of said least significant bit quantization means, said intermediate bit quantization means, and said most significant bit quantization means has n thresholds having a difference larger than that in said quantization means for a bit one bit lower than itself, and
   each of said conversion means of said least significant bit quantization means, said intermediate bit quantization means, and said most significant bit quantization means has n different thresholds.

2. A device according to claim 1, wherein the value n in said quantization means is 2, and
   said binarization means performs binarization between an intermediate value, and minimum-maximum values of three quantized values output from said quantization means.

3. A device according to claim 1, wherein said quantization means comprises a resonant-tunneling diode.

4. A device according to claim 1, wherein said binarization means comprises a resonant-tunneling diode.

5. An analog-to-digital conversion device comprising:
   coarse quantization means for sampling an input analog signal at a predetermined period to obtain a sample, quantizing the sample into a (n+1)-valued signal with n coarse thresholds, and outputting the coarsely quantized value;
   n+1 fine quantization means each for sampling the analog signal at a predetermined period to obtain a sample, quantizing the sample into a (n+1)-valued signal with n fine thresholds between two adjacent coarse thresholds of the coarse thresholds in said coarse quantization means, and outputting the finely quantized value;
   signal selection means for selecting the finely quantized value output from said fine quantization means which has a threshold between the two thresholds used to quantize the (n+1)-valued coarsely quantized value output from said coarse quantization means;
   first binarization means for converting the (n+1)-valued coarsely quantized value output from said coarse quantization means into a binary code; and
   second binarization means for converting the finely quantized value selected by said signal selection means into a binary code.

6. A device according to claim 5, wherein the value n is 3,
   said first binarization means outputs upper two bits, and said second binarization means outputs lower two bits, and
   the analog signal is converted into a 4-bit digital signal.

7. A device according to claim 5, wherein the value n is 7,
said first binarization means outputs upper three bits, and said second binarization means outputs lower three bits, and
the analog signal is converted into a 6-bit digital signal.

8. A device according to claim 5, further comprising:
$(n+1)^2$ full-resolution quantization means each for sampling the analog signal at a predetermined period to obtain a sample, quantizing the sample with n full-resolution thresholds between two adjacent thresholds of the thresholds in said fine quantization means, and outputting the full-resolution quantized value;
full-resolution signal selection means for selecting the full-resolution quantized value output from said full-resolution quantization means which has a threshold between the two thresholds used to quantize the finely quantized value output from said fine quantization means; and
third binarization means for converting the full-resolution quantized value selected by said full-resolution signal selection means into a binary code.

9. A device according to claim 5, wherein said quantization means comprises a resonant-tunneling diode.

10. A device according to claim 5, wherein said binarization means comprises a resonant-tunneling diode.

11. An analog-to-digital conversion device comprising:
coarse quantization means for sampling an input analogisignal at a predetermined period to obtain a sample, quantizing the sample with n coarse thresholds, and outputting the coarsely quantized value;
n+1 fine quantization means each for sampling the analog signal at a predetermined period to obtain a sample, quantizing the sample with n (n is an integer not less than two) fine thresholds between two adjacent coarse thresholds of the coarse thresholds in said coarse quantization means, and outputting the finely quantized value;
coarse binarization means for converting the coarsely quantized value output from said coarse quantization means into a binary code;
n fine binarization means for converting the finely quantized values output from said fine quantization means into binary codes;
first bit selection means for selecting one of bit values obtained by said fine binarization means by converting the finely quantized value output from said fine quantization means which has a threshold between the two thresholds used to quantize the coarsely quantized value output from said coarse quantization means; and
second bit selection means for selecting the other of the bit values obtained by said fine binarization means by converting the finely quantized value output from said fine quantization means which has a threshold between the two thresholds used to quantize the coarsely quantized value output from said coarse quantization means.

12. A device according to claim 11, wherein the value n is 3,
said coarse binarization means outputs upper two bits,
said first and second bit selection means output low two bits, and
the analog signal is converted into a 4-bit digital signal.

13. A device according to claim 11, wherein said quantization means comprises a resonant-tunneling diode.

14. A device according to claim 11, wherein said binarization means comprises a resonant-tunneling diode.

15. An analog-to-digital conversion device comprising:
quantization means for sampling an input analog signal at a predetermined period to obtain a sample, quantizing the sample into a (n+1)-valued signal with n (n is an integer not less than two) thresholds, and outputting the quantized value;
binarization means for converting the (n+1)-valued quantized value output from said quantization means into a binary code;
first conversion means, constituted by said quantization means in which n is set to 3 and said binarization means, for outputting a most significant bit and a first intermediate bit one bit lower than the least significant bit;
second to fifth conversion means, constituted by said quantization means in which n is set to 3 and said binarization means, for outputting first and second binary codes;
first output means for outputting a second intermediate bit one bit lower than the first intermediate bit using a combination of first binary codes output from said second to fifth conversion means; and
second output means for outputting a least significant bit using a combination of second binary codes output from said second to fifth conversion means,
wherein said binarization means outputs a binary value, as a first binary code, which is binarized between a largest value or a second largest value of four values output from said quantization means and other values thereof, and outputs a binary value as a second binary code, which is binarized between a largest value or a smallest value of four values output from said quantization means and in other values thereof,
three thresholds in a quantization circuit of said second conversion means are smaller than a minimum threshold in a quantization circuit of said first conversion means,
three thresholds in a quantization circuit of said third conversion means are larger than the minimum threshold in a quantization circuit of said first conversion means and smaller than an intermediate threshold in the quantization circuit of said first conversion means,
three thresholds in a quantization circuit of said fourth conversion means are larger than the intermediate threshold in the quantization circuit of said first conversion means and smaller than a maximum threshold in the quantization circuit of said first conversion means, and
three thresholds in a quantization circuit of said fifth conversion means are larger than the maximum threshold in the quantization circuit of said first conversion means.

* * * * *